(12) United States Patent
Yamada et al.

(10) Patent No.: US 6,838,743 B2
(45) Date of Patent: Jan. 4, 2005

(54) OPTOELECTRONIC MATERIAL, DEVICE USING THE SAME AND METHOD FOR MANUFACTURING OPTOELECTRONIC MATERIAL

(75) Inventors: Yuka Yamada, Kanagawa (JP); Takehito Yoshida, Tokyo (JP); Shigeru Takeyama, Kanagawa (JP); Yuji Matsuda, Osaka (JP); Katsuhiko Mutoh, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/372,257

(22) Filed: Feb. 25, 2003

(65) Prior Publication Data

US 2003/0151107 A1 Aug. 14, 2003

Related U.S. Application Data

(63) Continuation of application No. 09/725,486, filed on Nov. 30, 2000, now Pat. No. 6,730,934, which is a continuation of application No. 09/011,471, filed as application No. PCT/JP97/01750 on May 26, 1997, now Pat. No. 6,239,453.

(30) Foreign Application Priority Data

Jun. 19, 1996 (JP) .............................................. 8-157840
Nov. 27, 1996 (JP) .............................................. 8-315934
Nov. 27, 1996 (JP) .............................................. 8-315957

(51) Int. Cl.[7] ...................... H01L 31/06; H01L 31/0352
(52) U.S. Cl. ...................... 257/461; 257/431; 257/449; 257/465; 257/466; 136/250; 136/256; 136/258; 438/63
(58) Field of Search .............................. 257/21–22, 53, 257/431, 443, 449, 461, 465, 466; 136/250, 256, 258; 438/63

(56) References Cited

U.S. PATENT DOCUMENTS 4,625,071 A    11/1986  Delahoy et al.

(List continued on next page.)

FOREIGN PATENT DOCUMENTS

EP    0617472    9/1994

(List continued on next page.)

OTHER PUBLICATIONS

Yuka Yamada et al., Jpn. J. Appl. Phys., vol. 35 (1996), pp. 1361–1365, Part I, No. 2B, Feb. 1996, "Optical Properties Silicon Nanocrystallites Prepared by Excimer Laser Ablation in Inert Gas".
Canham, Applied physics Letters, vol. 57, No. 10, pp. 1046–1048 (1990).

(List continued on next page.)

*Primary Examiner*—Donghee Kang
(74) *Attorney, Agent, or Firm*—Greenblum & Bernstein, P.L.C.

(57) ABSTRACT

This invention relates an optoelectronic material comprising a uniform medium with a controllable electric characteristic; and semiconductor ultrafine particles dispersed in the medium and having a mean particle size of 100 nm or less, and an application device using the same. This invention also relates to a method of manufacturing an optoelectronic material by irradiating a laser beam onto a first target of a semiconductor material, placed in a reaction chamber in low pressure rare gas ambient, and a second target of a medium material with a controllable electric characteristic, placed in the reaction chamber, condensing/growing a semiconductor material ablated from the first target to be collected as ultrafine particles having a mean particle size of 100 nm or smaller on a substrate placed in the reaction chamber, and condensing/growing a medium material ablated from the second target to be collected on the substrate placed in the reaction chamber, thus forming an ultrafine-particles dispersed layer having semiconductor ultrafine particles dispersed in the medium on the substrate.

5 Claims, 19 Drawing Sheets

U.S. PATENT DOCUMENTS

| | | | |
|---|---|---|---|
| 5,017,308 | A | 5/1991 | Iijima et al. |
| 5,079,186 | A | 1/1992 | Narusawa |
| 5,260,957 | A | 11/1993 | Hakimi et al. |
| 5,279,868 | A | 1/1994 | Ohtsuka et al. |
| 5,371,379 | A | 12/1994 | Narusawa |
| 5,411,826 | A | 5/1995 | Yashiki |
| 5,425,922 | A | 6/1995 | Kawaguchi |
| 5,958,574 | A | 9/1999 | Sptiled et al. |
| 6,157,047 | A | 12/2000 | Fujita et al. |
| 6,239,453 | B1 | 5/2001 | Yamada et al. |

FOREIGN PATENT DOCUMENTS

| | | |
|---|---|---|
| EP | 0622439 | 11/1994 |
| JP | 61283175 | 12/1986 |
| JP | 62-66260 | 3/1987 |
| JP | 1-253193 | 10/1989 |
| JP | 2-216877 | 8/1990 |
| JP | 4-112584 | 4/1992 |
| JP | 5-24826 | 2/1993 |
| JP | 5-129648 | 5/1993 |
| JP | 5-206514 | 8/1993 |
| JP | 5-206515 | 9/1993 |
| JP | 7-50432 | 2/1995 |
| JP | 7-52670 | 2/1995 |
| JP | 7-58358 | 3/1995 |
| JP | 7-58361 | 3/1995 |
| JP | 7-86164 | 3/1995 |
| JP | 7-237995 | 9/1995 |
| JP | 8-181341 | 7/1996 |
| JP | 8-288540 | 11/1996 |
| JP | 8-306485 | 11/1996 |
| JP | 8-307011 | 11/1996 |
| JP | 9-212105 | 8/1997 |
| WO | 96/16114 | 5/1996 |

OTHER PUBLICATIONS

Pavesi et al., Applied Phisics Letters, vol. 67(22), pp. 3280–3282 (1995).
Copy of an English Lauguage Abstract of JP–A–8–306485.
Copy of an English Language Abstract of JP–A–4–112584.
Copy of an English Language Abstract of JP–A–8–307011.
Copy of an English Language Abstract of JP–A–2–216877.
Copy of an English Language Abstract of JP–A–7–237995.
Copy of an English Language Abstract of JP–A–62–066260.
Copy of an English Language Abstract of JP–A–61–A–283175.
Copy of an English Language Abstract of JP–A–5–024826.
Yoshida et al., Optical Engineering Contact, vol. 34, No. 10 (Oct. 1996), pp. 534–545 Production of Silicon Ultrafine Particles by Rare–Gas Atmosphere Pulse Laser Deposition.
English Language Abstract of JP 7–58358.
English Language Abstract of JP 7–58361.
Colvin et al., "Light–Emitting Diodes Made from Cadmium Selenide Nanocrystals and Asemiconducting Polymer", NATURE, vol. 370, No. 6488, London, Aug. 4, 1994.
Dabbousi et al., entitled "Electroluminescence from CdSe quantum–dot/polymer composites", Applied Physics Letters, vol. 66, No. 11, New York, Mar. 13, 1995.
English Language Abstract of JP 9–212105.
English Language Abstract of JP 1–253193.
English Language Abstract of JP 8–181341.
English Language Abstract of JP 5–206515.
B.O. Dabbousi et al., "Electrolumiscence from CdSe quantum–dot/polymer composites", Appl. Phys. Lett. 66 (11), Mar. 13, 1995, pp. 1316–1318.
Tetsuy Makimura et al., "Fabrication of Visible Light Emitting Ultrafine Silicon Powder by Laser Abrasion", Surface , vol. 34, No. 8., pp. 27–33 (1996)—English translation of portions thereof.
Kenchi IGA et al., "Light Emitting Surface Laser", Ohm–Sha, pp. 105–119 (1990)—English translation of portion thereof.
Yakehito Yoshida et al., "8p–V–17: Silicon Ultrafine Particles Prepared by Laser Abrasion in Inert Gas Ambient (IV), Electrical Properties", Extended Abstracts of the 57th Meeting of The Japan Society of Applied Physics No. 2, pp. 650 (1996).
Tetsuy Makimura et al., "Fabrication of Visible Light Emitting Ultrafine Silicon Powder by Laser Abrasion", Surface, vol. 34, No. 8., pp. 27–33 (1996).
English Language Abstract of JP 7–50432.
English Language Abstract of JP 5–129648.
English Language Abstract of JP 8–288540.
English Language Abstract of JP 7–86164.
Tetsuy Makimura et al., "Fabrication Of Visible Light Emitting Ultrafine Silicon Powder by Laser Abrasion", Surface, vol. 24, No. 8., pp. 27–33 (1996).
Kenchi IGA et al., "Light Emitting Surface Laser", Ohm–Sha, pp. 105–119 (1990).
Yakehito Yoshida et al., "8p–V–17: Silicon Ultrafine Particles Prepared by Laser Abrasion in Inert Gas Ambient (IV), Electrical Properties", Extended Abstracts of the $57^{th}$ Meeting of The Japan Society of Applied Physics No. 2, pp. 680 (1996).

OPTOELECTRONIC MATERIAL, DEVICE USING THE SAME AND METHOD FOR MANUFACTURING OPTOELECTRONIC MATERIAL

CROSS-REFERENCE TO RELATED APPLICATIONS

This application is a continuation of application Ser. No. 09/725,486, filed Nov. 30, 2000 now U.S. Pat. No. 6,730,934, which is a continuation of application Ser. No. 09/011,471, filed Feb. 18, 1998 now U.S. Pat. No. 6,239,453, which is a National Stage Application of International Application No. PCT/JP97/01750, filed May 26, 1997, which was not published in English under PCT Article 21(2), and which claims priority of Japanese Application Nos. 8-157840, filed Jun. 19, 1996, 8-315934, filed Nov. 27, 1996, and 8-315957, filed Nov. 27, 1996. The entire disclosures of application Ser. Nos. 09/725,486 and 09/011,471 are considered as being part of the disclosure of this application, and the entire disclosure of application Ser. Nos. 09/725,486 and 09/011,471 are expressly incorporated by reference herein in their entireties.

BACKGROUND OF THE INVENTION

1. Field of the Invention

The present invention relates to an optoelectronic material, its application device and a method of manufacturing the optoelectronic material. More particularly, this invention relates to an optoelectronic material that comprises, as the core, semiconductor ultrafine particles with controlled particle sizes, formed of a material whose quantity is unlimited and which is free of environmental contamination, and that is excellent in silicon (Si)-LSI technology matching, spontaneous light emission, fast response, pixel miniaturization, low dissipation power, high environmental resistance and assemblyless process, an application device of the optoelectronic material, and a method of manufacturing the optoelectronic material.

2. Description of the Related Art

Conventional light-emitting devices include a light-emitting diode and devices utilizing electroluminescence which have been put to a practical use. Optoelectronic materials used for those light-emitting devices are compound semiconductors essentially containing a group III element and a group V element (hereinafter referred to as "group III–V") in a periodic table or compound semiconductors essentially containing a group II element and a group VI element in the periodic table, not silicon (Si). This is because silicon is an indirect transition semiconductor and the band gap, 1.1 eV, lies in a near infrared region, which has been considered as impossible to realize a light-emitting device in a visible light region.

Since the observation of visible light emission of porous Si at room temperature in 1990 (disclosed in, for example, L. T. Canham, Applied Physics letters Vol. 57, No. 10, 1046 (1990)). Enthusiastic studies have been done on the characteristics of visible light emission at room temperature with Si as a base material. Most of those reports are concerned with porous Si.

This luminous porous Si is basically formed by anodization of the surface of a single crystalline Si substrate in a solution essentially containing hydrogen fluoride, and photoluminescences (PL) of several wavelengths in a range from 800 nm (red) to 425 nm (blue) have been observed up to now. Recently, attempts have been made to luminescence by current injection excitation (electroluminescence; EL) (e.g., Published Unexamined Application No. 5-206514).

EL of those porous Si have the following characteristic properties. (1) The spectra of EL and PL show substantially the same shapes with some difference in intensity though. (2) The EL intensity is proportional to the injection current in a supposedly practically usable range of the injection current density. It is to be noted however that in a range where the injection current density is lower than the former range, it has been reported that the EL intensity is proportional to the square of the injection current.

The property (1) indicates that the EL and PL are caused by the recombination of carriers (excited electron-hole pairs) through approximately same luminescence levels, and the property (2) indicates that the generation of carriers essential to EL is mostly accomplished by the injection of minor carriers in the vicinity of the p-n junction.

With regard to the emission mechanism of Si which is an indirect transition semiconductor, there are a view that the wave number selection rule for optical transition is relaxed in a three-dimensional minute structural area of the nanometer (nm) order in the porous shape, thus ensuring the radiative recombination of electron-hole pairs, and a view that a many-remembered ring oxide (polysiloxene) is formed on the surface of porous Si and new energy level which contributes to the radiative recombination is formed at the polysiloxene/Si interface. In any case, it seems certain that with regard to photo excitation, a change in energy band structure (a phenomenon of increasing the gap energy) is caused by quantum confinement effect.

Further, luminescence from porous Si has a broad spectrum width of approximately 0.3 eV or wider. In this respect, some attempts have been made to form a cavity structure using this porous Si in order to enhance the intensity of a specific wavelength region in the continuous spectrum that is originally generated (e.g., L. Pavesi et al., Applied Physics Letters Vol. 67, 3280 (1995)).

Because the conventional optoelectronic materials use compound semiconductors mainly consisting a group III–V element or a group II–VI element of a direct transition type, however, they contain an element (In or the like) whose quantity is significantly small and whose refining cost is high while the emission efficiency is high. Further, a fine patterning for those compound semiconductors as a semiconductor fabrication technique is not ripe yet as compared with a fine patterning for Si, making it difficult to form a fine pattern of the micron ($\mu$m) order or smaller. Furthermore, group III and V elements serve as a dopant in Si, and thus affect the electrical conductivity. That is, while a spontaneous light-emitting device essentially consists of a semiconductor material, the matching with the process and device technologies for Si-LSI as a typical electronic device is poor and it is substantially impossible to fabricate a device with integrated Si and LSI. Moreover, there is an essential problem that the type of the material should be changed (i.e., it should newly be found) and the fabrication method should be reconstructed entirely in order to adjust the emission wavelength.

With regard to luminous porous Si, a porous layer is formed on the surface of a single crystalline Si substrate by anodization in a solution so that while a crystalline in the porous layer has an excellent crystallinity, it is difficult to control the shape and size of crystalline. It is particularly difficult to efficiently produce a spherical crystalline of 5 nm or less in particle size. If the mechanism of visible light emission of an Si-based group IV material is a quantum size effect (relaxation of the wave number selection rule, a change in band structure due to a quantum confinement effect, or the like), it is still essential to produce a spherical crystalline having a particle size of the nm order. In view of this, the fabrication technique cannot be said to be the optimum one.

A difficulty also arises when one intends to demonstrate the performance of a display device by regularly arranging porous Si based light-emitting elements and independently operating them. Specifically, since the porous Si is directly formed in an Si substrate, it is not possible to maintain the electric independence (insulation) between the elements. Further, it is not possible to form a lamination structure with another material like a transparent material having a high transmittance in the visible region.

Although a scheme of arranging particles of a group IV element or partly oxidized particles thereof between electrodes for light emission is disclosed (e.g., Published Examined Application No. 7-52670), it has a difficulty in controlling the electric characteristic and cannot be adapted to various kinds of light-emitting devices and photodetectors. Therefore, the state-of-the-art technology does not provide an optoelectronic material which can be adapted to various kinds of light-emitting devices and photodetectors by controlling the electric characteristics.

SUMMARY OF THE INVENTION

It is therefore an object of the present invention to provide an optoelectronic material that comprises a material whose quantity is inexhaustive and which is free of environmental contamination, and which has characteristics such as the Si-LSI technology matching, spontaneous light emission, fast response, pixel miniaturization, low dissipation power, high environmental resistance and assemblyless process, an application device of the optoelectronic material, and a method of manufacturing the optoelectronic material.

To achieve this object, an optoelectronic material according to this invention has ultrafine particles dispersed in a substantially uniform medium whose conductivity or dielectric constant is controllable. This can permit carrier injection in the ultrafine particles or the quantum confinement of carriers in the ultrafine particles to be accomplished effectively and controlled.

Further, an optoelectronic material according to this invention has a periodic structure with an ultrafine-particles dispersed layer and transparent material layers alternately stacked one on another. This can provide an optoelectronic material having a property to enhance the intensity of a specific wavelength region in the continuous spectrum that is detected or generated by ultrafine particles.

Furthermore, an optoelectronic material according to this invention has an active layer containing ultrafine particles, and a high-reflection layer and a partial reflection layer provided to sandwich the active layer. This can narrow the wavelengths of detected and emitted lights and can increase the intensity.

Moreover, using any of the aforementioned optoelectronic materials to constitute a light-emitting device, a display device or an optoelectric conversion device with a pair of electrodes sandwiching the optoelectronic material in such a way as to be in direct contact thereto, it is possible to suitably control the electric contact between the electrodes and the optoelectronic material layer to effectively accomplish a light emission or an optoelectric conversion function.

A portable display apparatus according to this invention is designed by essentially using the display device. This design can provide a potable display apparatus which is suitable for size and weight reduction and has low dissipation power and a high resolution, and which can suitably adapted for use as an HMD or an electronic dictionary.

Further, a method of manufacturing an optoelectronic material according to this invention comprises a first target material placing step of placing a first target material in a vacuum reaction chamber in low pressure rare gas ambient; a second target material placing step of placing a second target material in a reaction chamber as isolated from the first target material and the deposition substrate as an ambient component; an ablation step of irradiating a laser beam to the first target material placed in the first target material placing step to cause desorption and injection of the target material; and an evaporation step of evaporating the second target material placed in the second target material placing step. With this structure, a material produced in the evaporation step is collected on the deposition substrate at substantially the same time as ultrafine particles obtained by condensing and growing a material, desorbed and injected in the ablation step, in rare gas ambient are collected on the deposition substrate to thereby acquire an optoelectronic material having the ultrafine particles dispersed in a material comprised of the second target material.

DETAILED DESCRIPTION OF THE PREFERRED EMBODIMENT

Figure 1A:
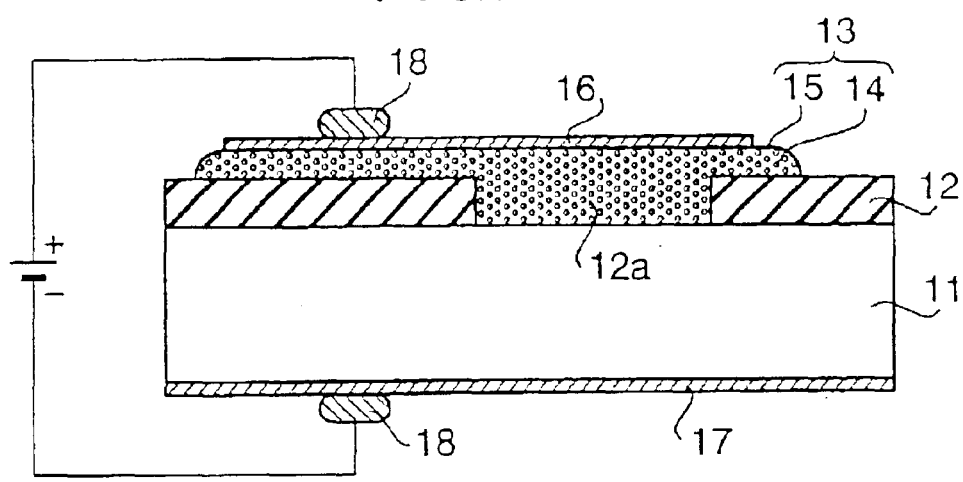
FIGS. 1A through 1C are cross-sectional structural views of a light-emitting device according to the first embodiment of this invention.

An optoelectronic material according to this invention comprises a uniform medium with a controllable electric characteristic; and semiconductor ultrafine particles dispersed in the medium and having a mean particle size of 100 nm or less. This can provide the quantum confinement effect of ultrafine particles.

It is preferable that the particle size (diameter) of the semiconductor ultrafine particles in the optoelectronic material according to this invention or an ultrafine-particles dispersed layer be equal to or smaller than approximately two times the de Broglie wavelength of a semiconductor material for the ultrafine particles.

As the optoelectronic material according to this invention is constituted by dispersing ultra fine particles in a medium having a uniform conductivity, the quantum confinement effect of ultrafine particles can be demonstrated given without imbalance. Further, As ultrafine particles are dispersed in a substantially uniform medium with a controllable conductivity or dielectric constant, the quantum confinement effect of carriers in ultrafine particles can be controlled.

It is preferable that the medium have a specific resistance approximately same as or greater than that of the ultrafine particles. This can permit the quantum confinement effect of carriers in ultrafine particles to be demonstrated efficiently.

It is also preferable that the distance between the ultrafine particles dispersed in the medium be equal to or greater than the radius of the ultrafine particles. Alternatively, the packing fraction of the ultrafine particles in the medium may be equal to or less than 30%. This can allow the quantum trapping of ultrafine particles to be demonstrated effectively.

If the standard enthalpy of formation of the medium is lower than that of an oxide of the ultrafine particles dispersed in the medium, the ultrafine particles can stably exist in the medium.

Further, the ultrafine particles dispersed in the medium may be covered with an oxide of an element constituting the ultrafine particles. In this case, even if the standard enthalpy of formation of the medium is higher than that of an oxide of the ultrafine particles dispersed in the medium, the ultrafine particles can stably exist in the medium.

It is suitable that the ultrafine particles in the above-described optoelectronic materials contain a group IV semiconductor. With this structure, ultrafine particles are formed of a material whose quantity is unlimited and which is free of environmental contamination, and are excellent in Si-LSI technology matching, environmental resistance and assemblyless process. The ultrafine particles may contain a group III–V or II–VI compound semiconductor. Further, the medium is suitably a thin film of transparent conductive material or dielectric material.

An optoelectronic material according to this invention is characterized by the structure where an ultrafine-particles dispersed layer having semiconductor ultrafine particles with a mean particle size of 100 nm or less dispersed in a uniform medium with a controllable electric characteristic, and transparent material layers are alternately stacked one on another. This can enhance the intensity of a specific wavelength region in the continuous spectrum that is inherently generated by ultrafine particles.

The transparent layers are suitably formed of a thin transparent conductive film or dielectric film. It is desirable that the ultrafine-particles dispersed layer has the aforementioned characteristics.

An optoelectronic material embodying this invention comprises an ultrafine-particles dispersed layer having semiconductor ultrafine particles with a mean particle size of 100 nm or less dispersed in a uniform medium with a controllable electric characteristic; and a partial reflection layer and a high-reflection layer provided on and under the ultrafine-particles dispersed layer. This can enhance the intensity of a specific wavelength region in the continuous spectrum that is inherently generated by ultrafine particles. At least one of the partial reflection layer and the high-reflection layer may be formed of a thin metal film.

It is preferable that at least one of the partial reflection layer and the high-reflection layer should have a multilayer structure with a periodic structure having at least two kinds of layers with different refractive indexes alternately stacked one on another. This can enhance the intensity of a specific wavelength region in the continuous spectrum that is inherently generated by ultrafine particles contained in the ultrafine-particles dispersed layer.

Alternatively, the high-reflection layer may be formed of a multilayer film having at least two kinds of layers with different refractive indexes alternately stacked one on another, and a thin metal film. The multilayer film may include an ultrafine-particles dispersed layer having the aforementioned characteristics.

It is preferable that the ultrafine-particles dispersed layer in the above-described optoelectronic material should have the aforementioned characteristics. In this case, the optical film thickness of the ultrafine-particles dispersed layer is suitably an integer multiple of the wavelength of the emitted light.

A light-emitting device according to this invention comprises an ultrafine-particles dispersed layer having semiconductor ultrafine particles with a mean particle size of 100 nm or less dispersed in a uniform medium with a controllable electric characteristic; and a pair of electrodes sandwiching the ultrafine-particles dispersed layer, whereby as a voltage is applied to the pair of electrodes, carriers are injected into the semiconductor ultrafine particles and light emission occurs in a radiative recombination of electron-hole pairs caused by carrier injection. This can permit the electric connection between the electrodes and the optoelectronic material layer to be controlled.

The emitted photon energy may be controlled by adjusting the particle size of ultrafine particles, or by adjusting the surface atomic arrangement of ultrafine particles. It is suitable that the pair of electrodes are transparent or semitransparent electrodes, which can provide excellent transmittance of external light.

Further, a thin film of a metal electrode may contact the ultrafine-particles dispersed layer. In this case, it is preferable that the ultrafine-particles dispersed layer and the metal electrode should have a Schottky junction type contact. The thin film of a metal electrode suitably contains any one of magnesium, indium, aluminum, platinum, gold, silver, tungsten, molybdenum, tantalum, titanium, cobalt, nickel and palladium.

Further, it is suitable that a semiconductor substrate provided with one electrode and an insulator layer formed on the one-electrode side of the semiconductor substrate and having an opening for partially exposing the semiconductor substrate are provided, an optoelectronic material layer is formed to cover the opening to make the opening portion an active region, the radiative recombination of electron-hole pairs inside ultrafine particles or in the vicinity of the surface of the ultrafine particles is accomplished by a multiplication phenomenon, and the emission intensity has such a property as to increase more than being proportional to an injection current to the light-emitting device. The use of such a multiplication phenomenon can ensure very effective utilization of power to be consumed in the initial electron injection and the limited quantum efficiency at the time of ion impact, and is significantly effective in increasing the dynamic range of the emission intensity.

If p-n junction is formed in the optoelectronic material layer, a high power efficiency is ensured as compared with the case where it merely has a Schottky junction type contact which apparently is the simplest structure to realize a light-emitting device.

A monochrome display device for adjusting the emission intensity of each of unit pixels, regularly arranged in a planar form, by a change in the excitation current to the light-emitting elements of the unit pixels by using such light-emitting elements to form light-emitting elements corresponding to the unit pixels. A color display device for adjusting the emission intensity and color of each of unit pixels, regularly arranged on a plane, by a change in the excitation current to light-emitting elements constituting the unit pixels may be constituted by designing light-emitting element designed to have ultrafine particles with different mean particle sizes so as to emit lights of different colors in the three primary colors, and using the light-emitting elements to form light-emitting elements which correspond to the unit pixels and are capable of emitting all of the three primary colors.

This invention further provides a portable display apparatus having the above-described display devices. In this case, a very high resolution can be obtained by setting the length of the unit pixels in on direction to about 1 to 100 $\mu$m. The portable display apparatus having such display devices may be a head mounted display which comprises a fixing member for securing the display apparatus to a head of a person whom the display device is to be mounted, and an optical system for forming information displayed on the display device to right and left eyes of the person. With this structure, the display apparatus is compact and provides high definition, so that the eye contact optical system becomes compact, thus contributing to reducing the size and weight of the main body of the head mounted display and ensuring a wide view angle and high resolution.

The optical system of the head mounted display may also form outside information on the right and left eyes of the person wearing the display. It is preferable that the light-emitting devices having the transmittance should be laid out on a transmittive member to have the transmittance so that outside light is introduced to the optical system. Because of the transmittance, this structure can realize a compact see-through type head mounted display which does not require a half mirror or the like.

The display devices may be arranged in a direction of a line of sight different from an outward line of sight of the person wearing the apparatus, so that the person can easily observe outside by shifting the line of sight up and down or the like, not moving the head itself.

This invention also provides an electronic dictionary which displays information by means of the display devices. As the display apparatus is compact and high definition type, it is possible to realize a compact and light dictionary which has the same level of high resolution as conventional paper dictionaries.

A photodetector according to this invention comprises an ultrafine-particles dispersed layer having semiconductor ultrafine particles with a mean particle size of 100 nm or less dispersed in a uniform medium with a controllable electric characteristic; and a pair of electrodes sandwiching the ultrafine-particles dispersed layer, and has a photodetective function by detecting a change in an internal resistance caused by carrier generation originated from light irradiation to the ultrafine-particles dispersed layer.

A photodetector according to this invention comprises an optoelectronic material layer containing the aforementioned optoelectronic material, and a pair of electrodes provided on and under the optoelectronic material layer, with Schottky junction formed at an interface between the optoelectronic material layer and the electrodes or p-n junction formed in the optoelectronic material layer, and has a photodetective function by detecting a change in photoelectromotive force generated by carrier generation originated from light irradiation.

The emitted photon energy may be controlled by adjusting the particle size of ultrafine particles, or by adjusting the surface atomic arrangement of ultrafine particles.

An optoelectric conversion device according to this invention is an optoelectric conversion device, which comprises an optoelectronic material layer containing the aforementioned optoelectronic material, and a pair of electrodes provided on and under the optoelectronic material layer, and which has a function of exhibiting a light emission in a radiative recombination of generated electron-hole pairs caused by carrier injection when minor carriers are injected into the ultrafine particles of the optoelectronic material layer through the pair of electrodes, and a photodetective function by detecting a change in an internal resistance caused by carrier generation when light is irradiated on the optoelectronic material layer.

An optoelectric conversion device according to this invention is an optoelectric conversion device, which comprises an optoelectronic material layer containing the aforementioned optoelectronic material, and a pair of electrodes provided on and under the optoelectronic material layer, with Schottky junction formed at an interface between the optoelectronic material layer and the electrodes or p-n junction formed in the optoelectronic material layer, and which has a function of exhibiting a light emission in a radiative recombination of generated electron-hole pairs caused by carrier injection when minor carriers are injected into the ultrafine particles of the optoelectronic material layer through the pair of electrodes, and a photodetective function by detecting photoelectromotive force generated by carrier generation when light is irradiated on the optoelectronic material layer.

The emitted and detected photon energy may be controlled by adjusting the particle size of ultrafine particles, or by adjusting the surface atomic arrangement of ultrafine particles.

In the above-described optoelectric conversion devices, a pair of electrodes may be transparent or semitransparent electrodes.

By controlling optical gap energy by adjusting the mean particle size of the ultrafine particles in the aforementioned photodetector or the structure of the surface atomic arrangement, the photodetector according to this invention can be used as an ultraviolet detector comprising a photodetector having a photodetective function for ultraviolet rays. This structure eliminates the need for filters or the like and provides excellent characteristics in the Si-LSI technology matching, environmental resistance and assemblyless property.

By controlling optical gap energy by adjusting the mean particle size of the ultrafine particles in the aforementioned photodetector or the structure of the surface atomic arrangement, this invention provides a blue-color sensor comprising a photodetector having a photodetective function for blue light. This structure eliminates the need for filters or the like and provides excellent characteristics in the Si-LSI technology matching, environmental resistance and assemblyless property.

By controlling optical gap energy by adjusting the mean particle size of the ultrafine particles in the aforementioned photodetector or the structure of the surface atomic arrangement, this invention provides a color sensor comprising optoelectric conversion layers, comprised of the photodetectors having photodetective functions in different predetermined wavelength regions, stacked through a transparent insulator film. With this structure, when light is irradiated, only the optoelectronic material layer which has a sensitivity to its wavelength component performs optoelectric conversion, thus providing the function of a color sensor.

It is suitable in view of the light-receiving sensitivity that the stacked photoelectric conversion layers have different optical gap energies and the layer closer to the light-receiving surface has a greater optical gap energy. Further, the photoelectric conversion layers may include three photoelectric conversion layers which have different optical gap energies in the visible light region.

This invention provides a monolithic integrated semiconductor device which has at least one or more of the aforementioned light-emitting device, display device, optoelectric conversion device, ultraviolet detector, blue-color sensor and color sensor. With this structure, the device is formed of a material whose quantity is unlimited and which is free of environmental contamination, and has excellent characteristics in the Si-LSI technology matching, environmental resistance and assemblyless property.

A method of manufacturing an optoelectronic material according to this invention is characterized in that a laser beam is irradiated onto a first target of a semiconductor material, placed in a reaction chamber in low pressure rare gas ambient, a semiconductor material ablated from the first target is condensed/grown to acquire ultrafine particles having a mean particle size of 100 nm or smaller, and the ultrafine particles are enclosed in a medium material having a controllable electric characteristic. Schemes for causing the ultrafine particles to be enclosed in a medium material having a controllable electric characteristic include a laser ablation and a scheme of burying ultrafine particles in a medium material formed in a bulk.

That is, the method is characterized by placing a first target material in a vacuum reaction chamber in low pressure rare gas ambient, placing a deposition substrate in the vacuum reaction chamber, and irradiating a laser beam to the first target material placed in the first target material placing step to cause desorption and injection of the target material (ablation), and collecting ultrafine particles, obtained by condensing and growing a material, desorbed and injected in this ablation step, in rare gas ambient on the deposition substrate to acquire an optoelectronic material containing the ultrafine particles.

With the above-described structure, ultrafine particles with the particle size controlled on the nm order are surely deposited on the substrate by performing the laser ablation step in rare gas ambient.

A method of manufacturing an optoelectronic material according to this invention comprises a step of irradiating a laser beam onto a first target of a semiconductor material, placed in a reaction chamber in low pressure rare gas ambient, and a second target of a medium material with a controllable electric characteristic, placed in the reaction chamber, and condensing/growing a semiconductor material ablated from the first target to be collected as ultrafine particles having a mean particle size of 100 nm or smaller on a substrate placed in the reaction chamber, and condensing/growing a medium material ablated from the second target to be collected on the substrate placed in the reaction chamber, thus forming an ultrafine-particles dispersed layer having semiconductor ultrafine particles dispersed in the medium on the substrate.

The method according to this invention places a second target material in the vacuum reaction chamber where the first target material is placed, and sputters the second target material to collect a material, produced by sputtering, on the deposition substrate at substantially the same time as ultrafine particles obtained by condensing and growing a material, desorbed and injected in the ablation step, in rare gas ambient are collected on the deposition substrate to thereby acquire an optoelectronic material having the ultrafine particles dispersed in a material comprised of the second target material. With this structure, a thin dielectric film with dispersed ultrafine particles is formed on the substrate by simultaneous deposition using ablation and sputtering.

Further, a method according to this invention places a first target material in a first reaction chamber in low pressure rare gas ambient, places a deposition substrate in a deposition chamber, places a second target material in a second reaction chamber as isolated from the first target material and the substrate as an ambient component, irradiates a laser beam to the first target material placed in the first target material placing step to cause desorption and injection of the target material (ablation), and evaporates the second target material placed in the second target material placing step. With this structure, a material produced in the evaporation step on the second target material is collected on the deposition substrate at substantially the same time as ultrafine particles obtained by condensing and growing a material, desorbed and injected in the ablation step on the first target material, in rare gas ambient are collected on the deposition substrate so that an optoelectronic material having the ultrafine particles dispersed in a material comprised of the second target material can be acquired.

It is preferable that a laser be used in the evaporation step for evaporating the second target material, and ablation of irradiating a second laser beam to the second target material to cause desorption and injection of the target material may be used.

It is preferable that the above-described method of manufacturing an optoelectronic material should further comprise a step of changing introduction pressure of a low pressure rare gas, and this structure can permit a mean particle size of the ultrafine particles to be controlled.

A step of performing mass separation of ultrafine particles acquired from the ablation step may further be provided. This structure can allow a mean particle size of the ultrafine particles to be controlled. In this case, the step of performing mass separation of ultrafine particles may include a step of ionizing ultrafine particles and a step of applying an electric field or a magnetic field to the ionized ultrafine particles.

In the above method, the first target material may include at least one of a semiconductor, metal and dielectric substance. Further, the first target material may be a mixed material containing a plurality of group IV semiconductors, and this mixed material may be a mixture of silicon and germanium and in a mixed crystal state. With this structure, by using mixed crystal ultrafine particles, a mixed crystal composition ratio can be used as an auxiliary parameter in adjusting the light emission characteristics. Furthermore, such mixed crystallization facilitates the relaxation of the wave number selection rule at the time of making ultrafine particles, or facilitates the occurrence of radiative recombination.

It is suitable that the mixed material is formed by a mixing step of mechanically mixing plural types of starting row particles and a sintering step of sintering the mixed particles by hot press.

With the first target material being a group II–VI semiconductor or a group III–V semiconductor, the laser ablation method is basically a process which does not depend much on the melting point of the target element or the evaporation pressure, so that those semiconductor ultrafine particles with the stoichiometric composition maintained can be fabricated.

Further, a step of introducing an n-type conductive impurity and a p-type conductive impurity to a semiconductor layer formed by the ultrafine particles collected on the deposition substrate may be provided, so that p-n junction is formed in the semiconductor layer. In this case, the n-type conductive impurity and p-type conductive impurity to be introduced in the semiconductor layer may be introduced at different diffusion depths, so that p-n junction can be formed at the desired position.

It is suitable that the second target material is a transparent conductive material or dielectric material.

Further, a step of oxidizing the surface of the optoelectronic material on the substrate may be provided. This structure eliminates a surface layer in which crystal defect or impurity is mixed and improves the crystallinity and purity. It is suitable that in the oxidization step, ultrafine particles acquired in an air association step are subjected to a heat treatment in an ambient gas containing oxygen to thereby coat surfaces of the ultrafine particles with a thermal oxide film. It is also suitable that a heat treatment in a non-oxidization ambient at a higher temperature than a temperature at a time of forming a thermal oxide film in a coating step is carried out prior to formation of the thermal oxide film, which can recover the crystallinity of ultrafine particles more completely.

This invention provides an optoelectronic material fabricated by the above-described method of manufacturing optoelectronic material. This structure can provide an ultrafine-particles dispersed material with the particle size of ultrafine particles controlled. This invention also provides an ultrafine-particles dispersed layer or an optoelectronic material layer formed of an optoelectronic material fabricated by the above-described method of manufacturing optoelectronic material. This structure can provide an ultrafine-particles dispersed material with the particle size of ultrafine particles controlled.

This invention provides a light-emitting device whose optoelectronic material layer is comprised of an optoelectronic material obtained by the above-described method. Further, this invention provides a monochrome display device or a color display device including the mentioned light-emitting device. Furthermore, this invention provides a portable display apparatus having the mentioned display device.

This invention provides an optoelectric conversion device whose optoelectronic material layer is comprised of the aforementioned optoelectronic material. Further, this invention provides an ultraviolet detector and a blue-color sensor both comprising the mentioned optoelectric conversion device. Furthermore, this invention relates to a color sensor comprising the mentioned optoelectric conversion device.

Moreover, this invention provides a monolithic integrated semiconductor device which has at least one or more of the aforementioned light-emitting device, display device, optoelectric conversion device, ultraviolet detector, blue-color sensor and color sensor.

First Embodiment

The principle structure of a light-emitting device using an optoelectronic material according to this invention will now be described in detail as the first embodiment with reference to FIGS. 1 through 5.

According to this embodiment, a description will be given of an electroluminescence (EL) device in which a light-emitting (active) region is an optoelectronic material layer having ultrafine particles of Si, a typical one of group IV semiconductors, with its surface covered with its own thermal oxide film, dispersed in a substantially uniform transparent medium with a controllable conductivity or dielectric constant.

In this embodiment and subsequent embodiments, the "substantially uniform medium" means the electric properties of a medium, particularly, the conductivity is approximately uniform in the medium. That is, ultrafine particles to be dispersed in a medium are a set of several tens to several hundreds of atoms/molecules, whereas a medium itself consists of a set (cluster) of smaller atoms/molecules or of several atoms/molecules. For example, this uniform medium is acquired by forming a uniform film, comprised of a set (cluster) of atoms/molecules smaller than those of ultrafine particles or of several atoms/molecules, on a predetermined substrate or the like by a method such as deposition. In this case, uniform deposition of the cluster on the substrate can be accomplished by adjusting the differential pressure in reaction chambers, e.g., the differential pressure between a reaction chamber and a deposition chamber, by a method like a laser ablation scheme to be discussed later.

In this invention, when the packing fractions of ultrafine particles in arbitrary minute regions (containing about ten ultrafine particles, for example) extracted are confirmed to be equal, it is called a uniform transparent ultrafine-particles dispersed medium. The formation of such a uniform transparent ultrafine-particles dispersed medium suppresses the distribution width of the kinetic energy of electrons, thus ensuring efficient light emission.

FIG. 1 shows the cross-sectional structure of a light-emitting device using an optoelectronic material according to this embodiment. In FIG. 1A, "11" is a substrate. As this substrate 11, an n-type Si substrate having a plane orientation (100), a phosphorus-doped n-type conductivity, and a specific resistance of 10 $\Omega$·cm was used as one example. An isolation insulator film 12, which is a silicon oxide ($SiO_2$) film as one example, is formed 100 nm thick on the top surface of this n-type Si substrate. This isolation insulator film 12 has an opening 12a of about 1 to 2 mm or smaller in diameter formed at the portion which should be the light-emitting (active) region of the light-emitting device, exposing the surface of the substrate 11.

Figure 1B:
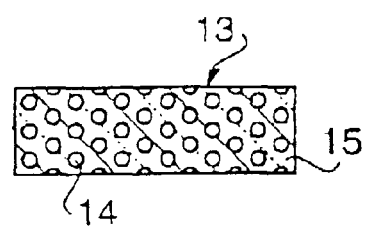

An optoelectronic material layer 13 is deposited so as to cover at least the opening 12a. This optoelectronic material layer 13, as shown in FIG. 1B, is formed of Si ultrafine particles 14 dispersed in a transparent medium 15. The Si ultrafine particles 14 have substantially spherical shapes, the same crystal structure as bulk Si, an n-type conductivity with phosphorus doped at a low concentration, and an adjusted particle size of about 3 to 10 nm. This ultrafine-particles deposition layer has a thickness of about 150 nm. Further, the surfaces of the Si ultrafine particles 14 are covered with an unillustrated $SiO_2$ film whose thickness should be 3 nm or thinner, for example. As the optoelectronic material layer 13 and the substrate 11 are both of an n-type, an electric barrier is not formed at the interface between them.

The transparent medium 15 is a thin uniform film which has a high transmittance in the visible light region and has a controllable conductivity or dielectric constant, and a thin tin oxide ($SnO_2$) film was used here as one example. This thin $SnO_2$ film has a visible light transmittance of more than 80%, and its conductivity or dielectric constant can be controlled by adjusting its forming conditions (substrate temperature, a partial pressure of oxygen, etc.). It is suitable that the specific resistance of the medium is about the same as, or equal to or greater than, the specific resistance of ultrafine particles to be dispersed. For example, since the specific resistance of ultrafine particles lies in the range of about 10 to $10^{-3}$ $\Omega$·cm due to the impurity concentration, the specific resistance of the thin $SnO_2$ film has only to be controlled in the range of about $10^3$ to $10^{-2}$ $\Omega$·cm in accordance with the specific resistance of the ultrafine particles to be dispersed. Such a specific resistance can be achieved by forming the thin $SnO_2$ film at the substrate temperature ranging from, for example, room temperature to about 600° C. The above can permit the quantum confinement effect of carriers in the ultrafine particles to be controlled.

It is desirable that the packing fraction of the Si ultrafine particles 14 in the optoelectronic material layer 13 should be higher because the amount of light emission from the entire optoelectronic material layer 13 increases. When the packing fraction become higher or the distances between the ultrafine particles become closer, however, the wave functions of the carriers in the ultrafine particles become wider and the carriers permeate into the transparent medium too, so that overlapping of the wave functions of the carriers in the adjoining ultrafine particles becomes larger. Consequently, the quantum confinement effect of the carriers in the ultrafine particles is reduced. It is therefore desirable that dispersion should be performed with the distances between the ultrafine particles maintained in such a way that the overlapping of the square of the absolute values of the wave functions become, for example, equal to or smaller than a hundredth of the peak value. This distance is equivalent to the radius r of the ultrafine particles. In this case, given that spherical ultrafine particles having a radius of 1.5 r have a close-packed structure, the packing fraction becomes about 22%. In view of the above, the packing fraction of the Si ultrafine particles 14 in the optoelectronic material layer 13 was set to approximately 20%.

A semitransparent electrode 16 of platinum (Pt) and 10 nm in thickness, as one example, contacts the top surface of the optoelectronic material layer 13, forming so-called Schottky contact, in an electric sense, to the optoelectronic material layer 13 including the transparent medium 15 with the controlled conductivity. A backside electrode 17 of silver (Ag) as one example is provided at the bottom surface of the substrate 11, forming ohmic contact, in an electric sense, to the substrate 11. Further, a thin magnesium (Mg) film having a thickness of about 20 nm may be provided between the substrate 11 and the backside electrode 17 to reduce the electric barrier height at the interface. The electrodes 16 and 17 may be formed, instead of Pt and Ag, of one of Mg, indium, aluminum, gold, silver, tungsten, molybdenum, tantalum, titanium, cobalt, nickel and palladium.

Although Si is used as a material for the ultrafine particles which constitute the optoelectronic material layer, another group IV semiconductor, such as germanium (Ge) or its mixed crystal, is suitably used, or a group III–V or a group II–VI compound semiconductor may be used. While a thin $SnO_2$ has been used as the uniform transparent medium, another thin dielectric film having a specific resistance substantially the same as, or greater than, the specific resistance of ultrafine particles to be dispersed, such as a thin film of titanium oxide ($TiO_2$), indium oxide ($InO_2$), indium-tin oxide (ITO), cadmium oxide (CdO), tungsten oxide ($WO_3$), zinc oxide (ZnO), magnesium oxide (MgO) or zinc sulfide (ZnS), may be used as well. If the film thickness lies in the range where electric conduction by tunneling or hopping is possible, a thin dielectric film of $SiO_2$, aluminum oxide ($Al_2O_3$), magnesium fluoride ($MgF_2$) or calcium fluoride ($CaF_2$), can be used as well.

Although Si ultrafine particles are covered with their own thermal oxide film here, the oxide film of the ultrafine particles is not essential. That is, when the standard enthalpy of formation of the transparent medium is lower than the standard enthalpy of formation of the oxide of the ultrafine particles constituting the optoelectronic material layer, which means that the transparent medium is more stable, oxidization does not occur when the ultrafine particles are dispersed in the transparent medium, thus eliminating the need of the oxide film. When the transparent medium has a higher standard enthalpy of formation, on the other hand, it means that the oxide of the ultrafine particles is more stable.

When the ultrafine particles are dispersed in the transparent medium, therefore, the surface of the ultrafine particles is oxidized while reducing the transparent medium. In this case, therefore, it is preferable that the ultrafine particles should be covered with an oxide film before they are dispersed in the transparent medium.

Specifically, typical combinations of the materials for ultrafine particles constituting an optoelectronic material and the transparent medium are given in Table 1. In Table 1, combinations A are for the case where the transparent medium has a lower standard enthalpy of formation so that the oxide film of the ultrafine particles is unnecessary. By contrast, combinations B are for the case where the standard enthalpy of formation of the transparent medium is higher than that of the oxide film of the ultrafine particles, so that the ultrafine particles should preferably be covered with the oxide film.

TABLE 1

| Transparent Medium | Ultrafine Particles SiGe |
|---|---|
| $Al_2O_3$ | AA |
| $TiO_2$ | AA |
| $In_2O_3$ | AA |
| $SiO_2$ | AA |
| $WO_2$ | BA |
| MgO | BA |
| $SnO_2$ | BB |
| ZnO | BB |
| CdO | BB |

The operational characteristics of an EL device with the above-described structure will be discussed below.

For the operation of the EL device according to this embodiment, a negative DC bias is applied to the backside electrode 17 with respect to the semitransparent electrode 16. This means that the light-emitting device of this embodiment operates on the forward bias.

FIG. 2 show curves of the current v.s. voltage characteristics of the light-emitting device when the light-emitting device using the optoelectronic material according to this embodiment is operated under such a condition.

Figure 1C:
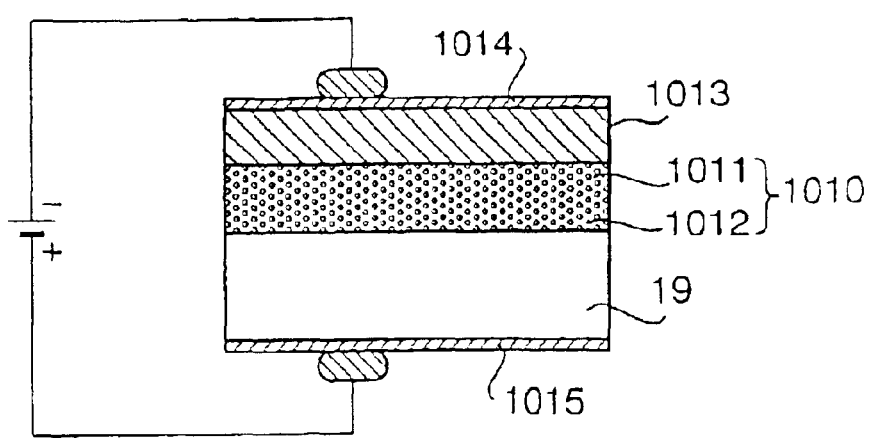
Figure 2A:
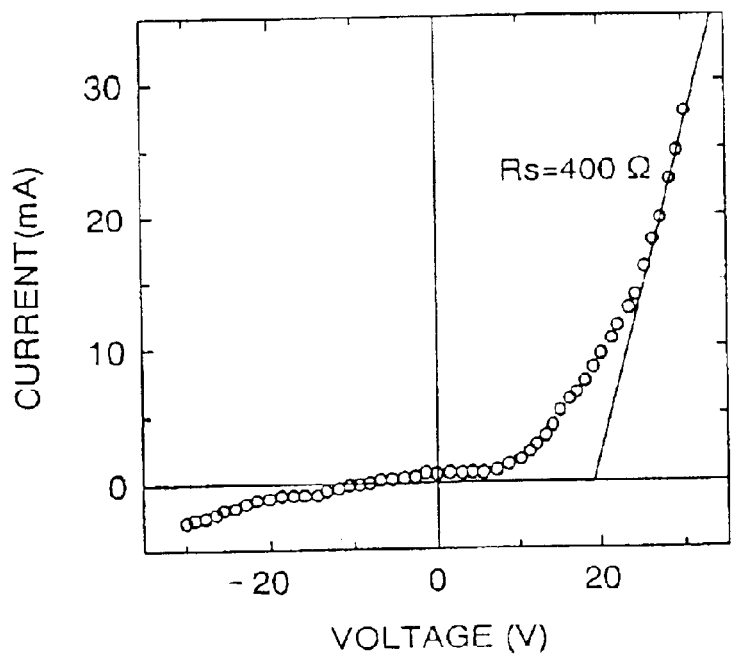
FIGS. 2A and 2B are diagrams showing curves of the current v.s. voltage characteristics of the light-emitting device.

FIG. 2A shows both the vertical scale (current) and horizontal scale (voltage) in linear scale; for the applied voltage on the horizontal scale, the forward bias potential at the Schottky junction formed at the interface between the semitransparent electrode 16 and the optoelectronic material layer 13 in FIG. 1 is taken as the positive direction on the graph. FIG. 2A shows a strong rectifying characteristic by the Schottky junction formed at the interface between the semitransparent electrode 16 and the optoelectronic material layer 13. An external series resistance of the entire light-emitting device, as estimated through extrapolation on the high current side at the time of the forward bias voltage is applied, is approximately 400 Ω.

Figure 2B:
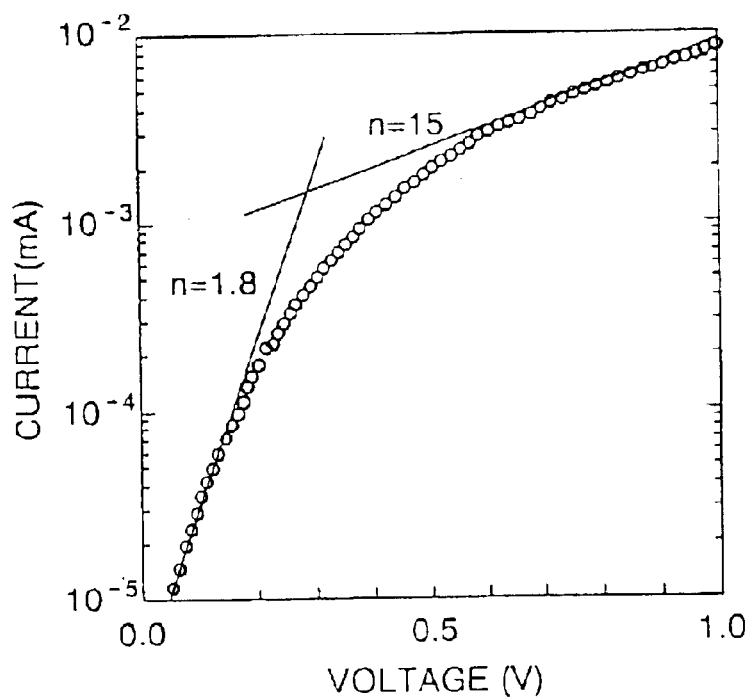

FIG. 2B shows only the vertical scale (current) in logarithmic scale and the horizontal scale (voltage) in linear scale with the forward bias potential at the Schottky junction taken as the positive direction on the graph. From the inclination of this characteristic curve in this figure, the value of the ideal factor n of Schottky junction can be acquired. It is however apparent that as the value n of the light-emitting device according to this embodiment depends on the applied voltage, it is 1.8 when the applied voltage is 0.2 V or lower, and is increased to about 15 for a higher area. In general, a high value of n significantly greater than 1 means that the interface level density is high and they are charged. In view of this point too, it appears that the EL device according to this embodiment of the invention emits light when a forward bias voltage is applied to the Schottky junction formed at the interface between the semitransparent electrode 16 and the optoelectronic material layer 13.

Figure 3:
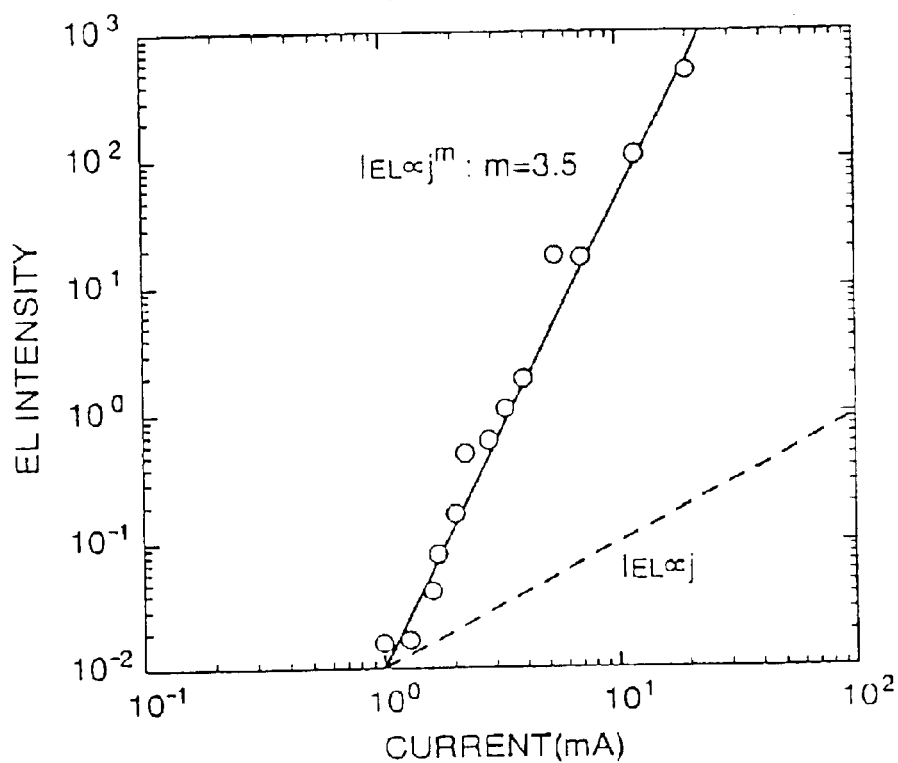
FIG. 3 is a diagram showing a curve of the emission intensity v.s. current characteristic of the light-emitting device.

FIG. 3 shows a curve of the emission intensity v.s. current characteristic of the EL device which uses the optoelectronic material according to this embodiment. In the figure, both the vertical scale (emission intensity) and the horizontal scale (current) are shown in logarithmic scale. It is understood from FIG. 3 that light emission starts when the forward bias current density is 30 mA/cm² (the forward bias voltage is about 7.0 V in this case) after which the emission intensity monotonously increases with an increase in forward bias current. That is, the emission intensity $I_{EL}$ and the forward bias current j are expressed by the following equation (1).

$$I_{EL} \propto j^m (m=3.5) \quad (1)$$

The emission intensity being proportional to the power 3.5 of the forward bias current means that the dependency of the emission intensity on the forward bias current is very sharp, which is a novel result that has not been observed at all in the conventional light-emitting devices having crystalline Si as an active layer. In an EL device having a porous Si layer as an active region, for example, as has been discussed in the section of BACKGROUND ART, basically, the emission intensity merely increases in proportion to the forward bias current (the broken line in the figure). The abrupt dependency of the emission intensity on the forward bias current means that a light-emitting/display device with a large dynamic range, i.e., a high contrast ratio, and high quality can be realized.

Figure 4:
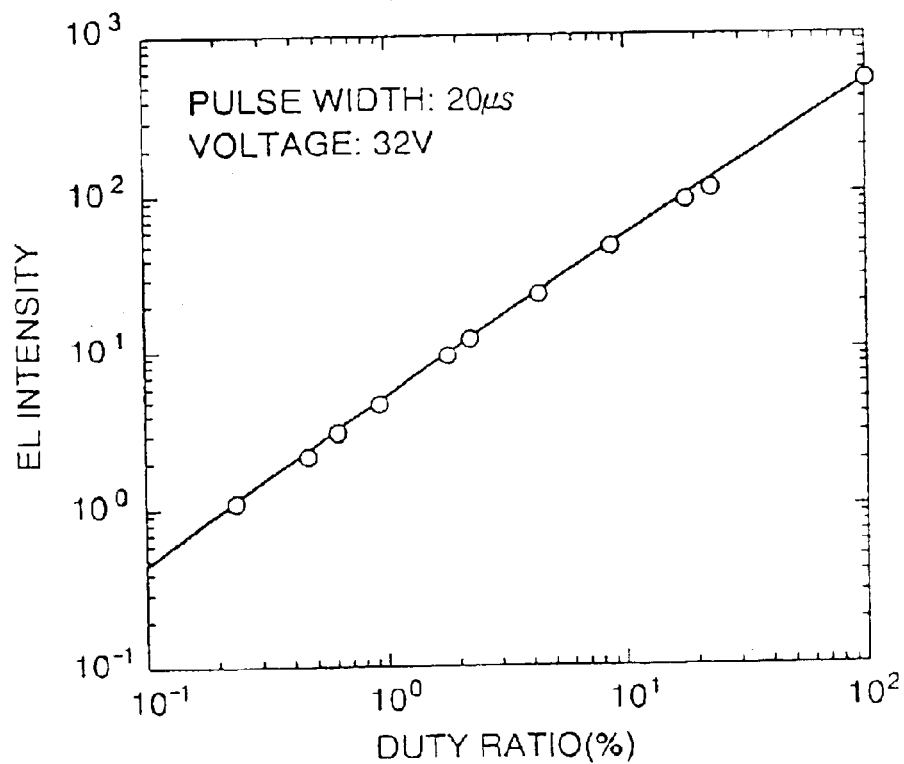
FIG. 4 is a diagram showing a curve on the emission intensity v.s. duty ratio of the light-emitting device.

FIG. 4 shows a curve of the emission intensity v.s. duty ratio of the EL device according to this embodiment. In the figure, both the vertical scale (emission intensity) and the horizontal scale (duty ratio) are shown in logarithmic scale. The applied voltage to the EL device had a pulse width of 20 μs and a voltage value of 32 V, and the duty ratio was changed from 0.25% to 100% (DC) by changing the frequency. It is apparent from FIG. 4 that the emission intensity decreases in proportion to a reduction in duty ratio. This result shows that the light emission efficiency is constant. In other words, it can be said that the EL device according to this embodiment is hardly affected by heat generated inside the EL device. Since the same light emission efficiency as that for DC can be acquired even when the EL device is driven with a pulse width of 20 μs or narrower, the device can be said to have a response speed on the order of μs or faster.

Figure 5:
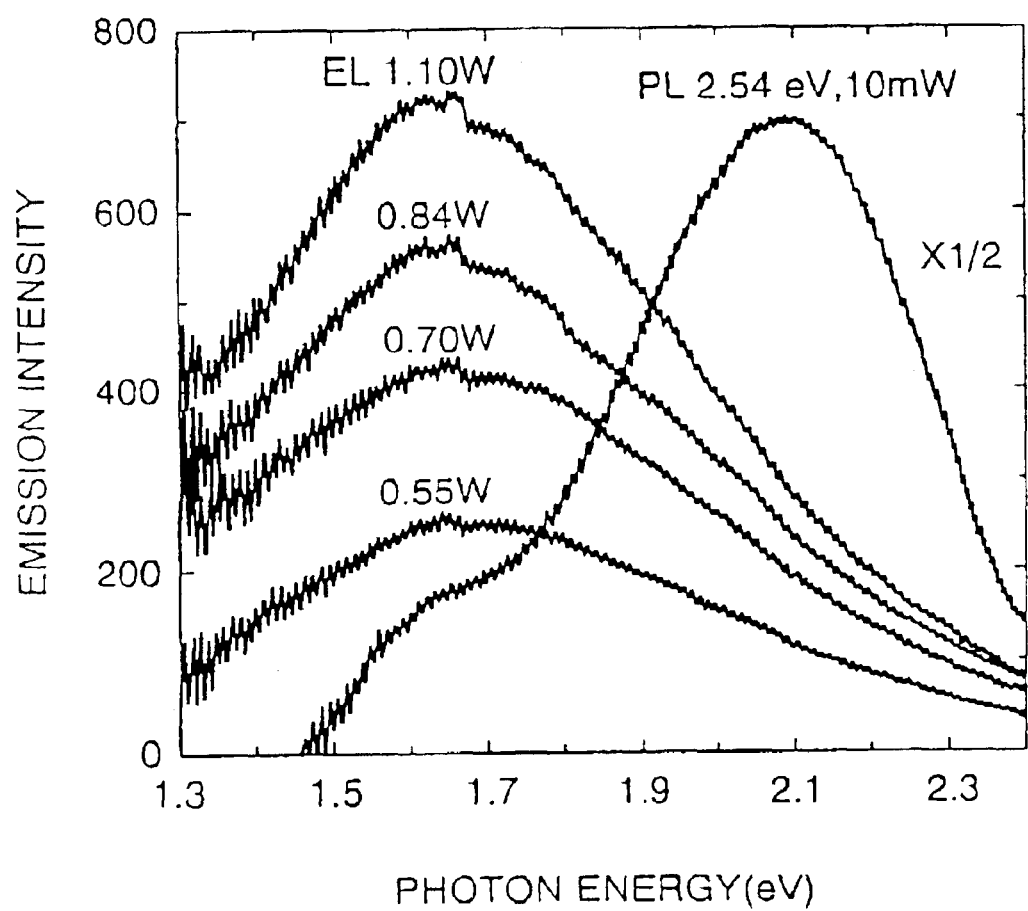
FIG. 5 is a diagram showing curves of the emission intensity v.s. photon energy characteristics of PL and EL of the light-emitting device.

FIG. 5 shows spectra (curves of the emission intensity v.s. photon energy characteristics) of both photoluminescence (PL) and EL of the EL device using the optoelectronic material according to this embodiment. Excitation of PL was conducted by using an argon ion ($Ar^+$) laser with photon energy of 2.54 eV and power of 10 mW and directly irradiating a laser beam to the optoelectronic material layer which would become the active layer. The excitation conditions for EL were injection power of 0.55 W to 1.10 W to the optoelectronic material layer and the luminescence active region being circular ($3.1 \times 10^{-2}$ cm²).

FIG. 5 shows that PL has a spectrum having the main peak at 2.10 eV (green) and a subpeak at 1.65 eV (red), whereas EL has a broad luminescence spectrum with the peak of 1.65 eV (red). The peak position of the EL spectrum shifts toward the lower energy side as injection power to the EL device increases.

The results indicate that the principle of light emission of the EL device using the optoelectronic material according to this embodiment is not based on black body radiation. This is because the radiation peak shifts toward the higher energy as the temperature rises in black body radiation, whereas, as mentioned above, it shifts toward the lower energy as the injection power increases (i.e., the temperature rises) in this embodiment. Further, when a black body emits light having a peak at 1.65 eV, the temperature is estimated to be 3800 K, and the temperature cannot reach that high in this embodiment.

It seems that the operational principle of the light-emitting device according to this embodiment which shows the aforementioned results is explained as follows. First, hot electrons accelerated by the forward bias applied voltage are injected to the optoelectronic material layer 13. The injected hot electrons, when reaching the core of the Si ultrafine particles 14, excite (generate) electron-hole pairs by impact ionization. The quantum efficiency in this excitation process reaches about 1.0 when the energy of the injected electrons is 4.0 eV, and goes up as the energy further increases.

The electrons once injected or the electron-hole pairs once excited are confined inside the Si ultrafine particles 14 by the interface between the Si ultrafine particles 14 and the $SiO_2$ film formed on their surface or the transparent medium 15, to further generate electron-hole pairs in the applied voltage in the Si ultrafine particles 14. That is, a so-called multiplication phenomenon occurs to further generate multiple excited electron-hole pairs. The light emission phenomenon with an abrupt dependency of the emission intensity on the forward bias current is therefore caused by the recombination phenomenon around the radiative recombination associated with the excited electron-hole pairs which are kept generated in such a multiplication manner.

In addition, since the target Si ultrafine particles 14 have spherical shapes of the nm order according to this embodiment, the mean free path of the electrons or excited electron-hole pairs confined in the ultrafine particles 14 is short, which, it seems, can generate excited electron-hole pairs more effectively by the impact ionization.

In the EL device having porous Si as an active layer as described in the BACKGROUND ART section, basically, excited electron-hole pairs are merely generated by the injection of minor carriers at the junction (p-n), and the number of the excited electron-hole pairs is proportional to the injection current. Consequently, the emission intensity is also proportional to the injection current. According to this prior art, porous Si actually has a linear shape though it has a minute structure of the nm order, the mean free path at the time carriers are drifted in the porous Si is relatively long, which appears to have adversely affected the efficiency of generating the excited electron-hole pairs.

Further, as shown in FIG. 5, the following may be the reason why the PL and EL spectra do not match with each other. In the impact ionization and the generation of excited electron-hole pairs by multiplication in the EL process, hot electrons to be injected have considerably higher energy than the band gap (1.1 eV) of Si (the applied voltage being 26 to 32 V under the excitation conditions in FIG. 5), so that transition to the higher energy (so-called higher interband transition) becomes possible even during conduction band. This causes not only the radiative recombination at the minimum gap energy but also the radiative recombination having a higher energy difference, which, it seems, further widens the width of the luminescence spectrum.

With regard to PL, by contrast, the photon energy to be injected is 2.54 eV, which is relatively low. Thus, there is a low probability of causing the higher interband transition, which seems to make the width of the luminescence spectrum narrower than that of EL.

Further, in EL the impact ionization by the injected electrons occurs in the core of the Si ultrafine particles 14 in the vicinity of the surface of the Si ultrafine particles. Although the excitation process is considerably sensitive to the state of the interface, therefore, the same excitation of electron-hole pairs as that for a bulk cannot be expected due to the presence of many surface level charged at the interface; it seems that the excitation efficiency particularly on the high energy side is falling.

For PL, by contrast, it is considered that excited light of nearly the same intensity penetrates the entire Si ultrafine particles due to the large absorption coefficient at the time excited light with energy of 2.54 eV is irradiated, and it is estimated that electron-hole pairs are excited like a bulk form over approximately the entire Si ultrafine particles 14 including their centers, so that the efficiency of excitation on the high energy side does not drop.

In the structure of the light-emitting device using the optoelectronic material according to this embodiment, p-n junction can be formed in the optoelectronic material layer 13. FIG. 1C shows the cross-sectional structure of a light-emitting device having p-n junction as one example.

In FIG. 1C, a p-type Si substrate having a plane orientation (100), a boron-doped p-type conductivity, and a specific resistance of 10 Ω·cm was used as one example of as a substrate 19. A p-type optoelectronic material layer 1010 is deposited on the top surface of this p-type Si substrate 19. This p-type optoelectronic material layer 1010 is formed by Si ultrafine particles 1011 dispersed in a transparent medium 1012. The Si ultra fine particles 1011 have substantially spherical shapes, the same crystal structure as bulk Si, a p-type conductivity with boron doped at a low concentration, and an adjusted particle size of about 3 to 10 nm. Further, a thin $SiO_2$ film was used as one example of the transparent medium 1012, and the packing fraction of the Si ultrafine particles 1011 was about 20%. This p-type ultrafine-particles deposition layer has a thickness of about 100 nm. As the p-type optoelectronic material layer 1010 and the substrate 19 are both of a p-type, no electric barrier is formed at the interface between them.

Then, an n-type optoelectronic material layer 1013 is deposited in contact to the p-type optoelectronic material layer 1010. This n-type optoelectronic material layer 1013 has the same structure as the optoelectronic material layer 13 in FIG. 1A, and has a thickness of approximately 50 nm. When the deposition of this n-type optoelectronic material layer is completed, boron is introduced by ion injection to make it a high-concentrate doped n-type. The ion injection conditions were acceleration energy of 20 keV and a dose of $5 \times 10^{15}$ $cm^{-2}$.

Further, a semitransparent electrode 1014 of Ag and 10 nm in thickness, as one example, contacts the top surface of the n-type optoelectronic material layer 1013, forming so-called ohmic contact, in an electric sense, to the n-type optoelectronic material layer 1013. A backside electrode 1015 of Ag is provided at the bottom surface of the substrate 19, forming ohmic contact, in an electric sense, to the substrate 19. Further, a thin Mg film having a thickness of about 20 nm may be provided between the n-type optoelectronic material layer 1013 and the semitransparent electrode 1014 and between the substrate 19 and the backside electrode 1015 to reduce the electric barriers heights at the interfaces. The electrodes 1014 and 1015 may be formed, instead of Ag, of one of Mg, indium, aluminum, gold, platinum, tungsten, molybdenum, tantalum, titanium, cobalt, nickel, palladium and the like.

The semitransparent electrode 1014 and the backside electrode 1015 are connected to a power supply, as needed, by wire leads or the like via a conductive paste 1016 or the like.

With the above-described structure, when a forward bias voltage (the semitransparent electrode 1014 is negative with respect to the backside electrode 1015) is applied, minor carriers are mutually injected, like electrons from the high-concentrate n-type region to the low-concentrate p-type region and holes from the low-concentrate p-type region to the high-concentrate n-type region. This p-n junction is advantageous in accomplishing the generation of electron-hole pairs more efficiently than the previous structure which permits injection of only electrons through the Schottky junction.

A description will now be given of how to control the luminescence wavelength (photon energy) of the light-emitting device using the optoelectronic material according to this embodiment in the visible light region. First, the first scheme adjusts the particle size (size) of the core of the Si ultrafine particles 14 and the band gap energy and the associated emitted photon energy are directly varied by the quantum confinement effect that happens at that time. To cause the quantum confinement effect, the aimed size of the ultrafine particles is about twice the de Broglie wavelength. Table 2 shows the de Broglie wavelengths of semiconductor materials for ultrafine particles and the particle sizes (diameters) which will give the quantum confinement effect. As apparent from this table, the diameter of Si ultrafine particles should be 5 nm or smaller in order to give the quantum confinement effect using Si, for example.

Figure 6A:
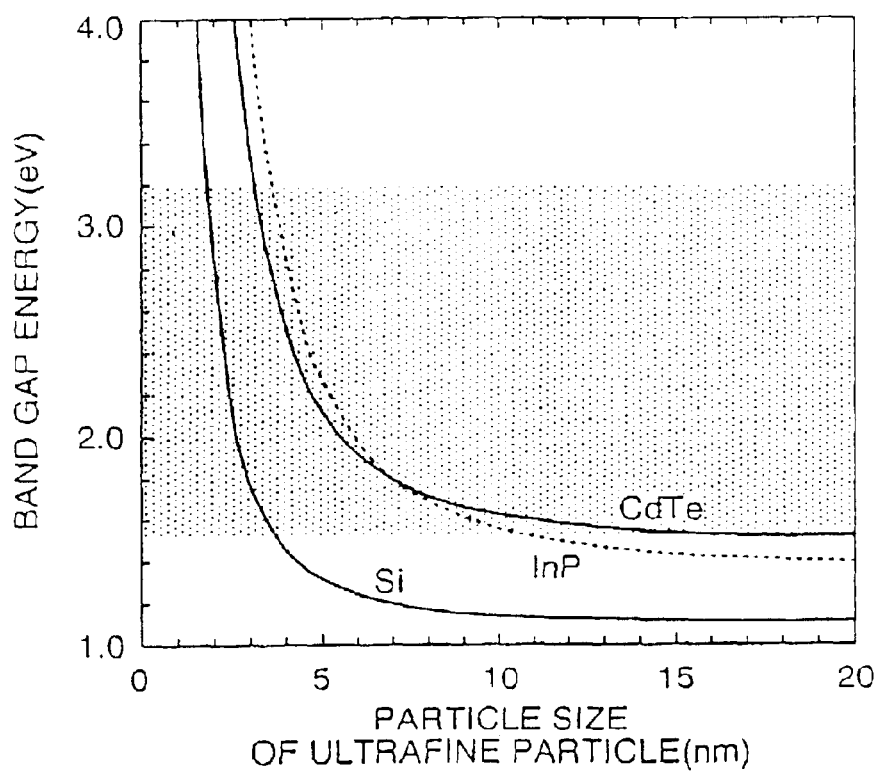
FIG. 6 is a characteristic chart depicting the relationship between the particle size of ultrafine particles and the band gap energy of the light-emitting device.

FIG. 6A shows the band gap energy from various kinds of semiconductor ultrafine particles that have been computed theoretically on the principle of the quantum confinement effect in the region where the effective mass approximation is satisfied. It is apparent from this figure that the particle sizes given in Table 2 should be selected to ensure light emission in the visible light region.

TABLE 2

| Semiconductor Material | | de Broglie Wavelength (nm) | Diameter of Ultrafine Particles to Ensure Quantum Confinement Effect (nm) |
|---|---|---|---|
| Group IV | Si | 2.23 | 5 or smaller |
|  | Ge | 3.26 | 5 or smaller |
| Group III-V | InP | 10.0 | 20 or smaller |
|  | GaAs | 10.4 | 20 or smaller |
|  | InSb | 48.7 | 100 or smaller |

Figure 6B:
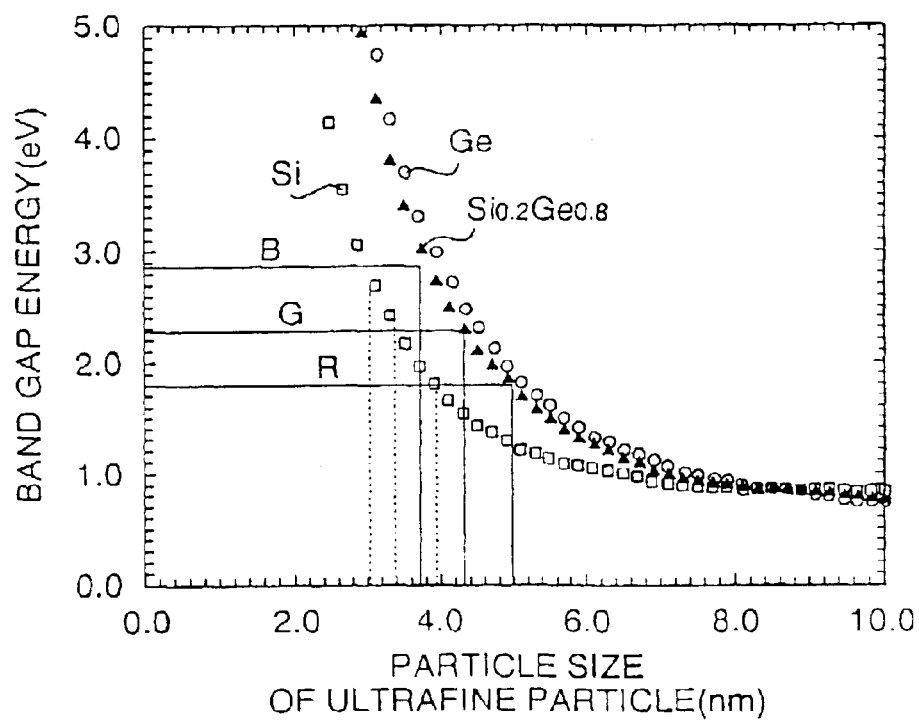

FIG. 6B shows the band gap energy from spherical ultrafine particles of Si, Ge and Si—Ge that have been computed theoretically on the principle of the quantum confinement effect in the region where the effective mass approximation is satisfied. It is apparent from this figure that light emission of three primary colors (RGB) with, for example, Si simple substance ultrafine particles can be accomplished by controlling the particle size in the range of 2.8 nm to 4.0 nm. That is, red light can be emitted with the diameter of 4.0 nm, and green light with the diameter of 3.2 nm.

A diameter of 2.8 nm corresponds to blue, but it is actually very difficult to control the size in the 2-nm range in diameter. What is more, as mentioned above, the efficiency of excitation of electron-hole pairs by impact ionization becomes lower toward the higher energy side. Further, the ratio of the surface atoms of ultrafine particles with a diameter of in the 2-nm range reaches about 70%, so that surface defects and the influence of the resulting surface level cannot be neglected. It can therefore be said that generation of a blue light by the quantum confinement effect in the Si ultrafine particles 14 is not easy.

In view of the above, in order to generate a blue color with the Si ultrafine particles 14 as an active light-emitting layer, it is effective, as the second scheme, to reconstruct the molecular arrangement of the surface oxide film at the interface between the Si ultrafine particles 14 and the surface oxide film and form the luminescence center corresponding to the blue light photon energy. More specifically, emission of blue light becomes possible by designing the topmost surface of the ultrafine particles 14 to have a chain-like polysiloxane structure (chain-like polysilane skeleton).

In the case of a compound semiconductor, emitted photon energy can be controlled by reconstructing the molecular arrangement of an oxide film, if the ultrafine particles of the compound semiconductor can be oxidized, and another kind of dielectric film if oxidization is not possible.

Second Embodiment

The principle structure of another light-emitting device using an optoelectronic material according to this invention will now be described as the second embodiment with reference to FIG. 7.

Figure 7:
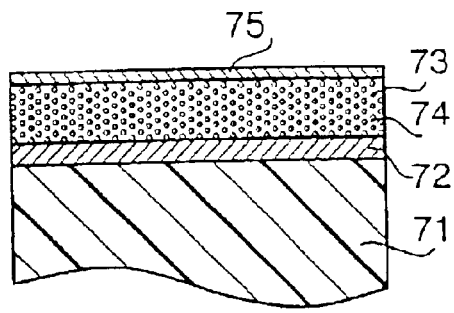
FIG. 7 is a cross-sectional structural view of a light-emitting device according to the second embodiment of this invention.

FIG. 7 shows the cross-sectional structure of a light-emitting device according to this embodiment. In FIG. 7, formed on the surface of an Si single crystal substrate 71 as one example is a tungsten silicide layer 72 of 50 nm in thickness, also shown as one example, which is a lower electrode. Formed on the tungsten silicide layer 72 is a dielectric layer ($SiO_2$) 74 of 50 nm in thickness, in which group IV semiconductor ultrafine particles with particle sizes controlled on the nm order, SiGe mixed crystal ($Si_{0.2}Ge_{0.3}$) 73 with a mole ratio of 0.2:0.8, are dispersed. Adhered to the top of the dielectric layer 74 with the semiconductor ultrafine particles 73 dispersed therein is a 150-nm thick indium-tin oxide (ITO) layer 75, shown as one example of an upper transparent electrode, with a visible light transmittance of 90% or greater. The composition of this ITO was $In_2O_3$–(about 10 mol %) $SnO_2$.

Although the tungsten silicide layer 72 serves as a low-resistance section of the lower electrode and a reflection layer to secure the forward reflectance of light generated by the semiconductor ultrafine particles, titanium silicide can also be used if priority is to a lower resistance. If the low resistance of the electrode and the forward light reflectance are not needed so much, the surface of the Si substrate 71 may be made as an n-type high-concentration diffusion layer which is allowed to serve as the lower electrode. This structure is effective from the viewpoint of manufacturing cost.

Further, aluminum oxide ($Al_2O_3$) or the like may be used as the dielectric material.

Furthermore, a thin magnesium (Mg) film having a thickness of about 20 nm may be provided in a middle of the tungsten suicide layer 72 and the semiconductor-ultrafine-particles dispersed dielectric layer 74 to reduce the height of the electric barrier at the (metal electrode/oxide) interface. This is effective in efficiently accomplishing tunneling-induced carrier injection of electrons into the oxide film (the semiconductor-ultrafine-particles dispersed dielectric layer 74 here).

A light-emitting device having a transmitting property is acquired by using a transparent or semitransparent thin film as the lower electrode, in which case it is desirable to use a material having a lower visible light transmittance than the upper electrode.

A description will now be given of the light emission operation of the light-emitting device having the above-described structure. First, the tungsten silicide layer 72 of the lower electrode is grounded, and 12.0 V from an unillustrated positive supply voltage is applied to the ITO film 75 as the upper transparent electrode. At this time, an electric field with an intensity of about $10^6$ V/cm is applied, on the average, to the $SiO_2$ portion of the semiconductor-ultrafine-particles dispersed dielectric layer 74. Generally, the insulation breakdown voltage of the $SiO_2$ film is about $10^7$ V/cm, and with the field intensity of 10% thereof, the tunneling-induced injection of carrier electrons and electric conduction occur. The electrons in the $SiO_2$ film are accelerated to increase their kinetic energy, which however starts being scattered due to the mutual influence with acoustic phonon. The increase in kinetic energy therefore tends to become saturated and stable.

The traveling distance required in the acceleration of electrons and the saturation of the velocity at the intensity of about $10^6$ V/cm is about 10 nm, the mean kinetic energy of the electrons in the $SiO_2$ film at each field intensity is approximately 2.0 eV at $2.0 \times 10^6$ V/cm, 3.0 eV at $5.0 \times 10^6$ V/cm and 4.0 eV at $8.0 \times 10^6$ V/cm. The distribution of the kinetic energy after velocity saturation tends to become wider as the field intensity increases, and particularly tends to draw a hem toward a higher energy side.

A description will now be given of a phenomenon when electrons traveling in the $SiO_2$ film of the semiconductor-ultrafine-particles dispersed dielectric layer 74 in such a manner collide against the surface of the group IV semiconductor ultrafine particles 73.

Assuming Si, Ge or Si—Ge mixed crystal as the group IV semiconductor ultrafine particles, the band gap energy (Eg) is 1.10 eV for Si at maximum. Since electrons accelerated in the traveling distance of 10 nm or greater at the field intensity on the order of $10^6$ V/cm have kinetic energy of 2.0 eV or larger as mentioned above, it is fully possible to excite electron-hole pairs at the Si surface by impact ionization. Specifically, the quantum efficiency γ" (the number of generated electron-hole pairs/the number of collided electrons) in this process is about 0.1 at the mean kinetic energy of electrons Eav=2.0 eV, but it drastically increases as E rises and reaches γ"=1.0 at Eav=4.0 eV and γ"=2.0 at Eav=8.0 eV. Such excited electron-hole pairs demonstrated light emission according to the band gap Eg in the process of recombination by which the operation of the light-emitting device according to this embodiment was confirmed.

As a group IV semiconductor is an indirect transition type by nature and the presence of phonon is essential in the interband transition. Much heat is inevitably generated in the recombination process and the probability of radiative recombination is very rare. However, ultrafine particles with particle sizes of several nm order as in this embodiment would provide effects, such as the relaxation of the wave number selecting rule and an increase in oscillator strength in the interband transition. This increases the probability of occurrence of the radiative recombination of electron-hole pairs, thus allowing strong light emission to be demonstrated.

Further, the band structure changes, due to mixed crystallization, as a change in shape in the space of energy (E)-wave number (k) as well as a change in the value of the absorption end energy, thus facilitating the relaxation of the wave number selecting rule at the time of designing ultrafine particles. That is, there is an effect of making radiative recombination easier. This is, we thin, because the bottom of the conduction band is in the vicinity of point X in the E-k space for the simple substance of Si and the bottom of the conduction band is in the vicinity of point L for the simple substance of Ge, whereas the bottom of the conduction band (minimum energy point) is formed in a midpoint of the points X and L in the case of Si—Ge mixed crystal, and when the composition ratio is $Si_{0.2}Ge_{0.8}$, particularly, the minimum conduction band energy is formed in the vicinity of point Γ (maximum valence band energy).

Control on the luminescence wavelength (luminescence photon energy) should be carried out by using the phenomenon of the band gap Eg increasing due to the quantum confinement effect, which is illustrated in the first embodiment (see FIG. 6) of this invention.

Specifically, the required luminescence wavelength can be obtained by adjusting the particle sizes of the group IV semiconductor ultrafine particles 73. For Si—Ge mixed crystal, a change in band gap Eg by the composition ratio can be utilized. As regards Si—Ge mixed crystal ultrafine particles, the composition ratio provides a characteristic curve between the characteristic curves for the simple substance of Si and the simple substance of Ge shown in FIG. 6. The Si—Ge mixed crystal ultrafine particles with a molar composition ratio $Si_{0.2} Ge_{0.8}$, typically used in this embodiment, provide the characteristic curve of particle size v.s. band gap energy shown in FIG. 6.

As the internal quantum efficiency γ' (the number of discharged photons/the number of electron-hole pairs) is about 0.5%, if the use at about E=4.0 eV and γ"=1.0 is the standard device operating condition, the external quantum efficiency γ=γ' γ" of about 0.5% is secured.

Of course, a simple substance or mixed another of another kind or another composition ratio may be used for the optoelectronic material. For example, a group III–V compound, such as a gallium-arsenide (Ga—As) which is a direct transition type semiconductor, or a group II–VI compound like cadmium sulfide (CdS) may be used as well.

Although the use of $SiO_2$ (band gap energy: about 9 eV) for the dielectric layer of the semiconductor-ultrafine-particles dispersed dielectric layer 74 is assumed, an applied voltage of about 12.0 V limits the current density acquired. If the injection electron density or the emission intensity has priority, therefore, it is effective to replace it with a transparent conductive thin film having a specific resistance substantially the same as, or greater than, the specific resistance of ultrafine particles to be dispersed, such as a thin film of conductive transparent material, tin oxide ($SnO_2$), titanium oxide ($TiO_2$) or indium oxide ($InO_2$).

Third Embodiment

The structure of a monochrome display according to this invention will be described below as the third embodiment referring to FIG. 8.

Figure 8A:
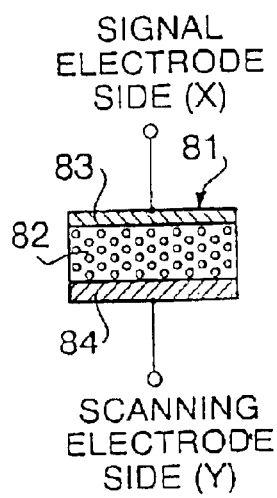
FIGS. 8A through 8C are structural diagrams of a monochrome display device according to the third embodiment of this invention.

FIG. 8 show the cross-sectional structure of one pixel portion (unit pixel portion) of a monochrome display according to this embodiment, its equivalent circuit and an array circuit of pixels. In FIG. 8A, a light-emitting device similar to that of the second embodiment is used as a device 81 for one pixel of the monochrome display device. Of course, the light-emitting device as described in the section of the first embodiment may be used as well.

Figure 8B:
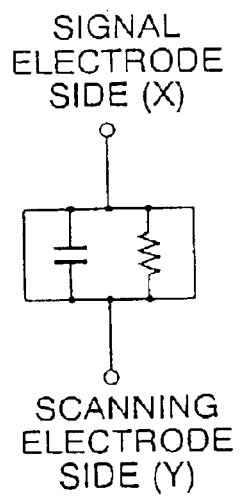

A thin film of ITO having a visible light transmittance of 90% or greater was used for an upper electrode 83 and a thin film of tungsten silicide was used for a lower electrode 84 to improve the forward reflection of luminescence energy and ensure a low resistance. In the light-emitting device of the first embodiment, the semitransparent electrode 16 corresponds to the upper electrode 83, and the backside electrode 17 corresponds to the lower electrode 84. The equivalent circuit may be considered as a capacitor and a resistor connected in parallel as shown in FIG. 8B.

For the group IV semiconductor ultrafine particles, Si—Ge mixed crystal with a composition ratio Si:Ge=0.2:0.8 was used and the mean particle size was set to 4.2 nm. In the light-emitting device according to the first embodiment, its optoelectronic material is to be used. The band gap energy then is 2.27 eV (see FIG. 6) and shows clear green.

Figure 8C:
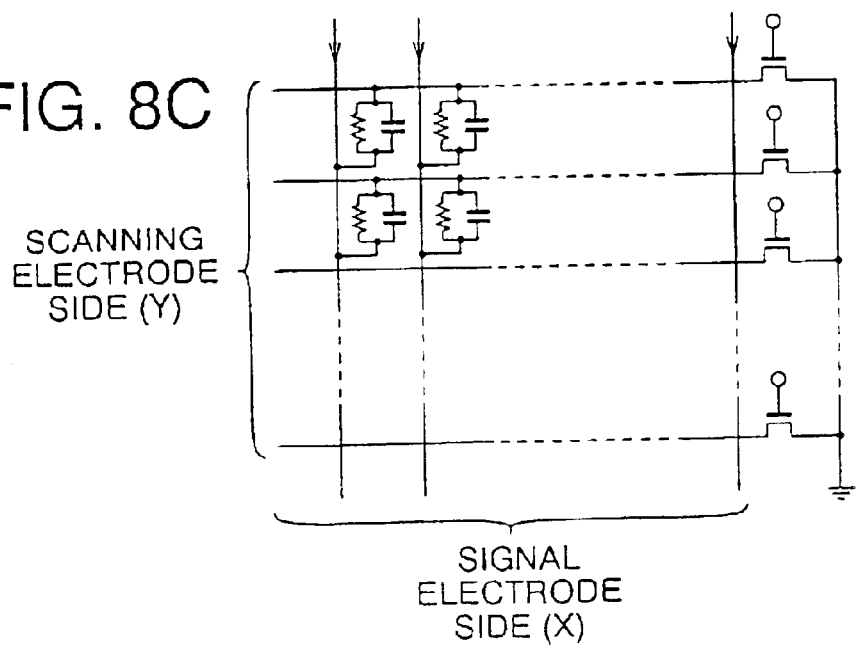

Then, a monochrome display panel constituted by regularly arranging the aforementioned pixels in a lattice form and in a matrix form as shown in FIG. 8C was prepared.

According to this embodiment, a multiplex drive system which effects driving in a common electrode divisional manner and time divisional manner was employed as the basic drive system, and a simple matrix drive system which does not require connection of an active device was used for each pixel. The X-Y matrix type display panel with such a structure was operated by enabling conducting gates to connector terminals added to one side of the scan (Y) electrode in a sequential scanning fashion and applying a select/non-select voltage corresponding to the display pattern and the set contrast to the other signal (X) electrode. Since the display pixels according to this embodiment have a non-memory property, the entire screen is formed by repeating the scanning on the scan (Y) electrode side and the accumulated response effect.

The above-described embodiment could provide a monochrome display panel whose pixels each have a very fast response (1-microsecond order) and which emits clear green light and is thus most suitable for a small display device particularly of one inch or smaller.

If a further improvement on the image quality is needed, it is needless to say that an active matrix drive method which has a driver MOS transistor added to each pixel is effective.

Fourth Embodiment

Figure 9:
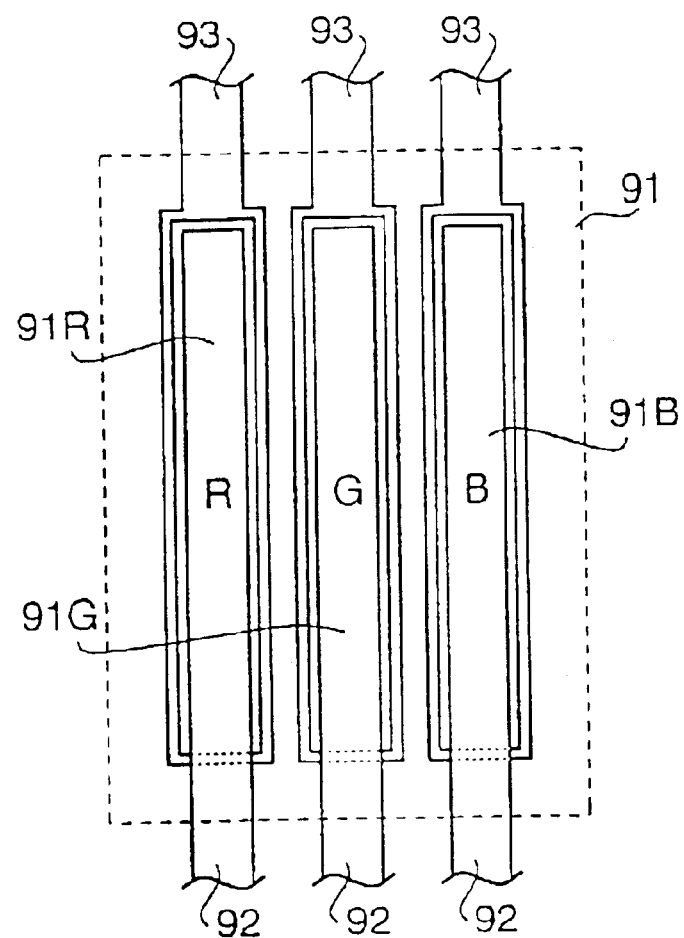
FIG. 9 is a structural diagram of a color display device according to the fourth embodiment of this invention.

The structure of a color display according to this invention will be described below as the fourth embodiment referring to FIG. 9. FIG. 9 illustrates a conceptual diagram of the structure of one pixel (unit device) of a color display according to this embodiment.

A device equivalent to one pixel of the color display device according to this embodiment is basically comprised of three types of light-emitting devices having the same structure as that of the first embodiment or that of the second embodiment as one set, and they are arranged like stripes as a geometrical shape.

A thin film of ITO having a visible light transmittance of 90% or greater was used for an upper electrode 92 and a thin film of tungsten silicide was used for a lower electrode 93 to improve the forward reflection of luminescence energy and ensure a low resistance. When the light-emitting device of the first embodiment is used, the correlation is the same as the one that has been described in the section of the third embodiment.

According to this embodiment, three types of light-emitting devices one of which emits light of one of the three primary colors and which have different mean particle sizes of group IV semiconductor ultrafine particles are grouped together to permit one pixel 91 to emit lights of all the three primary colors. Those three kinds of light-emitting devices are respectively a light-emitting device 91R for red, a light-emitting device 91G for green and a light-emitting device 91B for blue.

For the group IV semiconductor ultrafine particles which play the major role in light emission, as in the previously-described embodiment, Si—Ge mixed crystal with a composition ratio Si:Ge=0.2:0.8 was used. If the light-emitting device according to the first embodiment is used, its optoelectronic material is to be used. The mean particle size and luminescence photon energy of the three kinds of light-emitting devices which constitute one pixel were set to 4.8 nm and 1.77 eV for the red light-emitting device 91R, 4.2 nm and 2.27 eV for the green light-emitting device 91G and 3.6 nm and 2.84 eV for the blue light-emitting device 91B (see FIG. 6).

The color display pixels 91 each constituted of a set of those three kinds of light-emitting devices were arranged on a plane in a matrix form, and the emission intensity and color of each pixel were adjusted by a change in the excitation current of each of the light-emitting devices which constitute each pixel. As a result, color display could be accomplished by additive mixture of the three primary colors emitted from the three kinds of light-emitting devices.

Further, it is possible to realize very minute color display pixels 91 each having a size of 1 to 100 $\mu$m, as compared with the conventional color display pixels. The lower limit of the size of the display pixels was the diffraction limit. That is, with the wavelength of visible light ($\lambda^*$) being 500 nm and the maximum of the NA of the optical system being 0.5, the diffraction limit (=$\lambda$/NA) becomes 1 $\mu$m.

Although a semiconductor material of a group IV or the like and a dielectric substance like $SiO_2$ have been discussed in he foregoing description of the individual embodiments, other metals, semiconductors or dielectric substances can of course be used singularly or in combination, as needed, according to the usage.

The optoelectronic material layer in the third embodiment or the fourth embodiment has been described as what is obtained in the first embodiment or the second embodiment, a light-emitting device using an optoelectronic material layer containing another ultrafine particles may be used as well.

Fifth Embodiment

Figure 10:
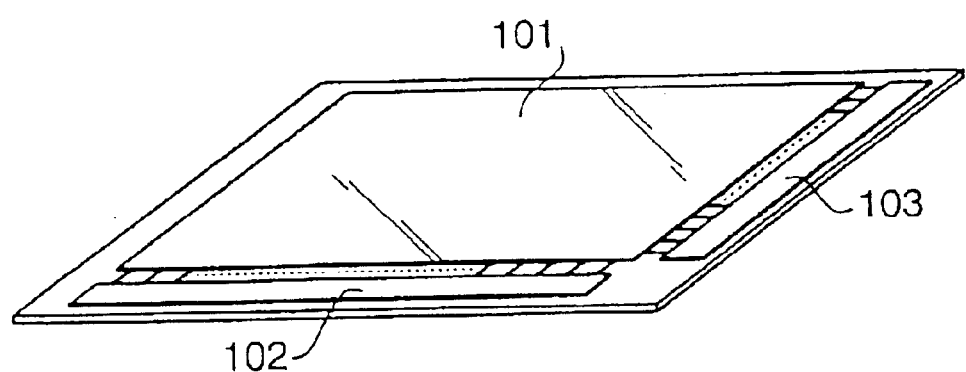
FIG. 10 is a conceptual diagram showing the essential structure of a portable display apparatus according to the fifth embodiment of this invention.

The principle structure of a portable display apparatus according to this invention will now be described as the fifth embodiment with reference to FIG. 10. FIG. 10 shows a conceptual diagram of the main structure of the display apparatus which comprises a display screen 101, a row decoder 102 and a column decoder 103.

The display screen 101 has the color display pixels 91 each constituted of a set of three kinds of light-emitting devices, shown in FIG. 9, arranged on a plane in a matrix form, and adjusts the emission intensity and color of each pixel by changing the excitation currents of the individual light-emitting devices constituting each pixel in accordance with signals from the row decoder 102 and the column decoder 103. In the case of monochromatic display, only the emission intensity is to be adjusted.

As such a color display device uses self light-emitting devices comprised of minute pixels, low dissipation power and high resolution are possible. In the case of a display apparatus of about one inch, which is used in the conventional HMD, for example, over million pixels can be realized in color display.

Further, by forming the above structure on an Si substrate to accomplish large scale integration, it is possible to make the apparatus as thin as about 1 mm and ensure assembly free and matching with the existing LSI technology, so that the apparatus can be suitably used as a portable display apparatus.

Sixth Embodiment

An HMD (Head mounted display) as a specific application device of the portable display apparatus according to this invention will now be discussed as the sixth embodiment with reference to FIGS. 11 and 12.

Figure 11A:
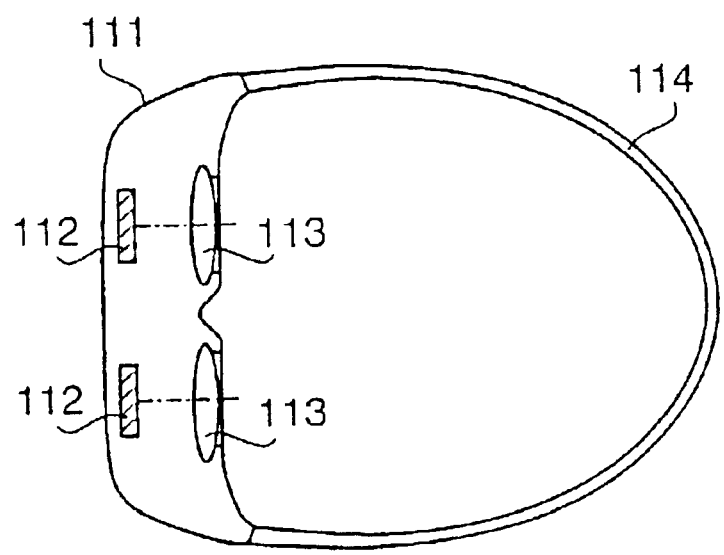
FIGS. 11A and 11B are cross-sectional structural views of an HMD according to the sixth embodiment of this invention.
Figure 11B:
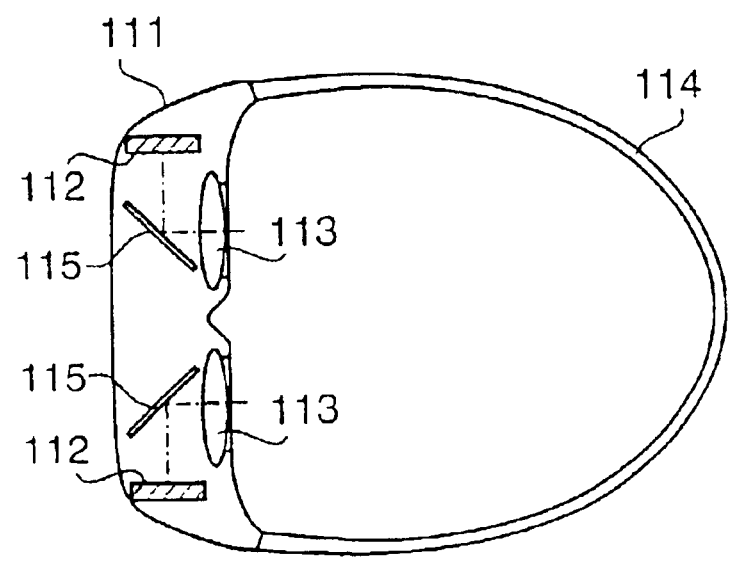

FIG. 11A presents the structural cross-sectional view of the HMD, which comprises a casing 111, display apparatuses 112 for the right and left eyes, incorporated in the case 111, ocular optical systems 113 and a belt section 114 for attaching the casing 111 to a head. Images for the right and left eyes from the display apparatuses 112 are formed on the respective eyes of a user by the ocular optical systems 113. FIG. 11B shows the structural cross-sectional view of a see through type HMD, with two half mirrors 115 and the rest being the same as that in FIG. 11A.

Images for the right and left eyes from the display apparatuses 112 are reflected by the half mirrors 115, are guided to the ocular optical systems 113, and are formed on the respective eyes of the user. Since outside light which has passed through the half mirrors 115 also reach the user's eyes, the see through function is given.

In either case, the use of the display apparatus in FIG. 10 for the display apparatuses 112 can accomplish downsizing and weight reduction and can provide the HMD with more than ten times the resolution of an HMD which uses the conventional LCDs. Further, it can be adapted to HMDs for the use of flight simulators or the like, which demand fast response and high reliability.

If the above-described is formed on a transparent member like glass using light-emitting devices having transparency, which are obtained by using a transparent or semitransparent thin film for the lower electrode in the light-emitting device of the first embodiment or the second embodiment, a see through type display apparatus can be realized. The use of the apparatus requires no half mirrors or the like and can made a see through type HMD more compact and lighter.

Figure 12:
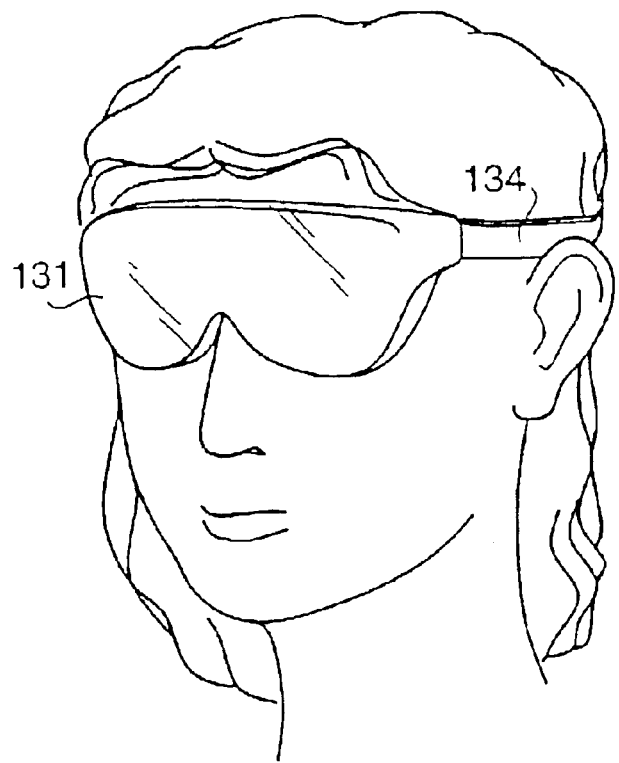
FIG. 12 is a perspective view of the glasses type HMD mounted.

FIG. 12 presents a perspective view showing an ocular type HMD having the structure in FIG. 11A or FIG. 11B in use. Because of lighter and more compact design, the user can wear it easily and can use it for a long period of time.

Although the foregoing description has been given of an HMD capable of ensuring three-dimensional display by displaying right and left images separately, an HMD which uses only a single display apparatus to view images of an ordinary TV, video or the like can also be realized.

Seventh Embodiment

Figure 13:
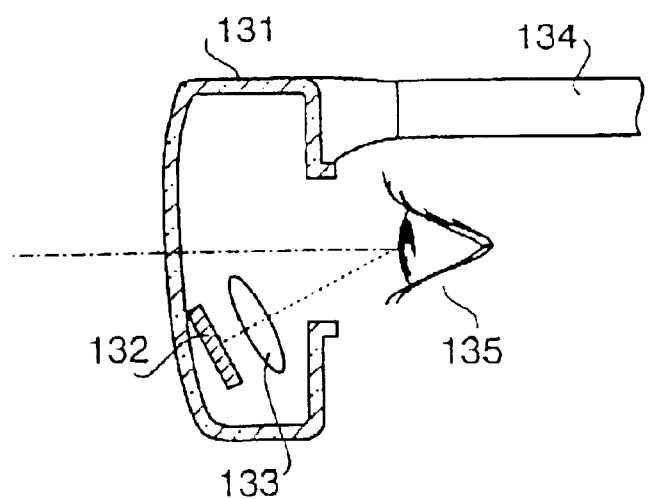
FIG. 13 is a cross-sectional structural view of an HMD according to the seventh embodiment of this invention.

Another structure of an HMD as a specific application device of the portable display apparatus according to this invention will now be discussed as the seventh embodiment with reference to FIG. 13. FIG. 13 shows another structural cross-sectional view of an HMD according to this invention, which comprises a casing 131, display apparatuses 132 and ocular optical systems 133, incorporated in the case 111, and a belt section 134 which attaches the casing 131 to a head. Images from the display apparatuses 132 are formed on the eyes of a user by the ocular optical systems 133.

With the above structure, the user can see the outside view when directing the line of sight to the front or upward to observe outside, and can view high-definition images from the display apparatuses when shifting the line of sight downward. That is, the user can separately or simultaneously see the outside view and high-definition images from the display apparatuses simply by shifting the line of sight without moving the head.

In the medical field, for example, sending images or the like representing the state of an operator from the display apparatuses during a surgical operation can allow the operator to acquire information without moving the head, thus significantly improving the work efficiency and precision. This effect is also true of the inspection or the like of minute parts.

Although the display apparatuses are incorporated in the lower portion of the casing in this embodiment, they may be incorporated in the upper portion or side portions of the casing with quite the same function, depending of the direction of a work target.

The use of the display apparatuses in FIG. 10 as display apparatuses for electronic dictionaries can not only accomplish size and weight reduction, but also provide electronic dictionaries having more than ten times the resolution of the conventional electronic dictionaries using an LCD. Accordingly, it is possible to display the explanation of a single word consisting of several lines with the size of the existing electronic dictionaries and to provide as easy a view as paper dictionaries.

Although an HMD and an electronic dictionary have bee illustrated above as applications of the portable display apparatus of this invention, the apparatus can of course be adapted to many portable units, such as a portable video phone and a portable terminal.

Eighth Embodiment

The principle structure of an optoelectric conversion device using an optoelectronic material according to this invention will now be described in detail as the eighth embodiment with reference to FIG. 14.

According to this embodiment, as in the first embodiment, a description will be given of an electromotive force type photodetector in which a light-receiving (active) region is an optoelectronic material layer having ultrafine particles of Si, a typical one of group IV semiconductors, with its surface covered with its own thermal oxide film, dispersed in a substantially uniform transparent medium with a controllable conductivity or dielectric constant.

Figure 14:
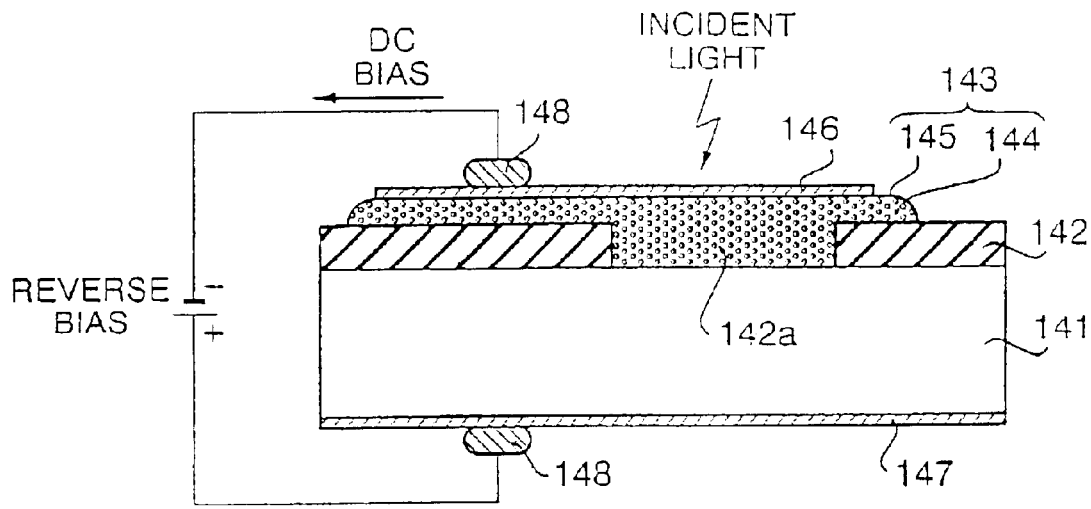
FIG. 14 is a cross-sectional structural view of an optoelectric conversion device according to the eighth embodiment of this invention.

FIG. 14 shows the cross-sectional structure of an optoelectric conversion device using an optoelectronic material according to this embodiment. In FIG. 14, "141" is a substrate, as one example of which an n-type Si substrate having a plane orientation (100), a phosphorus-doped n-type conductivity, and a specific resistance of 0.02 to 0.05 $\Omega \cdot cm$ was used. An isolation insulator film 142, which is an $SiO_2$ film as one example, is formed 100 nm thick on the top surface of this n-type Si substrate 141. This isolation insulator film 142 has an opening 142a of about 1 to 10 mm in diameter formed at the portion which should be the light-receiving (active) region of the optoelectric conversion device, exposing the surface of the substrate 141.

An optoelectronic material layer 143 is deposited so as to cover at least the opening 142a. As mentioned earlier, this optoelectronic material layer 143 is formed of Si ultrafine particles 144 dispersed in a transparent medium 145. The structure of this optoelectronic material layer 143 is the same as that of the optoelectronic material layer 13 which has been discussed in the section of the first embodiment. That is, the Si ultrafine particles 144 have substantially spherical shapes, the same crystal structure as bulk Si, and an n-type conductivity with phosphorus doped at a concentration of approximately $10^{16}$ to $10^{18}$ cm$^{-3}$, with the particle size adjusted to about 3 to 10 nm. This optoelectronic material layer 143 has a thickness of about 150 nm. Further, the surfaces of the Si ultrafine particles 144 are covered with an unillustrated SiO$_2$ film whose thickness should be 3 nm or thinner, for example.

The transparent medium 145 is a uniform thin film which has a high transmittance in the visible light region and has a controllable conductivity or dielectric constant, and a thin SnO$_2$ film was used here as one example. This thin SnO$_2$ film has a visible light transmittance of 80% or higher, and its conductivity or dielectric constant can be controlled by adjusting its forming conditions (substrate temperature, a oxygen's partial pressure, etc.). It is suitable that the specific resistance of the medium is about the same as, or equal to or greater than, the specific resistance of ultrafine particles to be dispersed. With the specific resistance Si of 0.02 to 0.05 Ω·cm, the specific resistance of the thin SnO$_2$ film was set to 0.1 to 1Ω here.

The packing fraction of the Si ultrafine particles 144 in the optoelectronic material layer 143 was set to 20% in order to effectively perform quantum trapping as mentioned in the section of the first embodiment, thus forming a uniform ultrafine-particles dispersed transparent medium as defined in the section of the first embodiment.

A semitransparent electrode 146 of Pt and 10 nm in thickness, as one example, contacts the top surface of the optoelectronic material layer 143, forming so-called Schottky junction, in an electric sense, to the optoelectronic material layer 143 including the transparent medium 145 with the controlled conductivity. A backside electrode 147 of Ag as one example is provided at the bottom surface of the substrate 141, forming ohmic contact, in an electric sense, to the substrate 141. Further, a thin Mg film having a thickness of about 20 nm may be provided between the substrate 141 and the backside electrode 147 to reduce the height of the electric barrier at the interface. The electrodes 146 and 147 may be formed of one of Mg, indium, aluminum, gold, tungsten, molybdenum, tantalum, titanium, cobalt, nickel and palladium or the like, instead of Pt and Ag.

The semitransparent electrode 146 and the backside electrode 147 are connected to a power supply, as needed, by wire leads or the like via a conductive paste 148 or the like. It is suitable that the light-receiving (active) region should be avoided as the position of the semitransparent electrode 146 which is to be connected to the power supply or the position of the conductive paste 148.

Although Si is used as a material for the ultrafine particles which constitute the optoelectronic material layer, another group IV semiconductor, such as Ge or its mixed crystal, is suitably usable, or a group III–V or a group II–VI compound semiconductor may be used, as discussed in the section of the first embodiment. While a thin SnO$_2$ is used as the uniform transparent medium, another thin conductive film or thin dielectric film having a specific resistance substantially the same as, or greater than, the specific resistance of ultrafine particles to be dispersed, may be used as well. For example, the specific resistance of ultrafine particles should be controlled within the range of approximately 1 to $10^{-3}$ Ω·cm by the impurity concentration, and the specific resistance of the transparent medium should be controlled within the range of approximately $10^2$ to $10^{-2}$ Ω·cm in accordance with the specific resistance of the ultra fine particles. Although the Si ultrafine particles are covered with an oxide film, the oxide film may be omitted by a combination of ultrafine particles and a transparent medium as shown in Table 1 in the section of the first embodiment.

The operational principle of the photoelectromotive force type photodetector with the above-described structure will be discussed below. To begin with, for the operation of the photodetector using the optoelectronic material of this embodiment, a negative DC bias is applied to the semitransparent electrode 146 with respect to the backside electrode 147. With this device structure, a strong rectifying characteristic due to Schottky junction at the interface of the semitransparent electrode 146 and the optoelectronic material layer 143 is shown as illustrated in FIG. 2A in the first embodiment, and this reverse bias should be approximately several volts to several tens of volts.

When light having greater photon energy than the band gap energy of the Si ultrafine particles 144 is irradiated on the optoelectronic material layer 143 under this situation, carriers of electron-hole pairs are generated in the Si ultrafine particles 144, and the produced electrons move toward the optoelectronic material layer 143 and the holes toward the semitransparent electrode 146. Consequently, photoelectromotive force is produced at the Schottky junction formed by the semitransparent electrode 146 and the optoelectronic material layer 143. The light-receiving function is provided by detecting this photoelectromotive force.

With the structure of the photodetector using the optoelectronic material of this embodiment, as has been discussed in the section of the first embodiment using FIG. 1C, rendering the upper half of the optoelectronic material 143 to be a high-concentrate n-type and rendering the lower half thereof to be a low-concentrate p-type provides an ohmic-like contact between the optoelectronic material layer 143 and the semitransparent metal electrode 146 and forms p-n junction in the center of the optoelectronic material layer 143.

The structure of a photodetector having p-n junction, as one example, will now be discussed. As the substrate, a p-type Si substrate having a plane orientation (100), a boron-doped p-type conductivity, and a specific resistance of 10 Ω·cm was used. The low-concentrate p-type region at the lower portion of the optoelectronic material layer is formed by dispersing Si ultrafine particles in a transparent medium. The Si ultrafine particles have substantially spherical shapes, the same crystal structure as bulk Si, and a p-type conductivity with boron doped at a low concentration, with the particle size adjusted to about 3 to 10 nm. Further, a thin SiO$_2$ film was used as one example of the transparent medium, and the packing fraction of the Si ultrafine particles was set to about 20%. This p-type ultrafine-particles deposition layer has a thickness of about 100 nm. As the low-concentrate p-type region and the substrate are both of a p-type, an electric barrier is not formed at their interface.

The high-concentrate n-type region at the upper portion of the optoelectronic material layer has the same structure as the optoelectronic material layer 143 in FIG. 14, and its thickness was set to approximately 50 nm. A high-concentrate doped n-type was provided by boron is introduced by ion injection when the deposition of this n-type region is completed. The ion injection conditions then were acceleration energy of 20 keV and a dose of $5 \times 10^{15}$ cm$^{-2}$.

With the above structure, when light having greater photon energy than the band gap energy of the Si ultrafine particles 144 is irradiated on the optoelectronic material layer 143 with a reverse bias voltage (the semitransparent electrode 146 being positive with respect to the substrate 141) applied, carriers of electron-hole pairs are generated in the Si ultrafine particles 144. The minor carriers are mutually accelerated in the optoelectronic material layer 143, the electrons toward the high-concentrate n-type region and the holes toward the low-concentrate p-type region, thus generation photoelectromotive force at the p-n junction. This p-n junction has an advantage of having a smaller dark current over the Schottky junction structure.

Since the band gap energy of Si is 1.1 eV (the light-emitting wavelength limit is 100 nm), bulk Si has a light reception sensitivity almost over the entire visible light region. A description will now be given of how to control the light-emitting wavelength region in the optoelectric conversion device of this embodiment.

To begin with, the first scheme adjusts the particle size (size) of the main body of the Si ultrafine particles 144 and directly changes the band gap width by the quantum confinement effect that happens at that time. The size of ultrafine particles which brings about the quantum confinement effect differs depending on the materials as shown in Table 2. For Si simple substance ultrafine particles, for example, the diameter of 4.0 nm is for red, the diameter of 3.2 nm for green, and diameter of 2.8 for blue as the absorption end region, as shown in FIG. 6. With the diameter of the Si single substance ultrafine particles set to 3 nm or smaller, therefore, it is possible to realize a photodetector having a sensitivity on the higher energy side than the blue region without using a color filter.

As mentioned in the section of the first embodiment, however, it is actually very difficult to control the diameter in the 2-nm range. What is more, the ratio of the surface atoms of ultrafine particles with a diameter in the 2-nm range reaches about 70%, so that surface defects and the consequential influence of the surface level cannot be neglected.

It is therefore effective, as the second scheme, to reconstruct the molecular arrangement of the surface oxide film at the interface between the Si ultrafine particles 144 and the surface oxide film and form the center of local light emission corresponding to, for example, the blue photon energy. More specifically, the light reception sensitivity in the blue region is improved by designing the topmost surface of the ultrafine particles 144 to have a chain-like polysiloxane structure (chain-like polysilane skeleton).

In the case of a compound semiconductor, the light-receiving wavelength region can be controlled by reconstructing the molecular arrangement of an oxide film, if the ultrafine particles of the compound semiconductor can be oxidized, or the molecular arrangement of another kind of dielectric film if oxidization is not possible.

An ultraviolet detector or a blue-color sensor comprising a group IV semiconductor, which requires no filter or the like, can be constructed by using optoelectric conversion device according to this embodiment that has the above-described light-receiving characteristics.

Further, as apparent from the above description and the foregoing description of the first embodiment, the optoelectric conversion device using the optoelectronic material of this embodiment has a function as a photodetector. That is, when a negative DC bias is applied to the backside electrode 147 with respect to the semitransparent electrode 146, hot electrons are injected to the optoelectronic material layer 143, thereby exciting electron-hole pairs. The excited electron-hole pairs demonstrate light emission according to the band gap energy of the ultrafine particles in the recombination process. It is therefore possible to provide an optoelectric conversion device which can effect light emission and reception with the same structure.

Ninth Embodiment

The principle structure of another optoelectric conversion device according to this invention will now be described in detail as the ninth embodiment with reference to FIG. 15.

According to this embodiment, as in the first embodiment, a description will be given of a photoconductive type photodetector in which a light-receiving (active) region is an optoelectronic material layer having ultrafine particles of Si, a group IV semiconductor, with its surface covered with its own thermal oxide film, dispersed in a substantially uniform transparent medium with a controllable conductivity or dielectric constant.

Figure 15:
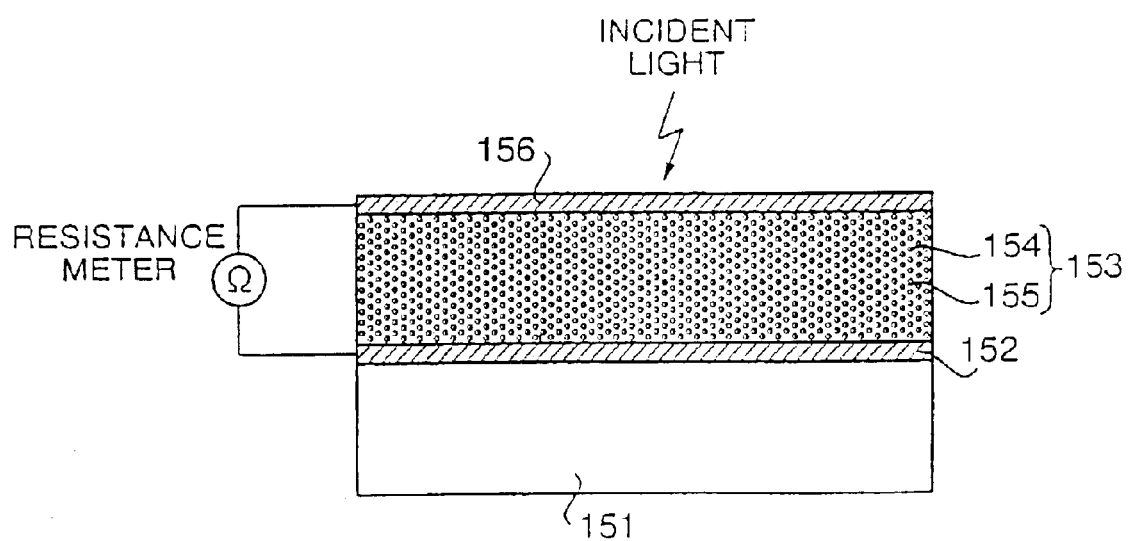
FIG. 15 is a cross-sectional structural view of an optoelectric conversion device according to the ninth embodiment of this invention.

FIG. 15 shows the cross-sectional structure of an optoelectric conversion device using an optoelectronic material according to this embodiment. In FIG. 15, "151" is a substrate, as one example of which a glass substrate was used. A lower electrode 152 of Pt, as one example, is formed on the top surface of this glass substrate 151. An optoelectronic material layer 153 is deposited on the top surface of this lower electrode 152. As mentioned earlier, this optoelectronic material layer 153 is formed by dispersing Si ultrafine particles 145 in a transparent medium 155. This Si ultrafine particles 154 have substantially spherical shapes, the same crystal structure as bulk Si, and an n-type conductivity with boron doped at a low concentration, with the particle size adjusted to approximately 3 to 10 nm. The transparent medium 155 is a uniform thin film which has a high transmittance in the visible light region and has a controllable conductivity or dielectric constant, and a thin $SnO_2$ film was used here as one example. This thin $SnO_2$ film has a visible light transmittance of 80% or higher, and its conductivity or dielectric constant can be controlled by adjusting its forming conditions (substrate temperature, a oxygen's partial pressure, etc.).

Because this embodiment is a photoconductive type photodetector, it is suitable that the resistance is maximized in the dark state and decreases by approximately two figures in the bright state (at the time of light irradiation). For example, the resistance state should be hundred to several hundred k$\Omega$ in the dark, and should be about ten to several tens of k$\Omega$ at the light irradiation time. As one example, the specific resistances of the Si ultrafine particles 154 and $SnO_2$ as the transparent medium 155 were set to 1 $\Omega$·cm and the thickness of the optoelectronic material layer 153 was set to 100 nm. The resistance of the optoelectronic material layer with this structure in the dark state becomes about 100 k$\Omega$. When light is irradiated onto this optoelectronic material layer, carriers are produced and accelerated by an external electric field to exhibit a multiplication phenomenon, which causes the resistance to drop to about 10 k$\Omega$, though the operational principle will specifically be, discussed later.

Although Si is used as a material for the ultrafine particles which constitute the optoelectronic material layer, another group IV semiconductor, such as Ge or its mixed crystal, is suitably usable, or a group III–V or a group II–VI compound semiconductor may be used, as discussed in the sections of the first and second embodiments. While a thin $SnO_2$ is used as the uniform transparent medium, another thin conductive film or thin dielectric film having a specific resistance substantially the same as, or greater than, the specific resistance of ultrafine particles to be dispersed, may be used as well.

A semitransparent electrode 156 of Pt and 10 nm in thickness, as one example, contacts the top surface of the optoelectronic material layer 153. The electrodes 152 and 156 may be formed of one of Mg, Ag, indium, aluminum, gold, tungsten, molybdenum, tantalum, titanium, cobalt, nickel and palladium or the like, instead of Pt.

The semitransparent electrode 156 and the backside electrode 152 are connected to an ohmmeter, as needed, by wire leads or the like via a conductive paste or the like.

The operational principle of the photoconductive type photodetector with the above-described structure will be discussed below. For the operation of the photodetector using the optoelectronic material of this embodiment, when light is irradiated on the optoelectronic material layer 153, light energy is absorbed in the Si ultrafine particles 154 of the optoelectronic material layer 153, electrons in the valence band or of the donor level are excited in the conductive band and they become free electrons. The electrons are accelerated by an external electric field, demonstrating a multiplication phenomenon to further produce multiple free electrons and reach the electrode. As a result, the internal resistance of the optoelectronic material layer 153 drops. The light-receiving function is provided by detecting a change in this internal resistance.

To control the light-receiving wavelength region in the optoelectric conversion device using the optoelectronic material of this embodiment, as discussed in the section of the first embodiment, there are a method of adjusting the particle size (size) of the main body of the Si ultrafine particles 154 and directly changing the band gap width by the quantum confinement effect that happens at that time, and a method of reconstructing the molecular arrangement of an oxide film, if the ultrafine particles can be oxidized, or the molecular arrangement of another kind of dielectric film if oxidization is not possible.

An ultraviolet detector or a blue-color sensor comprising a group IV semiconductor, which requires no filter or the like, can be constructed by using optoelectric conversion device according to this embodiment that has the above-described light-receiving characteristics.

Tenth Embodiment

The principle structure of a color sensor using the optoelectronic material according to this invention as a more specific example of an optoelectric conversion device will now be described in detail as the tenth embodiment with reference to FIGS. 16 and 17.

According to this embodiment, as in the first embodiment, a description will be given of a color sensor comprising a photoconductive type photodetector in which a light-receiving (active) region is an optoelectronic material layer having ultrafine particles of Si, a group IV semiconductor, with its surface covered with its own thermal oxide film, dispersed in a substantially uniform transparent medium with a controllable conductivity or dielectric constant.

Figure 16:
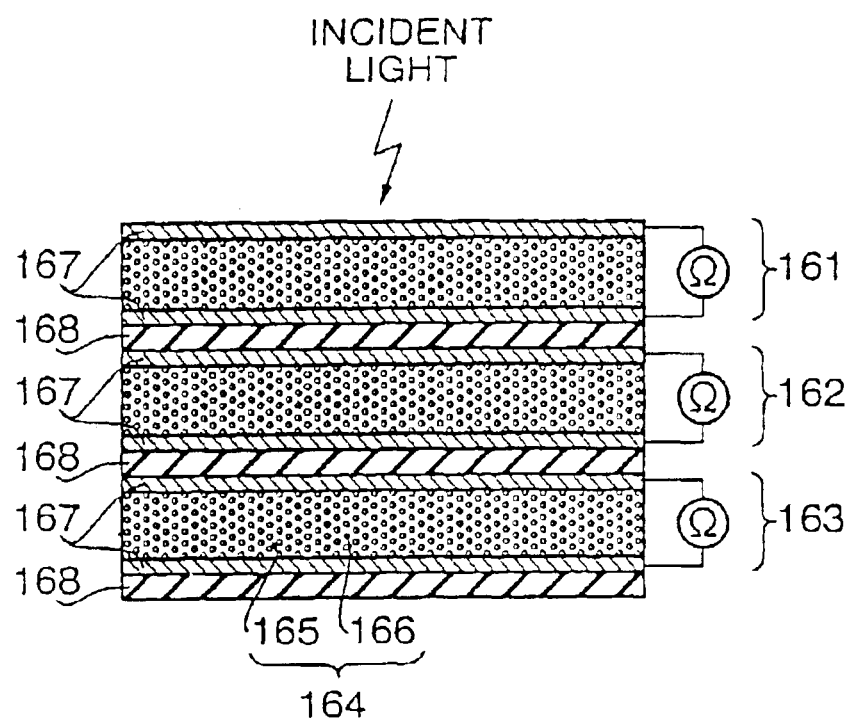
FIG. 16 is a cross-sectional structural view of a color sensor according to the tenth embodiment of this invention.
Figure 17:
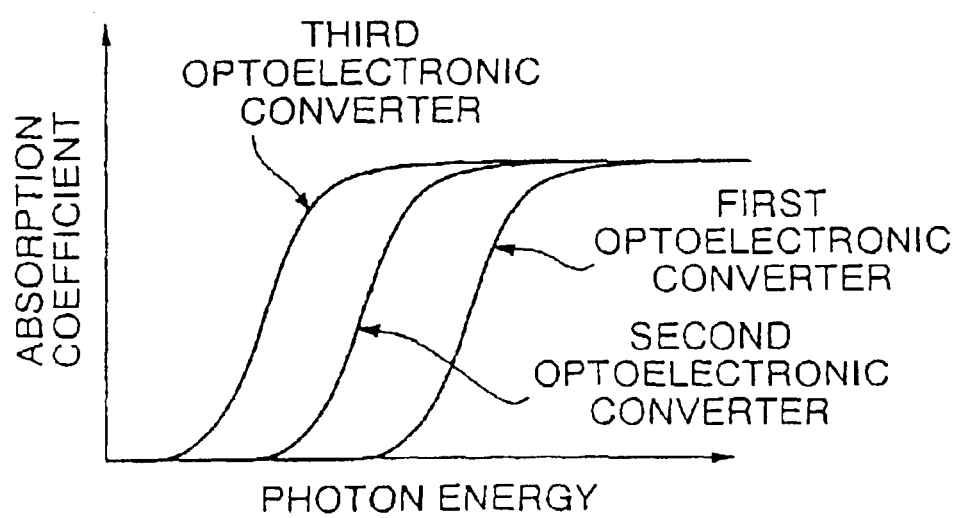
FIG. 17 shows the absorption spectrum of each optoelectric conversion layer of the color sensor.

FIG. 16 shows the cross-sectional structure of a color sensor using such an optoelectronic material. Referring to FIG. 16, "161," "162" and "163" are first, second and third photoelectric conversion layers. Each photoelectric conversion layer has the same structure as the photoconductive type of photodetector which has been explained in the section of the ninth embodiment, and comprises an optoelectronic material layer 164 having Si ultrafine particles 165 dispersed in a transparent medium 166, and transparent electrodes 167 of Pt and 10 nm in thickness, as one example, located above and below the layer. The upper and lower transparent electrodes 167 are connected to an ohmmeter, as needed, by wire leads or the like via a conductive paste or the like.

This Si ultrafine particles 165 of the optoelectronic material layer 164 have substantially spherical shapes, the same crystal structure as bulk Si, and an n-type conductivity with boron doped at a low concentration, to be a p-type with a specific resistance of about 1 $\Omega$·cm. The transparent medium 166 is a uniform thin film which has a high transmittance in the visible light region and has a controllable conductivity or dielectric constant, and a thin $SnO_2$ film having a specific resistance of about 1 $\Omega$·cm was used here as one example. The thickness of the optoelectronic material layer 164 was set to 100 nm. In this structure, the resistance of the optoelectronic material layer in the dark state becomes approximately 100 k$\Omega$.

As the packing fraction of the Si ultrafine particles 165 in the optoelectronic material layer 164 becomes higher, a change in the entire internal resistance of the optoelectronic material layer 164 becomes greater or the light reception sensitivity becomes higher. As mentioned in the section of the first embodiment, however, if the packing fraction is too high, the quantum confinement effect of ultrafine particles is reduced, so that the packing fraction should preferably be set to about 20%.

Although Si is used as a material for the ultrafine particles which constitute the optoelectronic material layer, another group IV semiconductor, such as Ge or its mixed crystal, is suitably usable, or a group III–V or a group II–VI compound semiconductor may be used, as discussed in the section of the second embodiment. While a thin $SnO_2$ is used as the uniform transparent medium, another thin conductive film or thin dielectric film having a specific resistance substantially the same as, or greater than, the specific resistance of ultrafine particles to be dispersed, may be used as well. Further, the semitransparent electrode 167 may be formed of one of Mg, Ag, indium, aluminum, gold, tungsten, molybdenum, tantalum, titanium, cobalt, nickel and palladium or the like, instead of Pt.

The individual photoelectric conversion layers 161, 162 and 163 having the above-described structure are electrically insulated from one another by an isolation insulator film 168 whose material is an $SiO_2$ film having a high visible light transmittance as one example. Although an $SiO_2$ film is used here, an insulator having a high visible light transmittance, such as an $Al_2O_3$ film, may be used as well.

The principle of the light-receiving operation of a color sensor having the above-described structure will be discussed below. To begin with, with regard to the operation of each photoelectric conversion layer using the optoelectronic material according to this embodiment, when light is irradiated on the optoelectronic material layer 164, carriers are produced in the Si ultrafine particles 165 of the optoelectronic material layer 164 and are accelerated by an external electric field, causing a multiplication phenomenon due to collision and ionization to further produce multiple free electrons, and reach the electrode. As a result, the internal resistance of the optoelectronic material layer 164 drops to, for example, about 10 $\Omega$. The light-receiving function is provided by detecting a change in this internal resistance.

As has been described specifically in the section of the first embodiment, the light-receiving wavelength region of each photoelectric conversion layer which has this light-receiving function can be controlled by using With regard to the emission mechanism of Si which is an indirect transition semiconductor, there are a view that the wave number selecting rule for optical transition is relaxed in a three-dimensional minute structural area of the nanometer (nm) order in the porous shape, thus ensuring the radiative recombination of electron-hole pairs, and a view that a many-remembered ring oxide (polysiloxane) is formed on the surface of porous Si and new energy level which contributes to the radiative recombination is formed at the polysiloxane/ Si interface. In any case, it seems certain that with regard to photo excitation, a change in energy band structure (a phenomenon of increasing Eg due to the quantum confinement effect by designing the shape of Si in such a way as to have ultrafine particles whose particle size is in the order of several nanometers. That is, the individual photoelectric conversion layers can be given different light-receiving characteristics by adjusting the mean particle size or the surface atomic arrangement of the Si ultrafine particles contained in each photoelectric conversion layer.

If the sizes of the Si ultra fine particles of the first, second and third photoelectric conversion layers 161, 162 and 163 are increased in this order, Eg is increased as the size of the ultrafine particles becomes smaller, so that the optical gap becomes larger for the layer which is located closer to the light-receiving surface. This behavior is illustrated in FIG. 17. More specifically, the diameters of the ultrafine particles of the first, second and third photoelectric conversion layers were respectively set to 3.0 nm, 3.5 nm and 4.0 nm as one example, and their optical gaps were set to lie in the blue, green and red regions, respectively. Consequently, red (R) light passes through the first and second photoelectric conversion layers without absorption and is absorbed in the third photoelectric conversion layer. Likewise, green (G) light passes through the first photoelectric conversion layer without absorption and is absorbed in the second photoelectric conversion layer (maybe in the third photoelectric conversion layer too depending on the thickness), and blue (B) light is absorbed mainly in the first photoelectric conversion layer. From difference between intensities of received light at the individual photoelectric conversion layers, therefore, the intensities of R, G and B can be obtained. Further, those three primary colors are properly subjected signal processing to ensure discrimination of colors including an intermediate color.

Although a photoconductive photodetector is used as a photoelectric conversion layer in such a color sensor, a photoelectromotive force type photodetector as discussed in the section of the eighth embodiment may be used. This case is advantageous in the linearity to incident light, the fast response characteristic, low noise property.

Eleventh Embodiment

The principle structure of another optoelectronic material according to this invention will specifically be described below as the eleventh embodiment referring to FIGS. 18 and 19.

According to this embodiment, a description will be given of an optoelectronic material as a photoluminescence (PL) light-emitting member in which a light-receiving (active) region is an ultrafine-particles dispersed layer having ultrafine particles of Si, a typical one of group IV semiconductors, with its surface covered with its own thermal oxide film, dispersed in a uniform transparent medium. As has been explained in the section of the first embodiment using Table 1, the oxide film of the ultrafine particles may be omitted depending on the combination of ultrafine particles and a transparent medium.

Figure 18A:
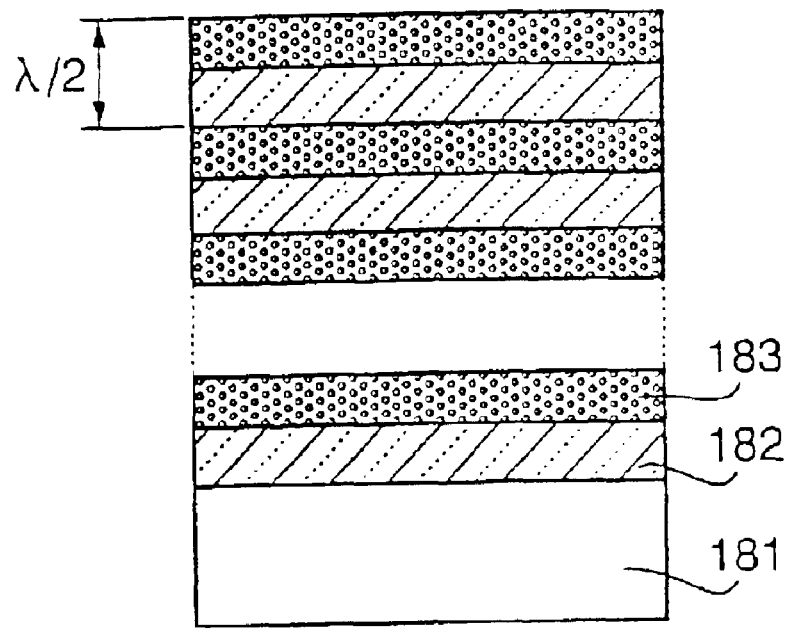
FIGS. 18A and 18B are cross-sectional structural views of an optoelectronic material according to the eleventh embodiment of this invention.

FIG. 18 shows the cross-sectional structure of an optoelectronic material according to this embodiment. In FIG. 18A, "181" is a substrate, as one example of which an n-type Si substrate having a plane orientation (100), a phosphorus-doped n-type conductivity, and a specific resistance of 10 $\Omega \cdot cm$ was used. Transparent material layers 182 having a low refractive index and ultrafine-particles dispersed layers 183 having a high refractive index are alternately stacked in a predetermined cycle on the top surface of this n-type Si substrate 181, forming a periodic structure. The transparent material layers 182 are uniform thin films having a high transmittance in the visible light region and a controllable conductivity or dielectric constant, and a thin indium oxide-tin ($In_2O_3$–$SnO_2$: ITO) film was used as one example. This thin ITO film has a visible light transmittance of 90% or higher, and its conductivity or dielectric constant can be controlled by adjusting its forming conditions (substrate temperature, a oxygen's partial pressure, etc.). For example, the specific resistance can be controlled within the range of approximately $10^{-4}$ to $10^{-2}$ $\Omega \cdot cm$ by adjusting the adding ratio of $SnO_2$ at the time of preparing the thin ITO film by deposition within the range of several % to several tens of % by weight. Further, the dielectric constant can be controlled within the range of about 4 to 5.

Although a thin ITO film is used as the uniform transparent material layer, it is preferable that a uniform thin film having the desired dielectric constant as a low-refractive index layer should be used in accordance with the design of the period structure to be discussed later, another conductive thin film, such as a thin film of $SnO_2$, $TiO_2$ or $InO_2$, may be used as well, or a dielectric thin film of $SiO_2$, $Al_2O_3$ or the like may be used as well. Further, the optoelectronic material according to this embodiment can be used for the optoelectronic material layer of the light-emitting device, display device, optoelectric conversion device or color sensor, described in the sections of the first to tenth embodiments. In this case, it is preferable that this transparent material layer should have a high conductivity.

Figure 18B:
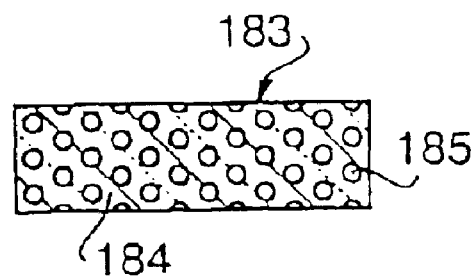

As shown in FIG. 18B, the ultrafine-particles dispersed layer 183 is formed of Si ultrafine particles 185 dispersed in a transparent medium 184. The structure of this ultrafine-particles dispersed layer 183 is the same as that of the optoelectronic material layer 13 which has been discussed in the section of the first embodiment. That is, the Si ultrafine particles 185 have substantially spherical shapes, the same crystal structure as bulk Si, and an n-type conductivity with phosphorus doped at a low concentration, with the particle size adjusted to about 3 to 10 nm. Further, the surfaces of the Si ultrafine particles 185 are covered with an unillustrated $SiO_2$ film whose thickness should be, for example, 3 nm or thinner.

The transparent medium 184 has a high transmittance in the visible light region and a controllable conductivity and dielectric constant, and a thin $SnO_2$ film was used here as one example. It is suitable that the specific resistance of the medium is about the same as, or equal to or greater than, the specific resistance of ultrafine particles to be dispersed, and it was set to 10 $\Omega \cdot cm$ as one example.

Further, the packing fraction of the Si ultrafine particles 185 in the optoelectronic material layer 183 was set to about 20% in order to effectively perform quantum trapping of carriers as mentioned in the section of the first embodiment.

Although Si is used as a material for the ultrafine particles which constitute the optoelectronic material layer, another group IV semiconductor, such as Ge or its mixed crystal, is suitably usable, or a group III–V or a group II–VI compound semiconductor may be used. While a thin $SnO_2$ is used as the uniform transparent medium, it is preferable that a uniform thin film having the desired dielectric constant as a high-refractive index layer should be used in accordance with the design of the period structure to be discussed later, and another conductive thin film or dielectric thin film may be used as well. Further, the optoelectronic material according to this embodiment can be used for the optoelectronic material layer of the light-emitting device, display device, optoelectric conversion device or color sensor, described in the sections of the first to tenth embodiments. In this case, it is preferable that the transparent medium of this ultrafine-particles dispersed layer should have a specific resistance which is about the same as, or equal to or greater than, the specific resistance of ultrafine particles to be dispersed.

A method of designing a periodic structure for the optoelectronic material according to this embodiment will now be described. When the optoelectronic material according to this embodiment demonstrates a light-emitting phenomenon, with λ being the desired center wavelength of the emitted light, alternation lamination is made in such a way that the optical film thickness of one period (refractive index×film thickness) of the lamination of the transparent material layers 182 and the ultrafine-particles dispersed layers 183 becomes λ/2. According to this embodiment, λ was set to 600 nm and the optical film thickness of each layer was set to 150 nm (λ/4) as one example of a design of the periodic structure. More specifically, as the typical refractive index of a thin ITO film is 2.1, the thickness of the transparent material layers 182 was set to 72 nm.

The ultrafine-particles dispersed layers 183 were designed based on the mean effective medium theory. Suppose that the ultrafine-particles dispersed layers are formed with spherical ultrafine particles having a dielectric constant $\in$ dispersed in the transparent medium having a dielectric constant $\in_m$ at a packing fraction f. When the particle size of the ultrafine particles is sufficiently small as compared with the wavelength, the average dielectric constant $\in_{av}$ of the ultrafine-particles dispersed layers is expressed by the following equation (2).

$$\in_{av}=\in_m[1+f\times 3(\in-\in_m)/\{\in(1-f)+\in_m(2+f)\}] \quad (2)$$

According to this embodiment, the typical dielectric constant of a thin $SnO_2$ film is 4.8 and the value of bulk Si (11.9) is used, by approximation, for the dielectric constant of the Si ultrafine particles. Assuming that the packing fraction f is 20%, the average dielectric constant of the ultrafine-particles dispersed layers becomes 5.8 from the above equation. Since the refractive index can be approximated to power ½ of the dielectric constant, the obtained average refractive index of the ultrafine-particles dispersed layers is 2.4. Therefore, the thickness of the ultrafine-particles dispersed layers as high-refractive index layers was set to 63 nm.

Although the optical film thickness of each layer is set to λ/4, the optical film thickness of one period of the lamination of the transparent material layers 182 and the ultrafine-particles dispersed layers 183 may be set to λ/2 and then the optical film thickness of the ultrafine-particles dispersed layers 183 may be set smaller than λ/4. Accordingly, it is possible to enhance the efficiency of acquiring light emission from the optoelectronic material according to this embodiment.

The operation principle of light emission by the optoelectronic material with the above-described structure will be described below. To begin with, with regard to the operation of the PL light-emitting member of the optoelectronic material according to this embodiment, when light having photon energy equal to or greater than the band gap energy (Eg) of the ultrafine particles is irradiated, electron-hole pairs are produced in the Si ultrafine particles 185 in the ultrafine-particles dispersed layers 183, as specifically discussed in the section of the first embodiment. The generated electron-hole pairs demonstrate light emission according to Eg of the ultrafine particles by the recombination phenomenon via the center of the associated radiative recombination.

As group IV semiconductors are originally of an indirect transition type, the probability of occurrence of radiative recombination is very low, but if the ultrafine particles are made to have a particle size of several nanometer order, the probability increases, thus ensuring strong light emission. Note here that a phenomenon of increasing Eg by quantum confinement effect is used as discussed in the section of the first embodiment. That is, the required luminescence wavelength can be obtained by adjusting the particle size (size) or the surface atomic arrangement of the Si ultrafine particles.

Figure 19A:
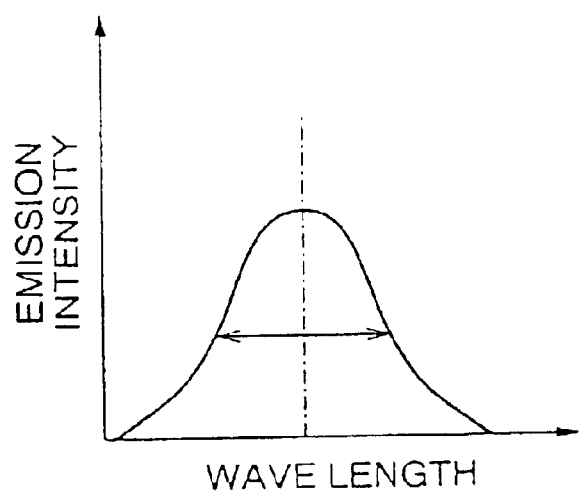
FIGS. 19A and 19B show emission spectra of the optoelectronic material shown in FIGS. 18.

However, the luminescence spectrum of the ultrafine particles alone has a broad spectrum width as shown in FIG. 19A. The Si ultrafine particles according to this embodiment has a spectrum width of about 0.3 eV as illustrated in FIG. 5 in the section of the first embodiment.

Figure 19B:
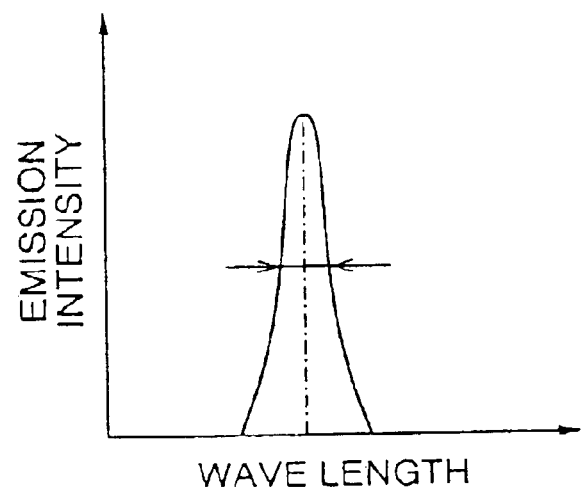

According to this embodiment, by contrast, the transparent material layers 182 and the ultrafine-particles dispersed layers were alternately stacked one on another in accordance with the aforementioned design of the periodic structure in such a manner that the optical film thickness of one period of the lamination would become λ/2. Accordingly, multiple interference occurred at the interfaces of the individual layers due to a difference in the refractive indexes of the transparent material layer and the ultrafine-particles dispersed layer, allowing only the emission intensity of the wavelength region around λ to have been enhanced. This behavior is illustrated in FIG. 19B. Because this spectrum width becomes narrower as the number of layers of the periodic structure increases, so that the number of layers should be adjusted in accordance with the necessary spectrum width.

Further, the effect of enhancing the intensity of the desired wavelength region of the continuous spectrum, inherently generated by ultrafine particles, can be improved by adjusting the particle size or the surface atomic arrangement of the Si ultrafine particles in such a way that the center wavelength of the original light emission of the Si ultrafine particles matches with the center wavelength enhanced by the periodic structure, and adjusting the thickness of each layer in accordance with the aforementioned design of the periodic structure.

Although an optoelectronic material as a PL light-emitting member has been discussed in the section of this embodiment, the optoelectronic material according to this embodiment can also be used for the optoelectronic material layers in the first to tenth embodiments. In this case, in the light-emitting device, display device, optoelectric conversion device or color sensor, described in the sections of the first to tenth embodiments, the light emission and reception intensities of the desired wavelength region of the continuous spectrum, inherently generated by ultrafine particles, can be enhanced.

Twelfth Embodiment

The principle structure of a further optoelectronic material according to this invention will specifically be described below as the twelfth embodiment referring to FIG. 20. According to this embodiment, a description will be given of an optoelectronic material as a photoluminescence (PL) light-emitting member in which a light-receiving (active) region is an active layer having ultrafine particles of Si, a typical one of group IV semiconductors, with its surface covered with its own thermal oxide film, dispersed in a uniform transparent medium. As has been explained in the section of the first embodiment using Table 1, the oxide film of the ultrafine particles may be omitted depending on the combination of ultrafine particles and a transparent medium.

Figure 20:
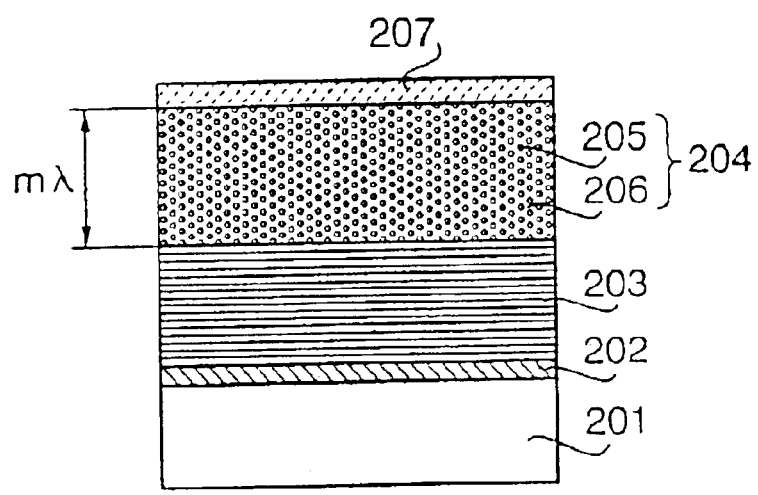
FIG. 20 is a cross-sectional structural view of an optoelectronic material according to the twelfth embodiment of this invention.

FIG. 20 shows the cross-sectional structure of an optoelectronic material according to this embodiment. In FIG. 20, "201" is a substrate, as one example of which a glass substrate was used. A thin metal layer 202 of aluminum (Al) and 100 nm in thickness, as one example, is provided on the top surface of this glass substrate 201. A material having a high reflectance in the visible light range should be used for the thin metal layer 202, which may be formed essentially of one of Pt, Mg, indium, gold, silver, tungsten, molybdenum, tantalum, titanium, cobalt, nickel and palladium or the like, instead of Al.

A multilayer film 203 is formed on the top surface of the thin metal layer 202. This multilayer film 203 has at least two kinds of layers with different refractive indexes alternately stacked one on another to have a periodic structure. As one example, it is formed of an optoelectronic material which is comprised of alternate lamination of transparent medium layers formed of a thin ITO film and ultrafine-particles dispersed layers having Si ultrafine particles dispersed in a thin $SnO_2$ film, as discussed in the section of the first embodiment.

The periodic structure of the multilayer film 203 was made in such a way that when the optoelectronic material according to this embodiment demonstrates a light-emitting phenomenon, the optical film thickness of one period (refractive index×film thickness) would become $\lambda/2$ ($\lambda$: center wavelength of emitted light) in accordance with the design that has specifically been described in the section of the eleventh embodiment. According to this embodiment, with $\lambda$ set to 600 nm, the multilayer film 203 was formed by alternately stacking the transparent medium layers with a thickness of 72 nm and the ultrafine-particles dispersed layers having a thickness of 63 nm, as one example. Although the optoelectronic material of the eleventh embodiment is used for the multilayer film 203, a dielectric multilayer film or the like which has conventionally been used may be used as a multilayer reflection film in the visible light region.

An active layer 204 is formed on the top surface of the multilayer film 203. This active layer 204 has the same structure as the ultrafine-particles dispersed layer 183 which has been discussed in the section of the eleventh embodiment, and is formed of Si ultrafine particles 205 dispersed in a transparent medium 206. The Si ultrafine particles 205 have substantially spherical shapes, the same crystal structure as bulk Si, and a p-type conductivity with boron doped at a low concentration, with the particle size adjusted to about 3 to 10 nm. Further, the surfaces of the Si ultrafine particles 205 are covered with an unillustrated $SiO_2$ film whose thickness should be, for example, 3 nm or thinner. The transparent medium 206 is a uniform thin film having a high transmittance in the visible light region and a controllable conductivity and dielectric constant, and a thin $SnO_2$ film was used here as one example.

Further, the optical film thickness (refractive index×film thickness) of this active layer 204 is set to an integer multiple of $\lambda$. According to this embodiment, as one example, $\lambda$ was set to 600 nm and the optical film thickness of the active layer 204 was set to $2\lambda$. More specifically, with the packing fraction being 20% as one example, the refractive index of the active layer 204 is 2.4 as acquired in the section of the eleventh embodiment. Therefore, the thickness of the active layer 204 was set to 500 nm.

Although Si is used as a material for the ultrafine particles which constitute the active layer, another group IV semiconductor, such as Ge or its mixed crystal, is suitably usable, or a group III–V or a group II–VI compound semiconductor may be used, as discussed in the section of the eleventh embodiment. While a thin $SnO_2$ is used as the uniform transparent medium, it is preferable that a uniform thin film having the desired dielectric constant should be used in accordance with the design of the period structure that has been discussed in the section of the eleventh embodiment, and another conductive thin film or dielectric thin film may be used as well. Further, the optoelectronic material according to this embodiment can be used for the optoelectronic material layer of the light-emitting device, display device, optoelectric conversion device or color sensor, described in the sections of the first to tenth embodiments. In this case, it is preferable that the transparent medium of this active layer should have a specific resistance which is about the same as, or equal to or greater than, the specific resistance of ultrafine particles to be dispersed.

A partial reflection layer 207 of Pt and 10 nm in thickness, as one example, is provided on the top surface of the active layer 204. A material having the proper reflectance in the visible light region should be used for the partial reflection layer 207 which may be formed essentially of one of Mg, indium, Al, gold, silver, tungsten, molybdenum, tantalum, titanium, cobalt, nickel and palladium or the like, instead of Pt. Further, a dielectric multilayer film which has conventionally been used may be used as a partial reflection film in the visible light region.

The operation principle of light emission by the optoelectronic material with the above-described structure will be described below. When light having photon energy equal to or greater than the band gap energy (Eg) of the ultrafine particles is irradiated, light emission having a broad spectrum width as shown in FIG. 19A by the principle described in the section of the eleventh embodiment.

Accordingly, if alternate lamination is made in such a manner that the optical film thickness of the multilayer film 203 in one period becomes $\lambda/2$ to form a periodical structure and the optical film thickness of the active layer 204 is designed to be an integer multiple of $\lambda$ as mentioned above, a resonance structure having the active layer 204 sandwiched between the multilayer film 203 and the partial reflection layer 207. Therefore, the emission intensity of the wavelength region having a peak at $\lambda$ alone can be enhanced as shown in FIG. 19B.

Further, since the optoelectronic material discussed in the section of the eleventh embodiment is used for the multilayer film 203 in this embodiment, the Si ultrafine particles in the multilayer film 203 also demonstrate light emission, thereby further enhancing the emission intensity.

Further, the effect of enhancing the intensity of the desired wavelength region of the continuous spectrum, inherently generated by ultrafine particles, can be improved by adjusting the particle size or the surface atomic arrangement of the Si ultrafine particles in such a way that the center wavelength of the original light emission of the Si ultrafine particles matches with the center wavelength enhanced by the periodic structure, and adjusting the thickness of each layer in accordance with the aforementioned design of the periodic structure.

Although an optoelectronic material as a PL light-emitting member has been discussed in the section of this embodiment, the optoelectronic material according to this embodiment can also be used for the optoelectronic material layers in the first to tenth embodiments. In this case, in the light-emitting device, display device, optoelectric conversion device or color sensor, described in the sections of the first to tenth embodiments, the light emission and reception intensities of the desired wavelength region of the continuous spectrum, inherently generated by ultrafine particles, can be enhanced.

Thirteenth Embodiment

A suitable method of manufacturing an optoelectronic material according to this invention will now be described in detail as the thirteenth embodiment with reference to FIGS. 21 through 24.

FIGS. 21 present step diagrams illustrating a method of manufacturing group IV ultrafine particles as one example of an optoelectronic material, and "211" denotes silicon (Si) power and "212" denotes germanium (Ge) power both having particle sizes of about 1.0 to 2.0 $\mu$m and purity of 6 N or greater. "214" is a hot press machine and "215" is an Si—Ge mixed target.

Figure 21A:
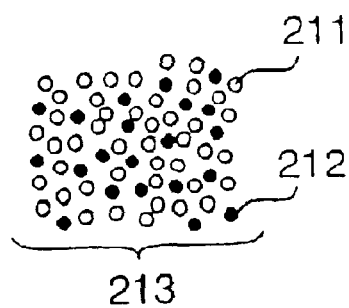
FIGS. 21A through 21C are explanatory diagrams of steps of forming a mixed target according to the thirteenth embodiment of this invention.

To begin with, as shown in. FIG. 21A, the Si power 211 and the Ge power 212 are mechanically mixed to be uniformly dispersed to prepare an Si—Ge mixed power 213. While the mixing ratio can be set arbitrarily in order to control the luminescence wavelength as will be discussed later, it was set to Si:Ge=0.2:0.8 in molar ratio with priority placed on the light emission efficiency.

Figure 21B:
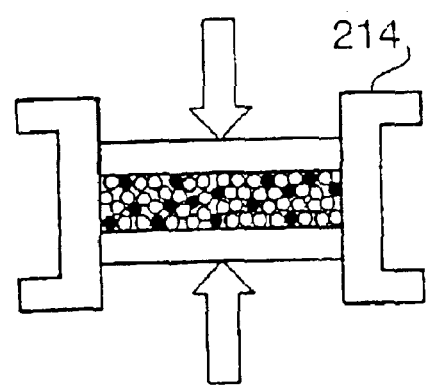
Figure 21C:

Next, as shown in FIG. 21B, the Si—Ge mixed powder 213 is sealed inside the hot press machine 214 where heating and compression are performed at a time for compression sintering. While the heating temperature at this time is in general suitably about 0.8 times the eutectic point (K) as a reference, it was set to about 700° C. in this embodiment. The pressure level was set in a range of 15 to 20 MPa and the ambient at the time of compress sintering was rare gas (argon gas). With the use of a vacuum hot press method, however, a molded article with a high density can be obtained finally. Alternatively, the acquisition of a molded article having substantially the same density as obtained in the hot press method using rare gas can be accomplished by compressing at a low temperature and low pressure. As shown in FIG. 21C, a molded Si—Ge mixed target 215 is taken out from the hot press machine 214.

The thus molded Si—Ge mixed target 215 has Si and Ge uniformly dispersed on the micrometer level, and the density reaches to or higher than an ideal value of 99%.

Figure 22:
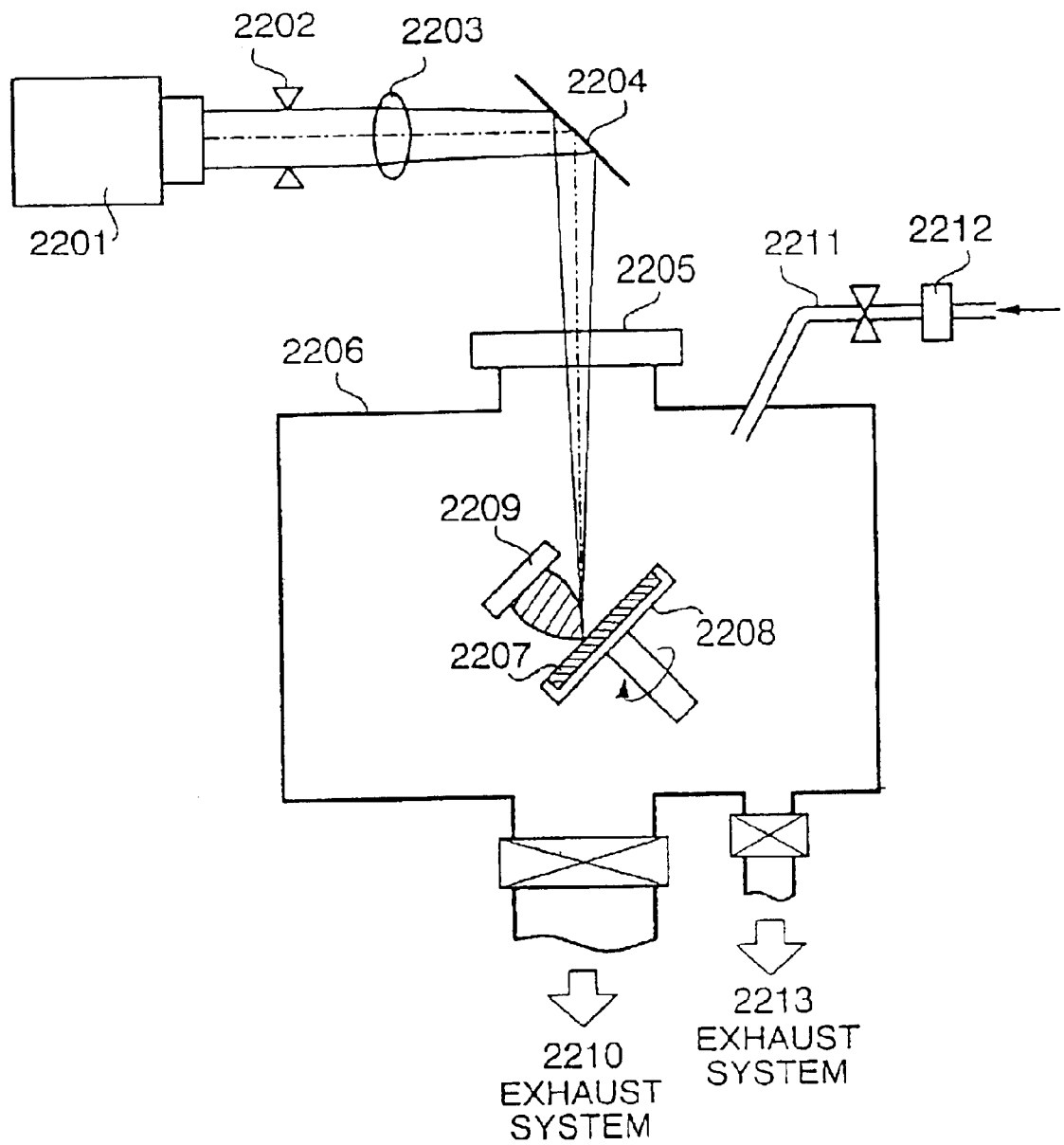
FIG. 22 is a conceptual diagram of an apparatus for preparing ultrafine particles.

FIG. 22 shows a conceptual diagram of an apparatus for preparing group IV (Si—Ge) mixed crystal ultrafine particles whose particle sizes are controlled on the nm order by performing laser ablation on the Si—Ge mixed target acquired by the fabrication method in FIGS. 21.

The laser ablation is to irradiate a laser beam with a high energy density (pulse energy: 1.0 J/cm$^2$ or greater) on a target material to cause melting and desorption of the surface of the irradiated target material, and is characterized in non-heat balance and mass-less process. A specific effect of the non-heat balance is the capability of effecting spatial and time based selective excitations. In particular, the spatially selective excitation can allow only a necessary material source to be excited whereas the conventional heat process or plasma process causes a significantly large area or the entire area of a reaction tank to be exposed to heat or ions, and it is thus a clean process with suppressed mixing of an impurity.

The "mass-less" means a significantly low damage as compared with an ion process with the same non-heat balance. The desorbed material in laser ablation mainly consists of ions and neutron particles or atoms, moles or clusters (consisting of about several to several tens of atoms) whose kinetic energy reaches several tens of eV for ions and several eV for neutron particles. This energy is far higher than that of a heat-evaporated atom, but lies in a considerably low energy region than that of an ion beam.

Such a clean laser ablation process with less damaging is suitable for preparing ultrafine particles whose impurity mixing, crystallinity, surface status and the like are controlled. This is because low damaging is an inevitable factor in the preparation of ultrafine particles with a very large surface area ratio and susceptible to the structure and if ultrafine particles are grown in the heat balanced process, the distribution of the structural parameters like the particle size becomes unavoidable.

The basic apparatus structure is such that a laser beam (wavelength: 193 nm) from argon-fluorine (ArF) excimer laser source 2201 is introduced into a vacuum reaction chamber 2206 through an optical system, which comprises a slit 2202, a condensing lens 2203, a mirror 2204 and a light-pass window 2205, and is focused and irradiated on the surface of a Si—Ge mixed target 2207 placed inside the vacuum reaction chamber 2206. The irradiation energy conditions at this time were the pulse energy density of 1.0 to 3.0 J/cm$^2$ and the repeating frequency of 10 Hz. Further, the Si—Ge mixed target 2207 is placed on a target holder 2208 having a rotational mechanism. A deposition substrate 2209 is placed at a distance of 7 to 10 mm in the direction normal to the surface of the Si—Ge mixed target 2207 and in parallel to the target surface, and a desorbed material from the irradiated surface of the Si—Ge mixed target 2207 is collected and deposited. That is, as the desorbed material is essentially an atom, mole or cluster under the irradiation conditions of this embodiment, a thin containing those is formed by the laser ablation deposition in a high vacuum environment.

When the laser ablation deposition with the aforementioned irradiation conditions is performed in an ambient of He gas of several Torr, the kinetic energy of the desorbed material is scattered in the ambient gas atoms, so that association and growth in the air are accelerated and the material has grown as ultrafine particles with particle sizes of several nm to several tens of nm by the time it has reached and has been collected on the deposition substrate 2209.

More specifically, after the vacuum reaction chamber 2206 is previously degassed to 1×10$^6$ Pa by a high vacuum evacuation system 2210 which mainly comprises a turbo molecular pump, this high vacuum evacuation system 2210 is sealed. Then, a helium (He) gas is introduced through a rare gas supply line 2211, and a rare gas (He) ambient is realized by the flow control by a mass flow controller 2212 and differential exhaust by a differential exhaust system 221, which mainly comprises a dry rotary pump or high-pressure turbo molecular pump. The range of control pressure in the He gas ambient is 1.0 to 20.0 Torr.

Conventionally, it is difficult to form a high-grade Si—Ge mixed crystal by a melting and heat treatment of a bulk at 1000° C., whereas this embodiment can present a non-heat balanced state equivalent to a very high temperature of several ten thousand degrees on the surface of the Si—Ge mixed target 2207, thus ensuring the formation of an idealistic Si—Ge mixed crystal.

Because the Si—Ge mixed target 2207 has Si and Ge uniformly dispersed on the micrometer order, the area of the irradiation laser spot has a size of several mm$^2$ and is in a very hot state equivalent to several ten thousand degrees in terms of temperature, i.e., the difference between the melting point and evaporation temperature of Si and Ge is negligible, the composition of the desorbed material for each pulse sufficiently matches with the composition of the Si—Ge mixed target 2207 itself (molar ratio: 0.2:0.8).

It is needless to say that deposition of ultrafine particles with particle sizes adjusted on the nm order may be formed on the substrate by using not only a mixed target, but also a target of a single group IV material like Si or Ge or a mixed target thereof, of course.

A description will now be given of a method of controlling the mean particle size of the Si—Ge mixed crystal ultrafine particles according to this embodiment. The control on the mean particle size according to this embodiment is basically accomplished by constantly changing the pressure of the rare gas (He gas) ambient in the vacuum reaction chamber 2206 through the flow control by the mass flow controller 2212 and the conductance adjustment by the differential exhaust system 2213, which mainly comprises a dry rotary pump.

Figure 23:
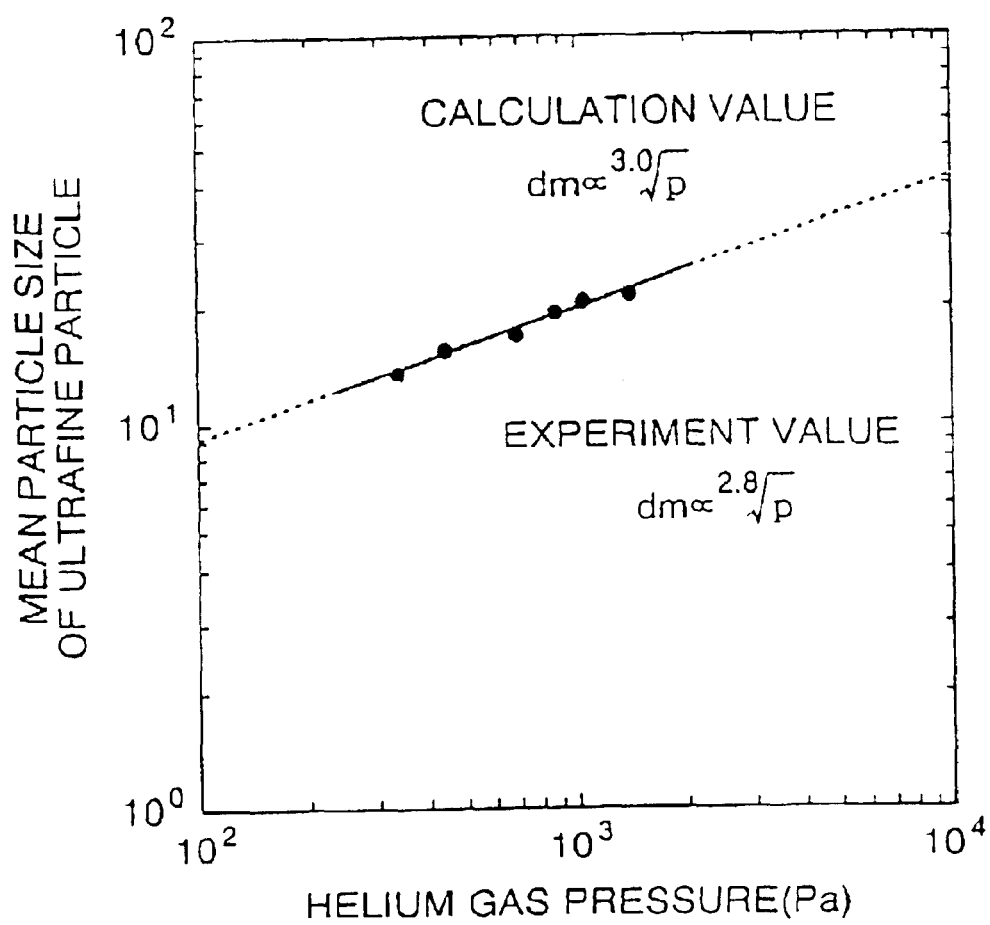
FIG. 23 is a characteristic diagram showing the relationship between a rare gas pressure and the mean particle size of ultrafine particles.

FIG. 23 shows a characteristic curve representing the relationship between the pressure of the introduced He gas and the mean particle size of Si—Ge mixed crystal ultrafine particles adhered to the deposition substrate 2209. From the figure, it can be understood that the particle size of the ultrafine particles monotonously increases with the rising He gas pressure when the He gas pressure lies in the range of 2.0 Torr to 10.0 Torr. It is also apparent that, quantitatively, the particle size increases in proportion to power ⅓ of the He gas pressure (p). This dependency is explained by the scattering of the kinetic energy of the desorbed (injected) particles into the He gas ambient considered as an inertial resistance medium. Such a size control can of course be used not only on a target of a mixed material, but also on a target of a single material like Si or Ge.

In short, according to this embodiment, a laser ablation step is performed in rare gas ambient first to surely form deposition of ultrafine particles with the particle size controlled to the nm order, on the substrate. Next, the pressure of the rare gas ambient in the vacuum reaction chamber is constantly changed to ensure mean particle size control. Since mixed crystal ultrafine particles are used, particularly, the composition ratio of the mixed crystal can effectively used as a sub parameter although the particle size is the main parameter in adjusting the band gap energy, as illustrated in FIG. 6 in the section of the second embodiment.

As an optoelectronic material, a single substance or a mixed crystal of another type or with another composition ratio may be used as well. For example, a group III–V compound, like a gallium-arsenic (GaAs), which is a direct transition type semiconductor, or a group II–VI compound like cadmium sulfide (CdS) may be used as well.

Ultrafine particles produced in the vacuum reaction chamber are directly deposited on the substrate in the foregoing description, in which case the particle size distribution of the ultrafine particles becomes wider. In this respect, a method of controlling the particle size of ultrafine particles in the step of manufacturing the optoelectronic material according to this invention will be described using FIG. 24.

Figure 24:
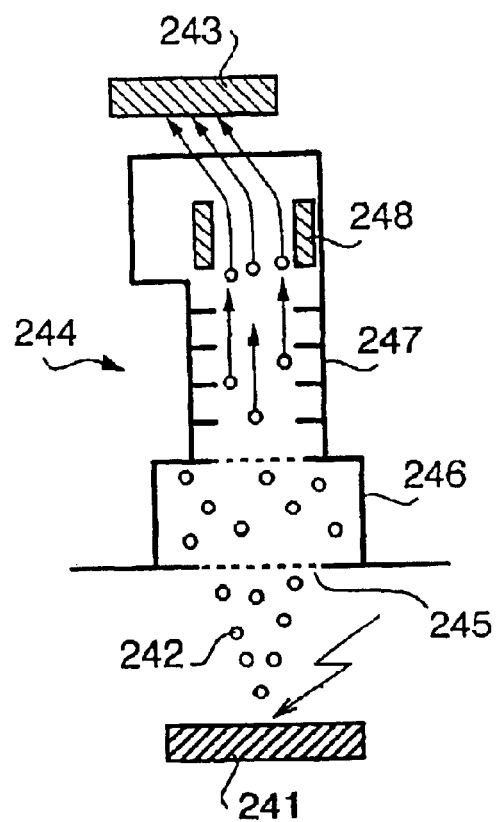
FIG. 24 is a conceptual diagram of a particle size control apparatus for the ultrafine particles.

FIG. 24 is a schematic diagram of a particle size control apparatus which controls the particle size using mass separation at the time of depositing ultrafine particles by laser ablation. In FIG. 24, when a pulse laser beam is irradiated on the surface of a target 241 placed in the center of a reaction chamber in rare gas ambient, a laser ablation phenomenon occurs on the surface of the target 241 and association and growth in the air are accelerated, producing ultrafine particles 242. For the produced ultrafine particles 242, a mass separator 244 is used, which comprises an orifice 245 for introducing the produced ultrafine particles 242, an ionization chamber 246 for ionizing the introduced ultrafine particles, an acceleration tube 247 for accelerating the speed of the ionized ultrafine particles by an electric field, and a deflection electrode 248 for applying an electric field for mass separation of the ultra fine particles.

A method controlling the particle size of ultrafine particles in the above-described structure will be discussed next. First, as mentioned above, when a pulse laser beam is irradiated on the surface of the target 241 placed in the vacuum reaction chamber in rare gas ambient, the ultra fine particles 242 are generated. The ultrafine particles 242 are introduced via the orifice 245 into the ionization chamber 246. As the introduced ultrafine particles pass a grow discharge area, which is formed in this ionization chamber 246, they are ionized. Next, the ionized ultrafine particles are accelerated in accordance with the voltage applied to the acceleration tube 247 and reach the deflection electrode 248. If an electric field has been applied to the deflection electrode 248, the injection direction of some of the ultrafine particles is changed toward a deposition substrate 243. Since this injection direction is determined by the particle size (mass to be precise) of the ultrafine particles to be deposited, the acceleration voltage in the acceleration tube 247, and the applied electric field to the deflection electrode 248, it is possible to inject only the ultrafine particles to be deposited toward the deposition substrate 243 by controlling those physical quantities.

Installing the above-described mass separator 244 between the target 241 and the deposition substrate 243 can permit ultrafine particles with matched particle sizes to be deposited on the deposition substrate 243. Although an electric field is applied using the deflection electrode to change the injection direction of ultrafine particles in the foregoing description, the injection direction can be changed by applying a magnetic field.

Fourteenth Embodiment

Another suitable method of manufacturing the optoelectronic material according to this invention will now be described in detail as the fourteenth embodiment with reference to FIG. 25. According to the above-described thirteenth embodiment of this invention, a method of manufacturing group IV ultrafine particles has been described. If the ultrafine particles are directly adhered and deposited on a deposition substrate, a thin film with a porous shape comprised of ultrafine particles is likely to be formed at last. With regard to this porous shape, a more optimal shape may be demanded on an assumption that electrodes are connected to form a device, or a more optimal shape or the like may be demanded in order to bring about the original quantum confinement effect of spherical ultrafine particles to demonstrate a new function associated with light emission.

In this respect, a description will be given of a method of manufacturing an optoelectronic material comprised of a transparent conductive thin film with dispersed Si ultrafine particles according to this embodiment will be described. According to this embodiment, there is a step of simultaneously performing deposition of Si ultrafine particles and deposition of a transparent conductive material on the same substrate to disperse the Si ultrafine particles into the transparent conductive thin film, the Si ultrafine particles are prepared and adhesively deposited on the substrate using laser ablation in rare gas (Ar, He or the like) ambient, and the transparent conductive thin film is formed on the same substrate in such a way that the Si ultrafine particles are dispersed inside through an evaporation step, suitably, laser ablation in an oxide gas ambient.

Figure 25:
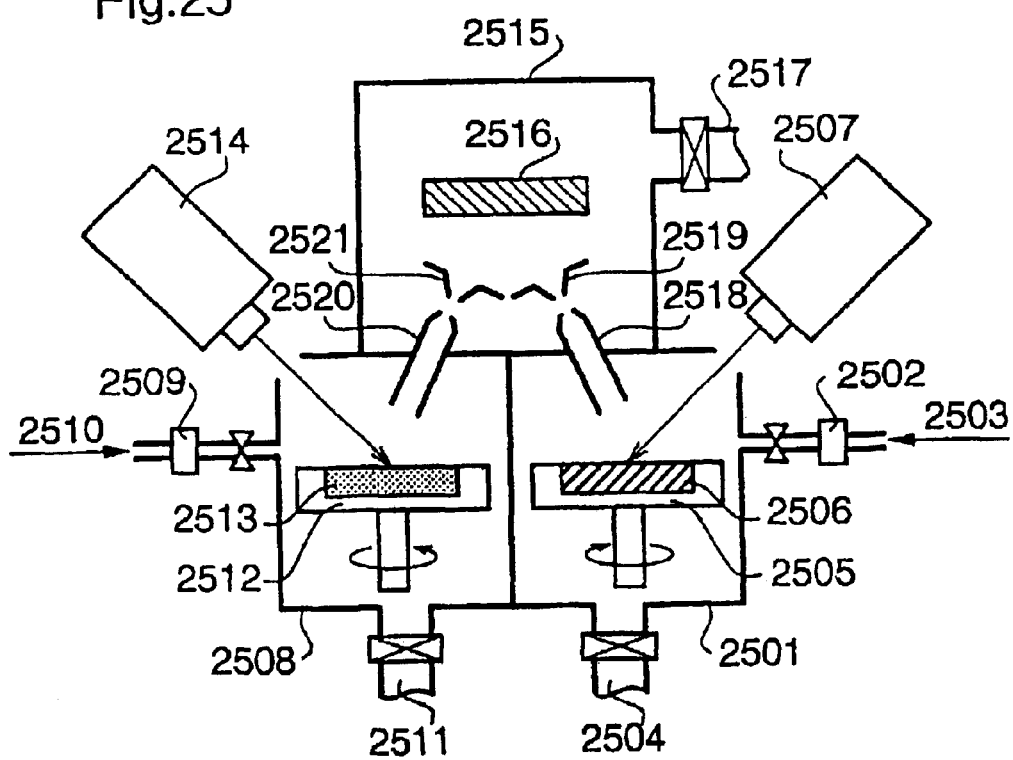
FIG. 25 is a conceptual diagram of an apparatus for manufacturing an optoelectronic material according to the fourteenth embodiment of this invention.

Specifically, FIG. 25 shows a conceptual diagram of an optoelectronic material manufacturing apparatus for forming a thin optoelectronic material layer having Si ultrafine particles dispersed in a uniform transparent conductive thin film by simultaneous laser ablation on the Si target and the transparent conductive target.

Referring to FIG. 25, after a first reaction chamber 2501 entirely of metal is degassed to $1.0 \times 10^9$ Torr by a high vacuum evacuation system which mainly comprises a turbo molecular pump, and an Ar gas is introduced via a rare gas supply line 2503 through a mass flow controller 2502. In cooperation of the operation of a gas exhaust system 2504, which mainly comprises a dry rotary pump or high-pressure turbo molecular pump, the rare gas pressure in the first reaction chamber 2501 is set to a constant value in the range of 0.1 to 10 Torr.

Under this situation, a pulse laser beam from a first pulse laser source 2507 is irradiated on the surface of an Si target 2506 placed on a first target holder 2505 which has a rotational mechanism. Consequently, a laser ablation phenomenon occurs on the surface of the Si target 2506, ions or neutrons (atoms, clusters) of Si are desorbed and they are injected mainly in the target normal direction at first with the kinetic energy on the order of 50 eV for ions or 5 eV for neutrons. As the desorbed material collides against the atoms of the rare gas, its flying direction is disturbed and the kinetic energy is scattered in the ambient, thus accelerating association and condensation in the air. As a result, ultrafine particles with particle sizes of several nm to several tens of nm are grown. The laser ablation step in this rare gas ambient is basically the same as the one that has been explained with reference to FIG. 22.

Meanwhile, after a second reaction chamber 2508 entirely of metal is degassed to $1.0 \times 10^9$ Torr by the high vacuum evacuation system and an oxygen-containing gas is introduced via an oxide gas supply line 2510 through a mass flow controller 2509. It is suitable to mix oxygen in the He gas at an oxygen mixing ratio of several %. In cooperation of the operation of a gas exhaust system 2511, which mainly comprises a dry rotary pump or high-pressure turbo molecular pump, the rare gas pressure in the second reaction chamber 2508 is set to a constant value in the range of 0.1 to 10 Torr. When a pulse laser beam from a second pulse laser source 2514 is irradiated on the surface of an $SnO_2$ target 2513 placed on a second target holder 2512, which has a rotational mechanism, under this situation, a laser ablation phenomenon occurs on the surface of the $SnO_2$ target 2513, ions or neutrons (molecules, clusters) of $SnO_2$ are desorbed and they are injected mainly in the target normal direction at first with the kinetic energy on the order of 50 eV for ions or 5 eV for neutrons, while keeping the size of the molecular or cluster level. By providing oxygen gas ambient at this time, the injected material becomes molecules of $SnO_2$ or a cluster having a unit of molecules, both in a metastable state, and the stoichiometric composition is maintained.

Further, a deposition substrate 2516 is placed in a vacuum reaction chamber 2515, which has been degassed approximately to the ultimate vacuum of $1.0 \times 10^{-5}$ Torr by a high vacuum evacuation system 2517 which mainly comprises a turbo molecular pump. Due to the differential pressure between the vacuum reaction chamber 2515 and the first reaction chamber 2501, the Si ultrafine particles produced in the first reaction chamber 2501 are injected through a first nozzle 2518 and a first skimmer 2519 into the vacuum reaction chamber 2515 to be deposited on the substrate 2516.

Likewise, due to the differential pressure between the vacuum reaction chamber 2515 and the second reaction chamber 2508, the molecules or the cluster of $SnO_2$ produced in the second reaction chamber 2508 are injected into the vacuum reaction chamber 2515 through a second nozzle 2520 and a second skimmer 2521 to be deposited on the substrate 2516 as a uniform thin film.

Therefore, simultaneous laser ablation of Si and $SnO_2$ can form a thin $SnO_2$ (transparent conductor) with the dispersed Si ultrafine particles on the deposition substrate 2516. Further, as active oxygen for preparing a transparent conductive thin film exists only in the second reaction chamber 2508 according to this embodiment, Si ultrafine particles very susceptible to oxidization can be dispersed in the transparent conductive thin film without being exposed to active oxygen ambient.

The packing fraction of the deposited ultrafine particles is controlled by the laser power on a target at the time of laser ablation and the repeating frequency. Alternatively, it is controllable by adjusting the shapes of the nozzles and skimmers and the differential pressure between the vacuum reaction chamber and each reaction chamber.

The difference between the use of Ar and the use of He as an ambient rare gas is such that the pressure of Ar should be set to 0.1 to 0.2 times that of He taken as a reference.

The surface of the Si ultrafine particles immediately after deposition suffers crystal defects or impurity mixing due to a damage caused by high energy particles or radiation. To remove such an undesirable surface layer and form Si ultrafine particles with excellent crystallinity and purity, it is effective to subject the Si ultrafine particles to oxidization in oxygen ambient or a heat treatment. As this surface treating step, the following schemes are suitable in accordance with the combinations of ultrafine particles and transparent media which have been discussed in the section of the first embodiment using Table 1.

First, in the case of the combinations A on Table 1, i.e., when the standard enthalpy of formation of the transparent medium is lower than that of an oxide of ultrafine particles, oxidization by oxygen in the transparent medium does not easily occur when the ultrafine particles are dispersed in the transparent medium, so that the transparent thin film with the dispersed ultrafine particles is subjected to a heat treatment after deposition. Specifically, after deposition is finished, the vacuum reaction chamber 2515 is temporarily evacuated to a high vacuum state after which a nitrogen gas is introduced to form a nitrogen ambient. Then, the transparent thin film with the dispersed ultrafine particles on the deposition substrate 2516 is heated. In this heat treatment, the temperature is set to 0.5 to 0.8 times the melting point (absolute temperature) of the ultrafine particles and lower than the melting point of the transparent medium. Further, it is desirable that the melting point of the transparent medium be higher than that of the ultrafine particles. For example, the melting point of Si is 1414° C. and the melting point of $SnO_2$ is 1127° C., so that the temperature in the heat treatment should be set in the range of 600 to 1000° C. The surface treating step in this nitrogen ambient can eliminate the undesirable surface layer and can form ultrafine particles having excellent crystallinity and purity. Although the heat treatment is carried out in the nitrogen gas ambient, it may be performed in an ambient of an oxygen gas or the like. In this case, an oxide film can be formed on the surface of the ultrafine particles.

In the case of the combinations B on Table 1 as in this embodiment, when ultrafine particles are dispersed in a transparent medium they are oxidized by oxygen in the transparent medium. Before the dispersion of the ultrafine particles in the transparent medium, therefore, they should be coated with an oxide film. Specifically, at the time of executing the aforementioned laser ablation of Si and $SnO_2$, an oxygen gas should have been introduced in the vacuum reaction chamber 2415. The pressure should be so set as to provide a differential pressure between the first reaction chamber and the second reaction chamber, for example, to $10^2$ Torr or lower. When the Si ultrafine particles produced in the first reaction chamber 2501 are injected into the vacuum reaction chamber 2515 through the first nozzle 2518, they contact the oxygen molecules in the vacuum reaction chamber, accelerating the surface oxidization. Meanwhile, the oxygen composition of the deposited thin $SnO_2$ film is not reduced by this mixing of the oxygen gas, and the stoichiometric composition is maintained. The surface treating step in this oxygen ambient could eliminate the undesirable surface layer and could form ultrafine particles having excellent crystallinity and purity.

According to this embodiment, as described above, a thin $SnO_2$ film with dispersed Si ultrafine particles can be obtained, thus eliminating a porous shape. It was therefore possible to prepare a thin film containing ultrafine particles which are useful in connecting electrodes to form a device and can effectively bring about the quantum size effect.

Further, the undesirable surface layer could be eliminated by the surface treatment of ultrafine particles to form ultrafine particles having excellent crystallinity and purity.

Although the foregoing description has discussed a method of manufacturing an optoelectronic material comprising Si ultrafine particles dispersed in a thin $SnO_2$ film, a single substance or a mixed crystal of another type or with another composition ratio may of course be used as well as an optoelectronic material, and a dielectric thin film of $SiO_2$ or the like may be used as a transparent medium material in which ultrafine particles are to be dispersed, instead of a transparent conductive thin film.

Si ultrafine particles produced in the first reaction chamber are directly deposited on the substrate via the first nozzle in the foregoing description, in which the particle size distribution of the ultrafine particles becomes wider. In this respect, ultrafine particles with matched particle sizes can be deposited by using the method of controlling the particle size of ultrafine particles, which has been explained in the section of the thirteenth embodiment using FIG. 24, in the step of manufacturing the optoelectronic material of this invention.

Fifteenth Embodiment

Another method of manufacturing the optoelectronic material according to this invention will now be described in detail as the fifteenth embodiment with reference to FIGS. 26 and 27. A description will be given of a method of manufacturing an optoelectronic material comprising a dielectric thin film with mainly group IV ultrafine particles dispersed according to this embodiment. This embodiment has a step of simultaneously carrying out deposition of group IV mixed crystal ultrafine particles and deposition of a dielectric material on the same substrate to disperse the group IV mixed crystal ultrafine particles in the dielectric thin film. The adhesive deposition of the group IV mixed crystal ultrafine particles by laser ablation and the deposition of the dielectric thin film by sputtering are executed simultaneously on the same substrate.

Figure 26:
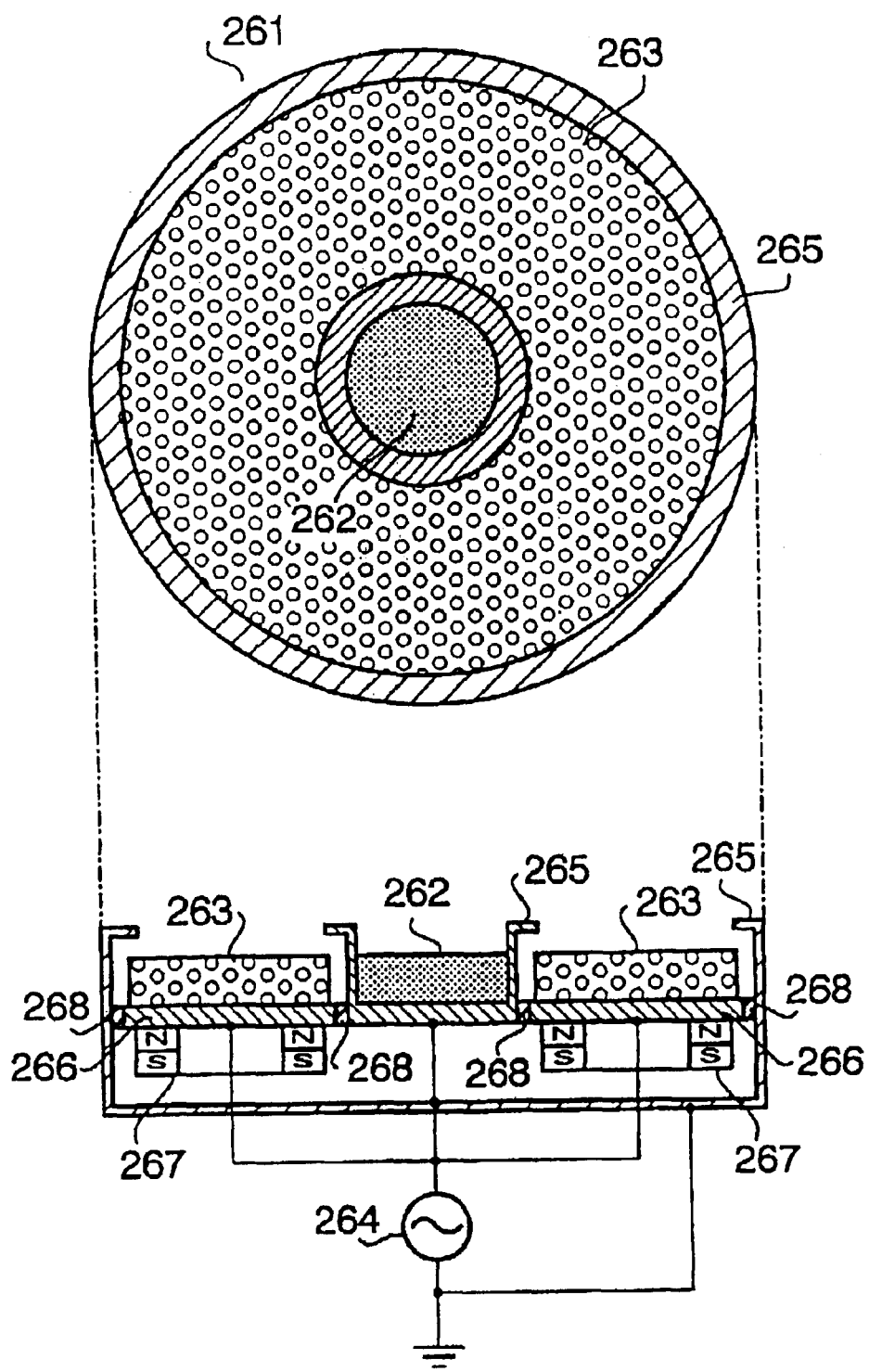
FIG. 26 is a structural diagram of a hybrid cathode apparatus according to the fifteenth embodiment of this invention.
Figure 27:
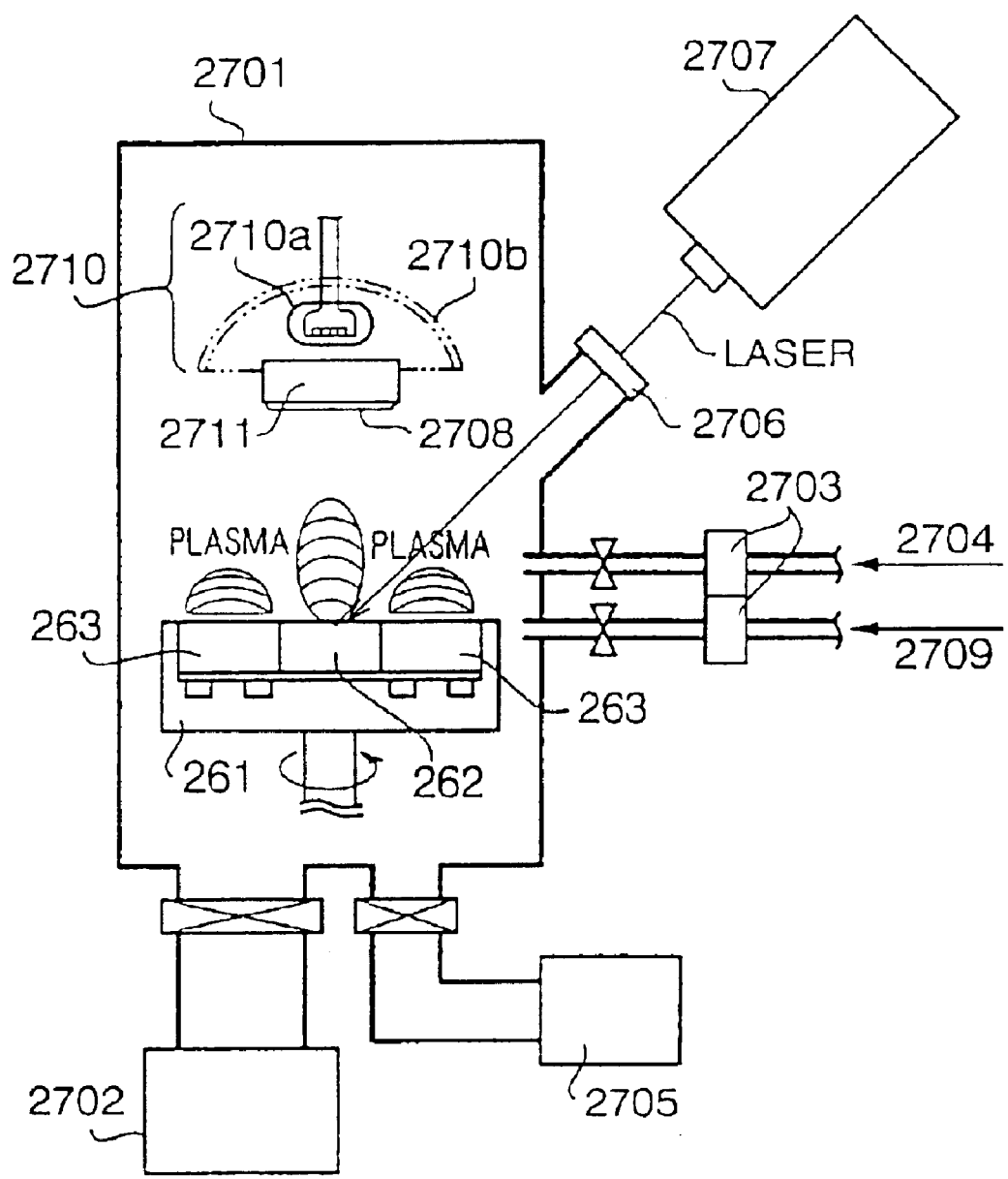
FIG. 27 is a structural diagram of a composite deposition apparatus for manufacturing the optoelectronic material.

Specifically, FIGS. 26 and 27 show conceptual diagrams of apparatuses according to this embodiment. FIG. 26 shows the structure of an ablation-sputtering hybrid cathode 261 which is used in this embodiment. In FIG. 26, a disk-shaped group IV (Si—Ge) mixed target 262 for laser ablation is placed at the center, and a dielectric material ($SiO_2$) target 263 for sputtering is arranged concentrically surrounding the target 262. The group IV (Si—Ge) mixed target 262 is the same as one used in the thirteenth embodiment of this invention.

The bottom of the dielectric material target 263 is connected to an RF power supply 264 (13.56 MHz, 1.0 kW), and a magnetron structure 267 having a permanent magnet provided under the dielectric material target 263 in order to improve the plasma density in the vicinity of the dielectric material target 263 and increase the sputtering rate.

An anode ring 265 is provided in the proper shape to prevent cross contamination from being caused by sputtering on the surface of the group IV mixed target 262 for laser ablation or other unnecessary portions.

While the bottoms of the group IV mixed target 262 and the dielectric material target 263 are cooled with water to prevent overheating, a packing plate 266 of copper is provided to improve the cooling efficiency.

FIG. 27 presents a conceptual diagram of a composite deposition apparatus for forming an optoelectronic material layer having group IV mixed crystal ultrafine particles dispersed in a dielectric thin film.

Referring to FIG. 27, first, a vacuum reaction chamber 2701 entirely of metal is degassed to the ultimate vacuum of $1.0 \times 10^7$ Pa by a high vacuum evacuation system 2702 which mainly comprises a turbo molecular pump. Then, the high vacuum evacuation system 2702 is closed by a valve, after which an Ar or He gas is introduced via a rare gas supply line 2704 through a mass flow controller 2703. In cooperation of the operation of a differential exhaust system 2705, which mainly comprises a dry rotary pump or high-pressure turbo molecular pump, the rare gas pressure in the vacuum reaction chamber 2701 is set to a constant value in the range of 10.0 mTorr to 10.0 Torr.

Under this situation, an ArF excimer laser beam from an excimer laser source 2707 is irradiated through a light inlet window 2706 on the surface of an Si—Ge target 262, placed in the center of the hybrid cathode 261. Subsequently, a laser ablation phenomenon occurs on the surface of the Si—Ge target 262, ions or neutrons (atoms, clusters) of Si and Ge are desorbed and they are injected mainly in the target normal direction at first with the kinetic energy on the order of 50 eV for ions or 5 eV for neutrons. As the kinetic energy of the desorbed material is scattered in the ambient gas atoms, thus accelerating association and growth in the air. Therefore, the material has grown as ultrafine particles with particle sizes of several nm by the time it has reached and has been collected on a deposition substrate 2708 which is positioned perpendicularly above the center of the Si—Ge target 262.

The laser ablation step in this rare gas ambient is basically the same as the one that has been discussed with reference to FIG. 22. The packing fraction of the deposited ultrafine particles is controlled by the laser power on the target at the time of laser ablation and the repeating frequency.

As high-frequency power is applied to the $SiO_2$ target 263 of the hybrid cathode 261 in the rare gas ambient, deposition of $SiO_2$ by sputtering is carried out at the same time.

The aforementioned simultaneous depositions by ablation (Si—Ge) and sp uttering ($SiO_2$9 can form an thin $SnO_2$ (dielectric) film with dispersed Si—Ge (group IV) mixed crystal ultrafine particles on the deposition substrate 2708.

After deposition is finished, the vacuum reaction chamber 2701 is temporarily evacuated to a high vacuum state after which an oxygen gas is introduced via an oxygen supply line 2709 to form an oxygen ambient. Then, an infrared light (incoherent light) from a radiating and heating apparatus 2710, which comprises a halogen lamp 2710a provided at the back of the deposition substrate 2708 and a uniform reflector 2710b, is irradiated on the deposition substrate 2708 to heat the thin $SiO_2$ film with the dispersed Si—Ge mixed crystal ultrafine particles on the deposition substrate 2708. At this time, a transparent material like quartz is used for a substrate holder 2711. This heat treatment is conducted in the oxygen ambient, the surface of the group IV mixed crystal ultrafine particles can be oxidized if the temperature is set in the range of 600 to 900° C.

The surface of the group IV mixed crystal ultrafine particles immediately after deposition suffers crystal defects or impurity mixing due to a damage caused by high energy particles or radiation. The undesirable surface layer could be eliminated by the surface oxidization step in the oxygen ambient to form group IV mixed crystal ultrafine particles having excellent crystallinity and purity.

Since the surfaces of the ultrafine particles during flying in the air are active, they contact the oxygen molecules, accelerating the surface oxidization. The oxygen composition of the deposited thin $SnO_2$ film is not reduced by this mixing of the oxygen gas, and the stoichiometric composition is maintained. It is suitable to mix oxygen in the Ar gas at a mixing ratio on the order of 1.0%.

According to this embodiment, as described above, a thin $SnO_2$ film with dispersed Si—Ge mixed crystal ultrafine particles can be obtained, thus eliminating a porous shape. It was therefore possible to prepare a thin film containing ultrafine particles which are useful in connecting electrodes to form a device and can effectively bring about the quantum size effect.

The difference between the use of Ar and the use of He as an ambient rare gas is such that the pressure of Ar should be set to 0.1 to 0.2 times that of He taken as a reference. In consideration of matching with the conventional sputtering deposition, actually, it is suitable to set the pressure of Ar in the range of about 0.01 to 0.1 Torr.

The surface oxidization step by heating in the oxygen gas ambient in the simultaneous deposition could eliminate the undesirable surface layer and could form group IV mixed crystal ultrafine particles having excellent crystallinity and purity.

A single substance or mixed crystal of another kind or composition ratio may of course be used as a semiconductor material, as in the thirteenth or fourteenth embodiment, and as a dielectric material, another material like aluminum oxide ($Al_2O_3$) may be used as well. This is because if $Al_2O_3$ is used, there is less adverse influence (which mainly means that excess oxygen oxidizes a group IV semiconductor) of the deviation from the stoichiometric composition of aluminum oxide on the mixed IV semiconductor ultrafine particles, as compared with the case of $SiO_2$.

According to this invention, as apparent from the above, ultrafine particles are dispersed in a medium which has a controllable conductivity or dielectric constant and is substantially uniform, it is possible to effectively execute and control carrier injection in the ultrafine particles or the quantum confinement effect of carriers in the ultrafine particles, and it is thus possible to realize a light-emitting device and a photodetector whose light emission and reception characteristics like the wavelength are controllable and which have a high light emission and reception efficiency.

Because of the periodic structure where ultrafine-particles dispersed layers using such an optoelectronic material and transparent medium layers are alternately stacked one on another, it is possible to provide an optoelectronic material having such a characteristic as to enhance the intensity of a specific wavelength region in the continuous spectrum that is emitted or generated by ultrafine particles, and it is thus possible to realize a light-emitting device, a photodetector, etc. which can permit the photon energy of the received or emitted light to be controlled.

Further, the provision of an active layer using such an optoelectronic material and a high-reflection layer and a partial reflection layer sandwiching the active layer can provide an optoelectronic material, and eventually, a light-emitting device, a photodetector and the like, which can permit the wavelength of the received or emitted light to be narrowed and can increase the intensity.

Furthermore, by providing a pair of electrodes which sandwich an optoelectronic material layer containing such an optoelectronic material and at least one of which is in direct contact thereto, the electric connection between the electrodes the optoelectronic material layer can be controlled properly and a light-emitting device, a, display device, a photodetector, etc. which have a high light emission and reception efficiency can be obtained.

If such an optoelectronic material is specifically adapted to an ultraviolet detector or the like, a color filter or the like becomes unnecessary.

By using the mentioned display device, a portable display apparatus which is suitable for size and weight reduction and has low dissipation power and high resolution is provided, and is suitably adapted as an HMD or an electronic dictionary.

Moreover, the aforementioned optoelectronic material, light-emitting device, photodetector and the like according to this invention use a material whose quantity is unlimited and which is free of environmental contamination, and have excellent advantages of Si-LSI technology matching, high environmental resistance and assemblyless property, and can be adapted to various kinds of multimedia adaptive devices.

According to a method of manufacturing the aforementioned optoelectronic material, a laser ablation step for a first target is performed in rare gas ambient to surely form ultrafine particles deposition on the substrate with the particle size controlled on the nm order, and control on the mean particle size and control on the composition ratio of a mixed crystal can be effected, thereby permitting the light emission and reception characteristics to be adjusted at a high degree of freedom.

Furthermore, it is suitable to provide an evaporation step of evaporating a second target material. Accordingly, a material produced in the evaporation step is collected on the deposition substrate at substantially the same time as ultrafine particles obtained by condensing and growing a material, desorbed and injected in the ablation step, in the air are collected on the deposition substrate, so that an optoelectronic material having the ultrafine particles dispersed in a uniform material comprised of the second target material can actually be acquired.

Industrial Applicability

This invention has excellent characteristics of silicon (Si)-LSI technology matching, self light emission, fast response, pixel miniaturization, low dissipation power, high environmental resistance and assemblyless process, and can be adapted to various kinds of portable terminals and other display apparatuses.

What is claimed is:

1. An optoelectric conversion device comprising:

a semiconductor substrate;

an ultrafine-particle dispersed layer, in contact with said semiconductor substrate through an opening, with a controllable quantum confinement effect of carriers in semiconductor ultrafine-particles, said ultrafine-particles dispersed layer comprising a uniform medium with a controllable electric characteristic with said semiconductor ultrafine-particles dispersed in said uniform medium; and a pair of electrodes sandwiching said ultrafine-particles dispersed layer, wherein said optoelectric conversion detects a change in an internal resistance caused by carrier generation originating from light irradiation onto said ultrafine-particles dispersed layer to provide a photodetective function.

2. An optoelectric conversion device comprising:

a semiconductor substrate;

an ultrafine-particles dispersed layer, in contact with said semiconductor substrate through an opening, with a controllable quantum confinement effect of carriers in semiconductor ultrafine-particles, said ultrafine-particles dispersed layer comprising a uniform medium with a controllable electric characteristic with said semiconductor ultrafine-particles dispersed in said uniform medium; and a pair of electrodes sandwiching said ultrafine-particles dispersed layer, wherein a Schottky junction is formed at an interface between said ultrafine-particles dispersed layer and one of said electrodes or a p-n junction is formed in said ultrafine-particles dispersed layers;

said optoelectric conversion device detecting a change in photoelectromotive force generated by carrier generation originating from light irradiation to provide a photodetective function.

3. The optoelectric conversion device according to claim 2, wherein dependence of photodetective function on detected wave length is controllable.

4. A color sensor comprising optoelectric conversion layers including optoelectric conversion devices according to claim 2, stacked through a transparent insulator film, each said optoelectric conversion device providing a photodetective function in different predetermined wavelength regions by controlling optical gap energy by adjusting one of a mean particle size and a surface atomic arrangement of ultrafine-particles of said optoelectric conversion devices.

5. The color sensor according to claim 4, wherein said stacked optoelectric conversion layers have different optical gap energies, said optical gap energy increasing with a decrease in distance between said optoelectric conversion layer and a photoelectric surface.

* * * * *

UNITED STATES PATENT AND TRADEMARK OFFICE
CERTIFICATE OF CORRECTION

PATENT NO. : 6,838,743 B2
DATED : January 4, 2005
INVENTOR(S) : Y. Yamada et al.

It is certified that error appears in the above-identified patent and that said Letters Patent is hereby corrected as shown below:

Column 50,
Line 17, "layers" should be -- layer --.

Signed and Sealed this

Twenty-fourth Day of May, 2005

JON W. DUDAS
*Director of the United States Patent and Trademark Office*